US011830391B2

United States Patent
Eguchi et al.

(10) Patent No.: US 11,830,391 B2
(45) Date of Patent: Nov. 28, 2023

(54) DISPLAY PANEL AND DATA PROCESSING DEVICE

(71) Applicant: SEMICONDUCTOR ENERGY LABORATORY CO., LTD., Atsugi (JP)

(72) Inventors: Shingo Eguchi, Kanagawa (JP); Taiki Nonaka, Kanagawa (JP); Daiki Nakamura, Kanagawa (JP); Nozomu Sugisawa, Kanagawa (JP); Kazuhiko Fujita, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 229 days.

(21) Appl. No.: 17/312,487

(22) PCT Filed: Dec. 6, 2019

(86) PCT No.: PCT/IB2019/060501
§ 371 (c)(1),
(2) Date: Jun. 10, 2021

(87) PCT Pub. No.: WO2020/121139
PCT Pub. Date: Jun. 18, 2020

(65) Prior Publication Data
US 2022/0051594 A1    Feb. 17, 2022

(30) Foreign Application Priority Data

Dec. 14, 2018  (JP) ................................. 2018-234268
Jan. 31, 2019  (JP) ................................. 2019-014967
(Continued)

(51) Int. Cl.
*G06F 1/16*     (2006.01)
*H05K 5/00*   (2006.01)
(Continued)

(52) U.S. Cl.
CPC .............. *G09F 9/30* (2013.01); *G06F 1/1607* (2013.01); *H05K 5/0017* (2013.01);
(Continued)

(58) Field of Classification Search
CPC .............. G06F 11/1607; G06F 11/1618; G06F 11/1647; G06F 11/1681; G06F 11/1652; G09F 9/30; G09F 9/301
See application file for complete search history.

(56) References Cited

U.S. PATENT DOCUMENTS 7,669,402 B2    3/2010  Blase
9,761,182 B2 *  9/2017  Lee ......................... G09G 3/035
(Continued)

FOREIGN PATENT DOCUMENTS

CN    106993385 A    7/2017
CN    109478384 A    3/2019
(Continued)

OTHER PUBLICATIONS

International Search Report (Application No. PCT/IB2019/060501) dated Feb. 18, 2020.
(Continued)

*Primary Examiner* — Abhishek M Rathod
(74) *Attorney, Agent, or Firm* — Fish & Richardson P.C.

(57) ABSTRACT

A novel display panel that is highly convenient, useful, or reliable is provided. The display panel includes a display region, a first support, and a second support, the display region includes a first region, a second region, and a third region, the first region and the second region each have a belt-like shape extending in one direction, and the third region is sandwiched between the first region and the second region. The first support overlaps with the first region and is less likely to be warped than the third region, and the second support overlaps with the second region and is less likely to
(Continued)

be warped than the third region. The second support can pivot on an axis extending in the one direction with respect to the first support.

16 Claims, 42 Drawing Sheets

(30) Foreign Application Priority Data

| Mar. 15, 2019 | (JP) | ................................. | 2019-048353 |
| Apr. 19, 2019 | (JP) | ................................. | 2019-080228 |

(51) Int. Cl.
    *H05K 5/02*     (2006.01)
    *G09F 9/30*     (2006.01)
    *H10K 59/12*     (2023.01)
    *H10K 77/10*     (2023.01)

(52) U.S. Cl.
    CPC ........... *H05K 5/0226* (2013.01); *H10K 59/12* (2023.02); *H10K 77/111* (2023.02)

(56) References Cited

U.S. PATENT DOCUMENTS

| 2008/0072564 | A1 | 3/2008 | Blase | |
| 2010/0277443 | A1* | 11/2010 | Yamazaki | G06F 1/1616 |
| | | | | 345/204 |
| 2016/0116944 | A1* | 4/2016 | Lee | G06F 1/1681 |
| | | | | 361/679.26 |
| 2016/0357222 | A1* | 12/2016 | Seo | G06F 1/1635 |
| 2016/0370829 | A1* | 12/2016 | Hsu | G06F 1/1652 |
| 2018/0049329 | A1 | 2/2018 | Seo et al. | |
| 2018/0317333 | A1 | 11/2018 | Bi | |

FOREIGN PATENT DOCUMENTS

| DE | 112007001947 | | 5/2009 |
| EP | 2029913 | A | 3/2009 |
| EP | 3494567 | A | 6/2019 |
| JP | 2009-541667 | | 11/2009 |
| JP | 2010-282181 | A | 12/2010 |
| KR | 2009-0025338 | A | 3/2009 |
| KR | 2018-0018007 | A | 2/2018 |
| WO | WO-2007/147394 | | 12/2007 |
| WO | WO-2018/030618 | | 2/2018 |
| WO | WO-2018/196293 | | 11/2018 |

OTHER PUBLICATIONS

Written Opinion (Application No. PCT/IB2019/060501) dated Feb. 18, 2020.

* cited by examiner

231(i+1) 231S(i) 231(i)

FIG. 20A
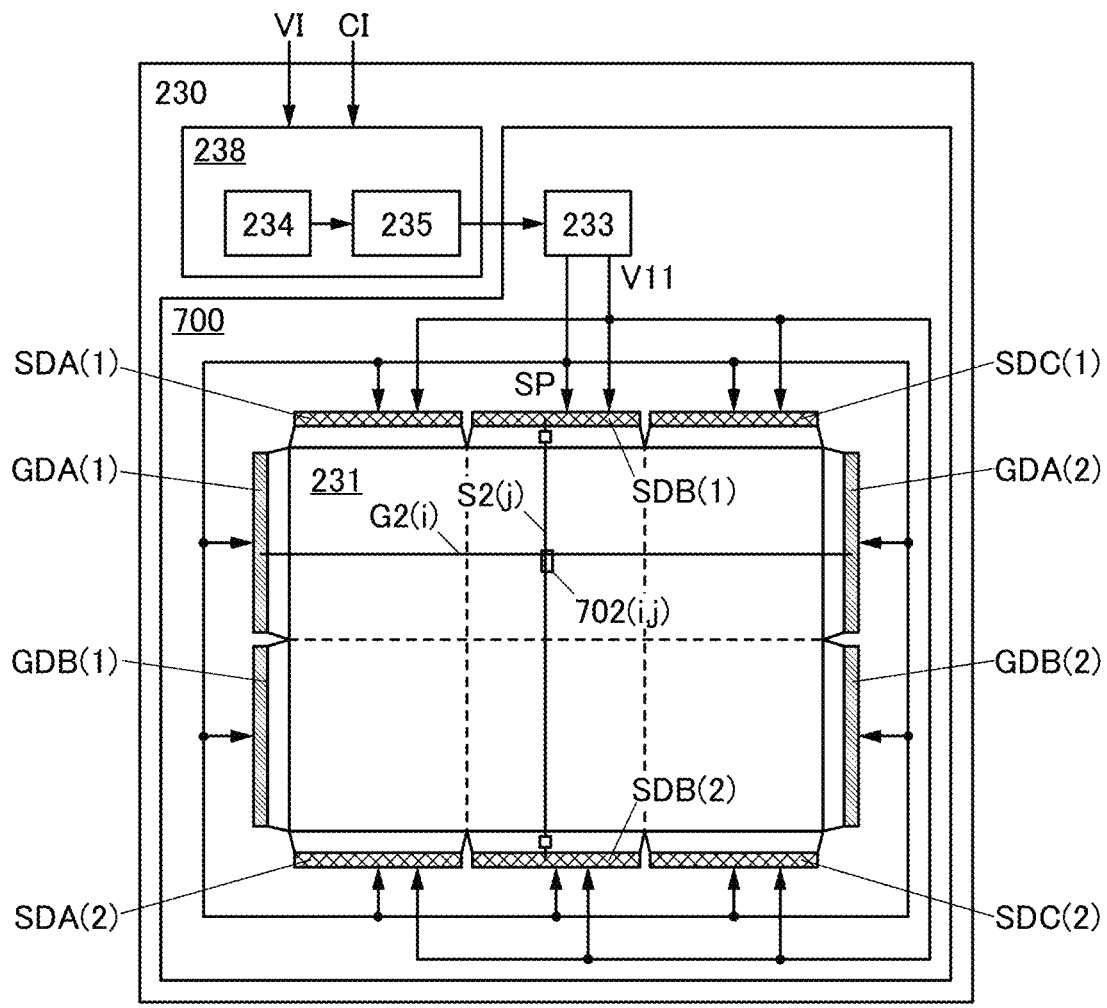
FIG. 20B  FIG. 20C  FIG. 20D
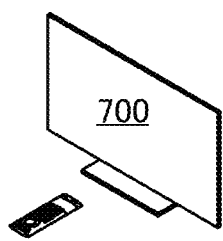
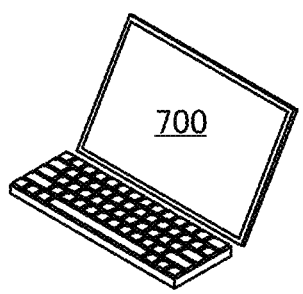
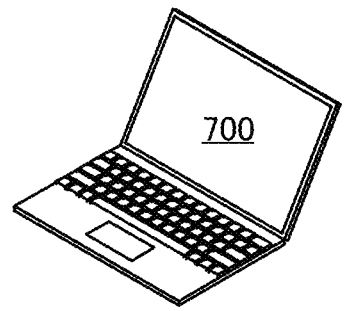

FIG. 30A
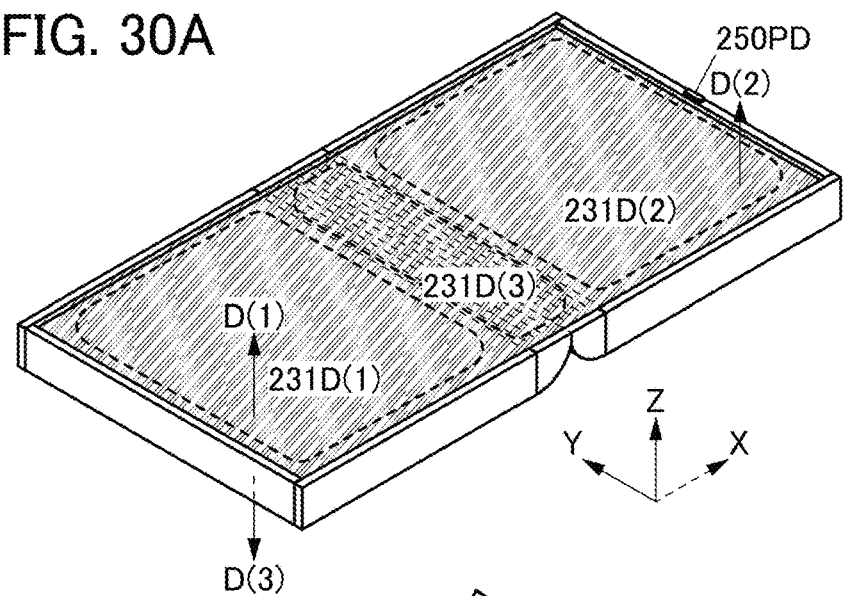
FIG. 30B
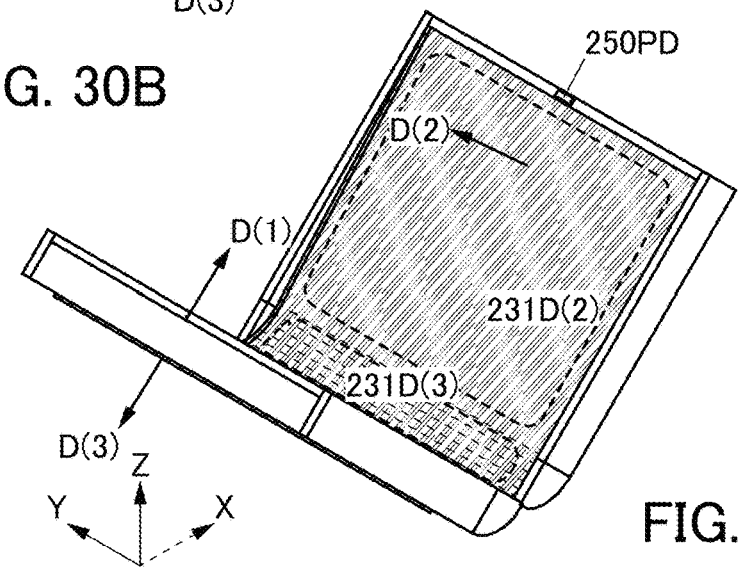
FIG. 30C
FIG. 30D
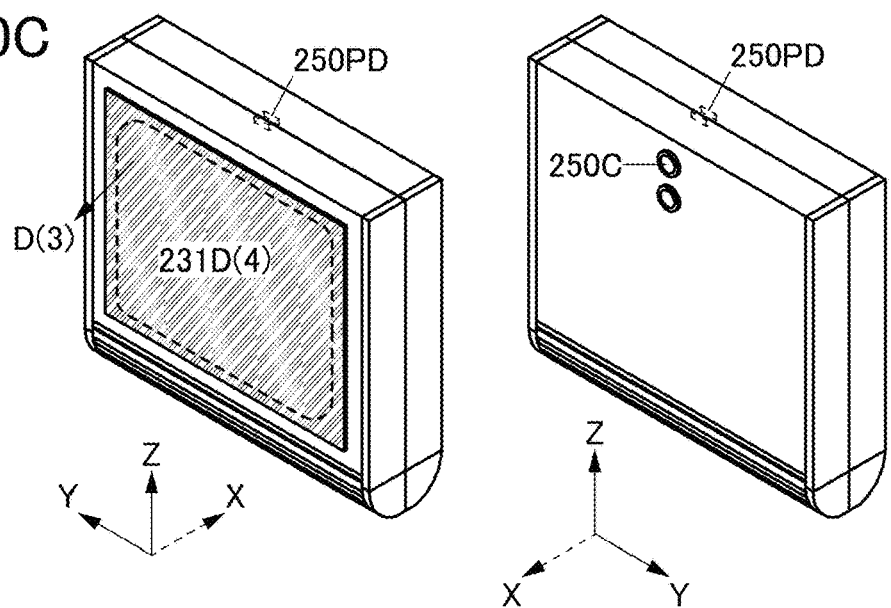

FIG. 31A
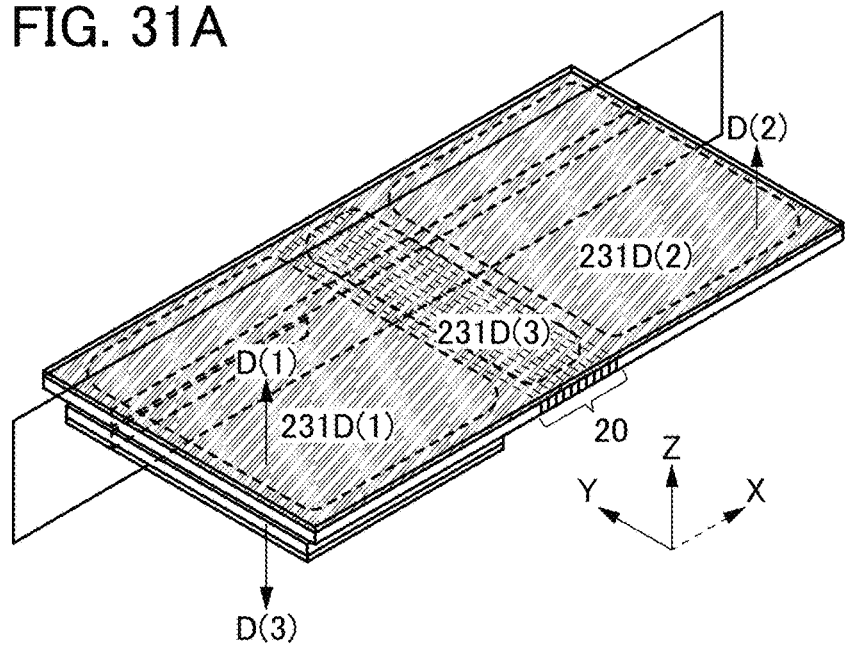
FIG. 31B
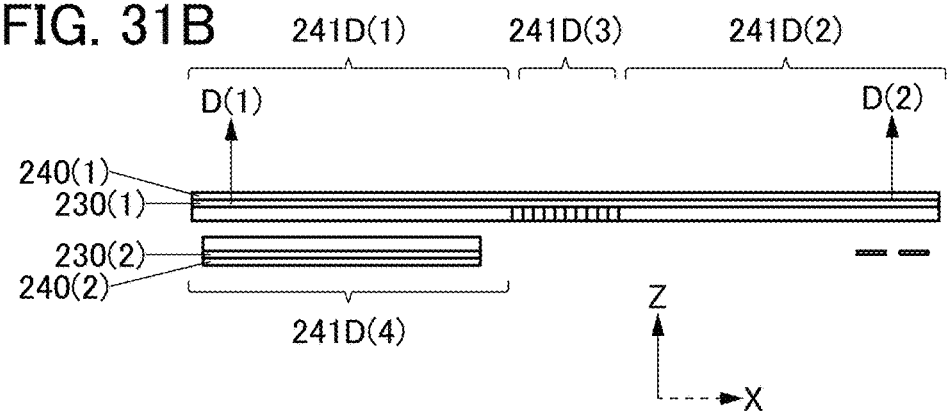
FIG. 31C
FIG. 31D
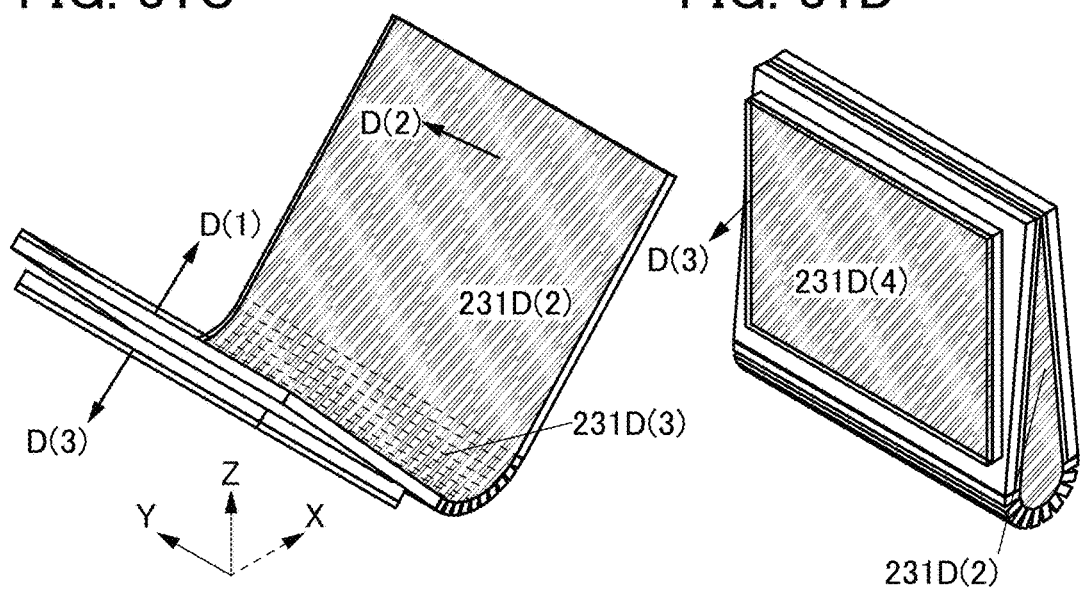

FIG. 42A
Intermediate state
New boundary region
| Amorphous (amorphous) | Crystalline (crystalline) | Crystal (crystal) |
|---|---|---|
| ・completely amorphous | ・CAAC<br>・nc<br>・CAC | ・single crystal<br>・poly crystal |
FIG. 42B
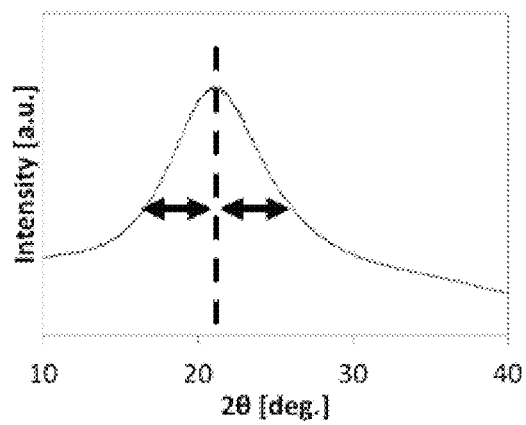
FIG. 42C
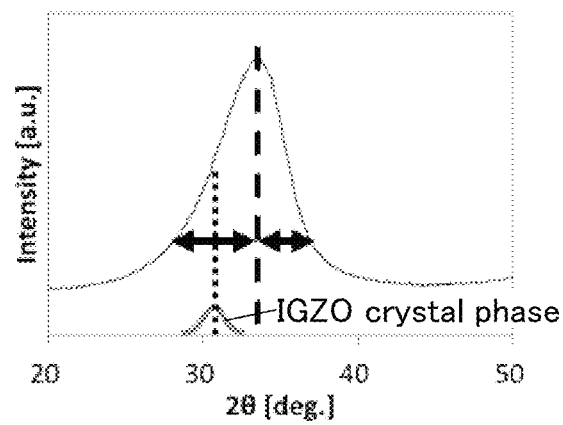
FIG. 42D
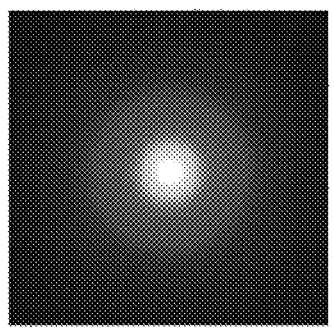
FIG. 42E
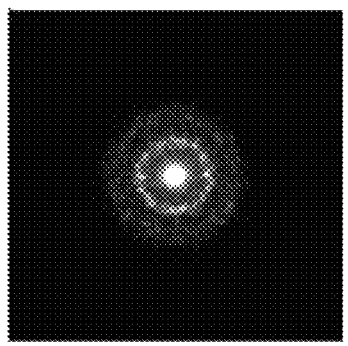

DISPLAY PANEL AND DATA PROCESSING DEVICE

CROSS REFERENCE TO RELATED APPLICATIONS

This application is a U.S. National Phase Application under 35 U.S.C. § 371 of International Application PCT/IB2019/060501, filed on Dec. 6, 2019, which is incorporated by reference and claims the benefit of foreign priority applications filed in Japan on Dec. 14, 2018, as Application No. 2018-234268, on Jan. 31, 2019, as Application No. 2019-014967, on Mar. 15, 2019, as Application No. 2019-048353, and on Apr. 19, 2019, as Application No. 2019-080228.

TECHNICAL FIELD

One embodiment of the present invention relates to a display pane, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

Is known an e-book reader including a plurality of flexible display panels each including a display portion in which display control is performed by a scan line driver circuit and a signal line driver circuit, and a binding portion fastening the plurality of display panels together, where the signal line driver circuit is provided in the binding portion, and the scan line driver circuit is provided at an edge of the display panel in a direction perpendicular to the binding portion (Patent Document 1).

REFERENCE

Patent Document

[Patent Document 1] Japanese Published Patent Application No. 2010-282181

SUMMARY OF THE INVENTION

Problems to be Solved by the Invention

An object of one embodiment of the present invention is to provide a novel display panel that is highly convenient, useful, or reliable. Alternatively, an object is to provide a novel data processing device that is highly convenient, useful, or reliable. Alternatively, an object is to provide a novel display panel or a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems (1) One embodiment of the present invention is a display panel including a display region, a first support, and a second support.

The display region includes a first region, a second region, and a third region. The first region and the second region each have a belt-like shape extending in one direction. The third region is sandwiched between the first region and the second region.

The first support overlaps with the first region and is less likely to be warped than the third region.

The second support overlaps with the second region and is less likely to be warped than the third region.

The second support can pivot on an axis extending in the one direction with respect to the first support.

Thus, the display region can be bent so that a ridge is formed in the third region. Moreover, the number of ridges formed in the third region is limited to one or less, whereby a plurality of ridges can be prevented from being formed in the third region. Alternatively, a ridge with a small curvature radius can be prevented from being formed separately from a ridge with a large curvature radius. Alternatively, a bending direction can be restricted so as not to form a plurality of ridges protruding in directions opposite to each other in the third region. As a result, a novel display panel that is highly convenient, useful, or reliable can be provided.

(2) Another embodiment of the present invention is the display panel including a hinge.

The hinge includes a first link and a second link.

The first link is connected to the first support.

The second link is connected to the second support and can pivot on an axis extending in the one direction with respect to the first link.

Thus, the second support can pivot on the axis extending in the one direction with respect to the first support. As a result, a novel display panel that is highly convenient, useful, or reliable can be provided.

(3) Another embodiment of the present invention is the display panel where the hinge includes a first hook, a first joint, a second joint, and a third joint.

The first link includes a first edge portion and a second edge portion.

The second link includes a third edge portion and a fourth edge portion.

The first hook includes a fifth edge portion and a sixth edge portion.

The first joint connects the first edge portion and the fourth edge portion so that the first link and the second link become a turning pair.

The second joint connects the second edge portion and the fifth edge portion so that the first link and the first hook become a turning pair.

A first distance D1 is provided between the third joint and the second joint. The third joint is engaged with the first hook so that the first distance D1 is less than or equal to a predetermined value.

Thus, the second support can pivot on an axis passing through the first joint with respect to the first support. Alternatively, the third region can be bent so that the ridge is formed along the axis passing through the first joint. Alternatively, the maximum pivoting range of the second link with respect to the first link can be limited. Alternatively, the third region can be bent while a curvature is restricted. As a result, a novel display panel that is highly convenient, useful, or reliable can be provided.

(4) Another embodiment of the present invention is the display panel where the first distance D1 becomes the shortest at a position where the first link and the second link interfere with each other.

Thus, the pivoting range of the second link with respect to the first link can be limited. Alternatively, the minimum and maximum pivoting ranges can be limited. Alternatively, the third region can be bent while the minimum curvature radius is restricted. As a result, a novel display panel that is highly convenient, useful, or reliable can be provided.

(5) Another embodiment of the present invention is the display panel where the first hook is engaged with the third joint in conjunction with pivoting on the second joint in one of directions and where the first hook is taken off from the third joint in conjunction with pivoting on the second joint in the other direction.

Thus, the second link can be made to stay at a predetermined position. Alternatively, the second link can be moved with respect to the first link. Alternatively, the first distance D1 can be kept at a predetermined value. Alternatively, the first distance D1 can be changed. As a result, a novel display panel that is highly convenient, useful, or reliable can be provided.

(6) Another embodiment of the present invention is the display panel where the second joint is provided apart from a center of gravity of the first hook and where the first hook can pivot under own weight on the second joint.

Thus, a user can engage the first hook with the third joint by tilting the hinge to one of predetermined directions. Alternatively, the user can take the first hook off from the third joint by tilting the hinge to the other of the predetermined directions. As a result, a novel display panel that is highly convenient, useful, or reliable can be provided.

(7) Another embodiment of the present invention is the display panel including a third link, a second hook, a fourth joint, and a fifth joint.

The second link includes a seventh edge portion.

The third link includes an eighth edge portion and a ninth edge portion.

The second hook includes a tenth edge portion and an eleventh edge portion.

The fourth joint connects the seventh edge portion and the ninth edge portion so that the second link and the third link become a turning pair.

The third joint connects the third edge portion and the tenth edge portion so that the second link and the second hook become a turning pair.

A second distance D2 is provided between the fifth joint and the second joint. The fifth joint is engaged with the second hook so that the second distance D2 is less than or equal to a predetermined value.

Thus, the maximum pivoting range of the third link with respect to the second link can be limited. Alternatively, bending can be performed at a plurality of portions, for example, at the first joint and the fourth joint. As a result, a novel display panel that is highly convenient, useful, or reliable can be provided.

(8) Another embodiment of the present invention is the display panel where the second distance D2 becomes the shortest at a position where the second link and the third link interfere with each other.

Thus, the pivoting range of the third link with respect to the second link can be limited. Alternatively, the minimum and maximum pivoting ranges can be limited. As a result, a novel display panel that is highly convenient, useful, or reliable can be provided.

(9) Another embodiment of the present invention is the display panel where the second distance D2 is less than or equal to the longest value of the first distance D1 and where the second distance D2 is greater than or equal to the shortest value of the first distance D1.

Thus, the pivoting range of the third link with respect to the second link can be equal to the pivoting range of the second link with respect to the first link. As a result, a novel display panel that is highly convenient, useful, or reliable can be provided.

(10) Another embodiment of the present invention is the display panel where the third joint is provided apart from a center of gravity of the second hook and where the second hook can pivot under own weight in synchronization with the first hook pivoting.

Thus, a user can engage the second hook with the fifth joint, tilting the hinge to one of the predetermined directions as in the case where the first hook is engaged with the third joint. Alternatively, for example, the user can take the second hook off from the fifth joint, tilting the hinge to the other of the predetermined directions as in the case where the first hook is taken off from the third joint. As a result, a novel display panel that is highly convenient, useful, or reliable can be provided.

(11) Another embodiment of the present invention is the display panel that includes a secondary battery.

The first support stores the secondary battery, and the secondary battery drives the display region.

Thus, charging capacity of the secondary battery can be increased without increasing a volume of the display panel. As a result, a novel display panel that is highly convenient, useful, or reliable can be provided.

(12) One embodiment of the present invention is the display panel including a first display region, a second display region, a connection portion, a first support, a second support, a third support, and a fourth support.

The first display region includes a first region, a second region, and a third region.

The first region and the second region each have a belt-like shape extending in one direction.

The third region is sandwiched between the first region and the second region.

The second display region includes a fourth region, a fifth region, and a sixth region.

The fourth region and the fifth region each have a belt-like shape extending in the one direction. The fourth region faces the first region.

The sixth region is sandwiched between the fourth region and the fifth region.

The connection portion connects the first display region and the second display region.

The first support overlaps with the first region and is less likely to be warped than the third region.

The second support overlaps with the second region and is less likely to be warped than the third region.

The second support can pivot on an axis extending in the one direction with respect to the first support.

The third support overlaps with the fourth region and is less likely to be warped than the sixth region.

The fourth support overlaps with the fifth region and is less likely to be warped than the sixth region.

The fourth support can pivot on an axis extended in the one direction with respect to the third support.

Thus, the first display region and the second display region can be placed side by side to be one continuous display region. Alternatively, the display panel can be fold so that the first display region and the second display region face each other. As a result, a novel display panel that is highly convenient, useful, or reliable can be provided.

(13) Another embodiment of the present invention is a data processing device including a display portion.

The display portion includes the display panel, and the display panel includes a first plane, a second plane, and a third plane.

The third plane is sandwiched between the first plane and second plane and can be bent around an axis extending in the one direction. The third plane draws a curved line in a plane across the axis in accordance with the bending, and the curved line has an inflection point.

(14) Another embodiment of the present invention is the data processing device where the third surface has a curvature radius R1 in accordance with the bending.

The second plane includes a region along the first plane, and a distance between the region and the first plane is shorter than a value of twice curvature radius R1.

Thus, the second plane can be moved close to the first plane. Alternatively, the second plane can be closer to the first plane while being kept facing the first plane. Alternatively, a portion where the first plane and the second plane overlap with each other can be made thin. Alternatively, the volume can be made small. As a result, a novel data processing device that is highly convenient, useful, or reliable can be provided.

Although the block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the source and the drain interchange with each other according to the above relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient, useful, or reliable can be provided. Alternatively, a novel semiconductor device can be provided.

Note that the description of the effects does not preclude the existence of other effects. Note that one embodiment of the present invention does not need to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 20A to FIG. 20D are diagrams illustrating a structure of a display device of one embodiment.

FIG. 30A to FIG. 30D are diagrams illustrating a structure of a data processing device of one embodiment.

FIG. 31A to FIG. 31D are diagrams illustrating structures of a data processing device of one embodiment

FIG. 42A shows classification of IGZO crystal structures; FIG. 42B shows an XRD spectrum of a quartz glass substrate; FIG. 42C shows an XRD spectrum of a crystalline IGZO film; FIG. 42D shows a nanobeam electron diffraction pattern of the quartz glass substrate; and FIG. 42E shows a nanobeam electron diffraction pattern of the crystalline IGZO film.

MODE FOR CARRYING OUT THE INVENTION

Figure 1A:
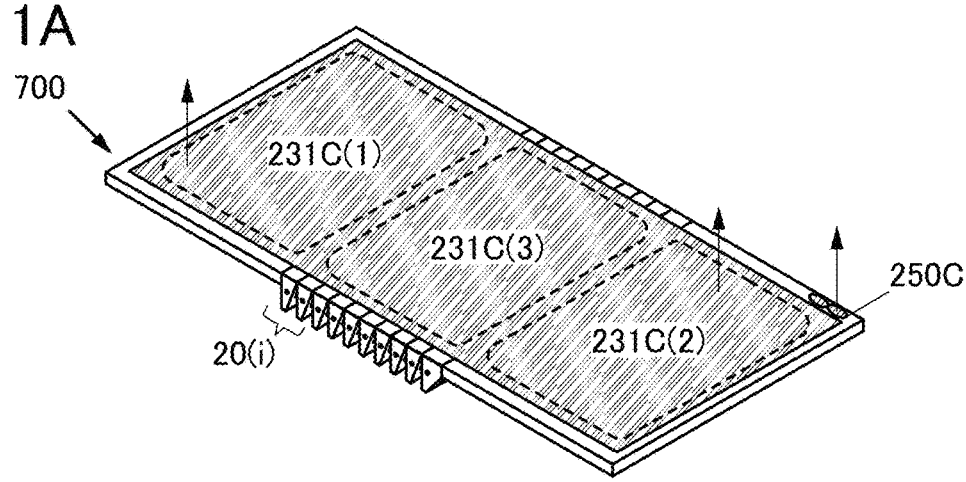
FIG. 1A to FIG. 1C are diagrams illustrating a structure of a display panel of one embodiment.

A display panel of one embodiment of the present invention includes a display region, a first support, and a second support. The display region includes a first region, a second region, and a third region. The first region and the second region each have a belt-like shape extending in one direction, and the third region is sandwiched between the first region and the second region. The first support overlaps with the first region and is less likely to be warped than the third region. The second support overlaps with the second region and is less likely to be warped than the third region. The second support can pivot on an axis extending in the one direction with respect to the first support.

Thus, the display region can be bent so that a ridge is formed in the third region. In addition, the number of ridges formed in the third region is limited to one, whereby a plurality of ridges can be prevented from being formed in the third region. Alternatively, a ridge with a small curvature radius can be prevented from being formed separately from a ridge with a large curvature radius. Alternatively, the bending direction can be restricted so as not to form a plurality of ridges protruding in directions opposite to each other in the third region. As a result, a novel display panel that is highly convenient or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the present invention described below, the same portions or portions having similar functions are denoted by the same reference numerals in different drawings, and a description thereof is not repeated.

Note that this embodiment can be combined with any of the other embodiments in this specification as appropriate.

Embodiment 1

In this embodiment, a structure of a display panel of one embodiment of the present invention will be described with reference to FIG. 1 to FIG. 4.

Figure 1B:
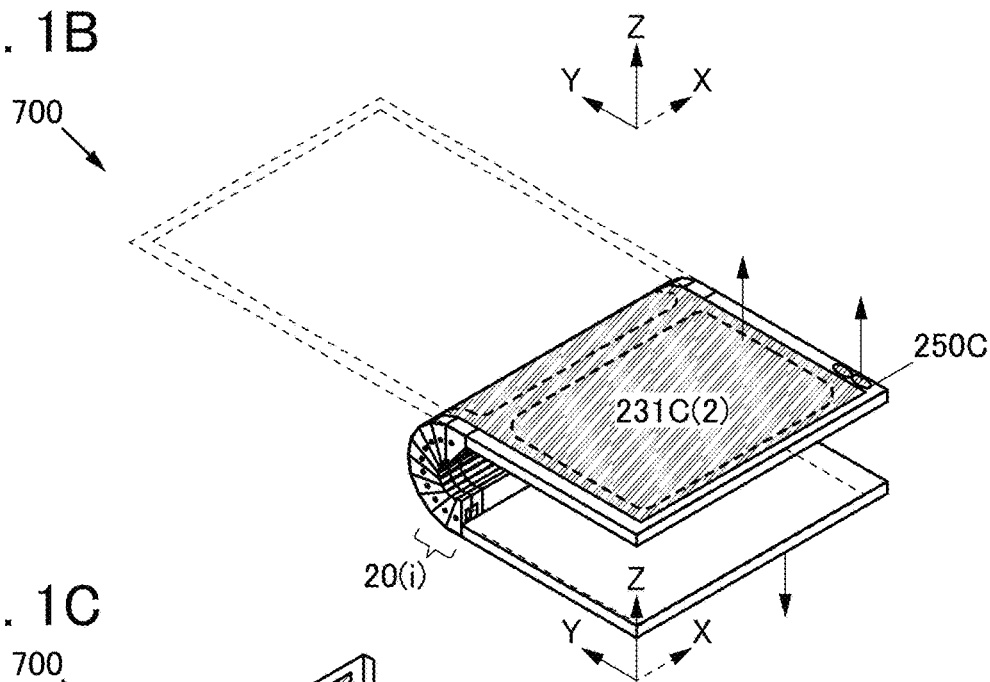
Figure 1C:
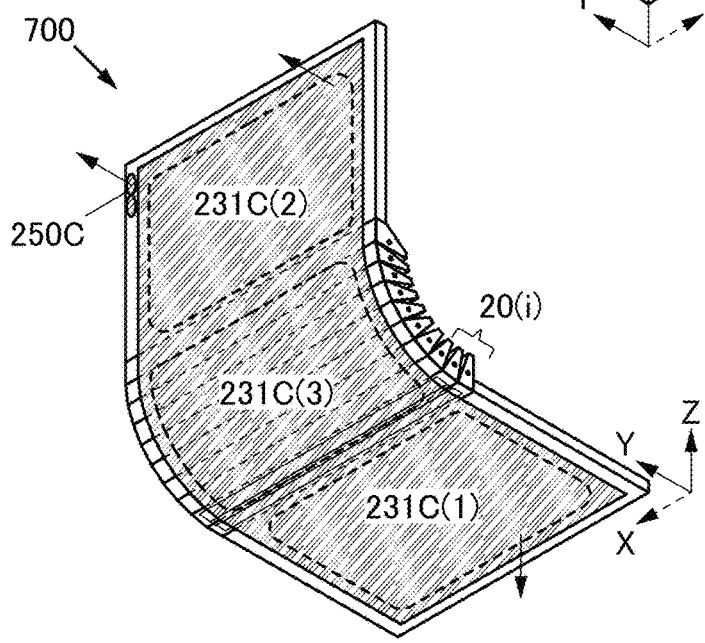

FIG. 1 illustrates a structure of a display panel of one embodiment of the present invention. FIG. 1A is a perspective view of the display panel of one embodiment of the present invention. FIGS. 1B and 1C are each a perspective view illustrating a state where the display panel illustrated in FIG. 1A is bent.

Figure 2A:
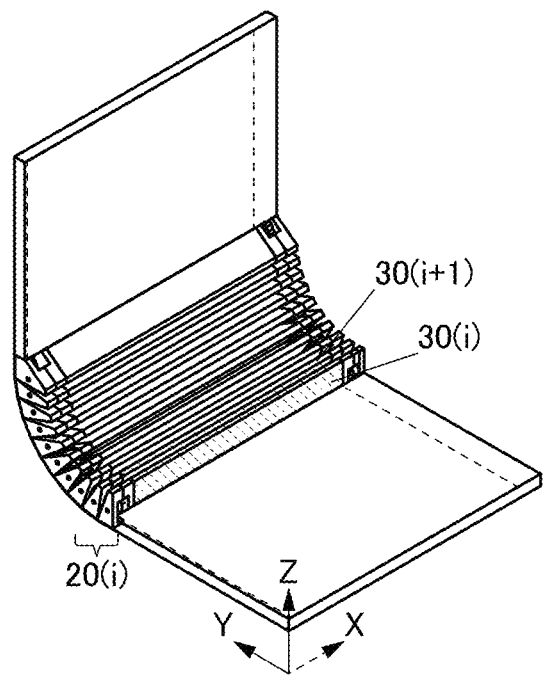
FIGS. 2A and 2B are diagrams illustrating a structure of a display panel of one embodiment.
Figure 2B:
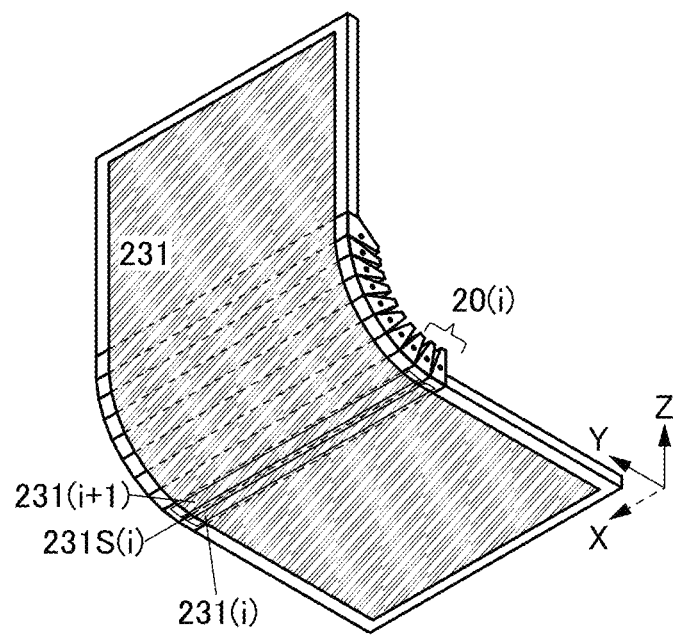

FIG. 2 illustrates a structure of a display panel of one embodiment of the present invention. FIG. 2A is a perspective view of the display panel of one embodiment of the present invention, and FIG. 2B is a perspective view illustrating the display panel in FIG. 2A seen from another direction.

FIG. 3 illustrates a structure of a display panel of one embodiment of the present invention. FIG. 3A is a perspective view illustrating a structure of the display panel of one embodiment of the present invention, and FIG. 3B is a cross-sectional view along a section plane YZ in FIG. 3A. FIG. 3C is a perspective view illustrating a structure of the display panel of one embodiment of the present invention, and FIG. 3D is an exploded view illustrating part of the display panel in FIG. 3C.

FIG. 4 illustrates a function of a display panel of one embodiment of the present invention. FIG. 4A is a perspective view illustrating a function of the display panel, and FIG. 4B is a cross-sectional view along a section plane YZ in FIG. 4A. FIG. 4C is a perspective view illustrating a function of the display panel, and FIG. 4D is a cross-sectional view along the section plane YZ in FIG. 4C.

Note that in this specification, an integer variable of 1 or more is sometimes used in reference numerals. For example, (p) where p is an integer variable of 1 or more is sometimes used in part of a reference numeral that specifies any of p components at a maximum. For another example, (m, n) where m and n are each an integer variable of 1 or more is sometimes used in part of a reference numeral that specifies any of m×n components at a maximum.

<Structure Example 1 of Display Panel>

The display panel described in this embodiment includes a display region 231, a support 30(i), and a support 30(i+1) (see FIG. 2A and FIG. 2B). For example, the display region 231 includes a region 231C(1), a region 231C(2), and a region 231C(3) (see FIG. 1A).

«Structure Example 1 of Display Region 231»

The display region 231 includes a region 231(i), a region 231(i+1), and a region 231S(i) (see FIG. 2B). For example, the region 231S(i) has a width less than or equal to 1 mm, preferably a width less than or equal to 0.5 mm.

The region 231(i) and the region 231(i+1) each have a belt-like shape extending in one direction (e.g., in a direction denoted by an arrow X in the diagram).

The region 231S(i) is sandwiched between the region 231(i) and the region 231(i+1).

«Structure Example of Support 30(i)»

The support 30(i) overlaps with the region 231(i). For example, a narrow and long shape extending in the direction denoted by the arrow X can be employed for the support 30(i).

The support 30(i) is less likely to be warped than the region 231S(i). In other words, the region 231S(i) can be warped more easily than the support 30(i). Alternatively, the region 231S(i) is warped earlier than the support 30(i) when application of force is gradually increased.

«Structure Example of Support 30(i+1)»

The support 30(i+1) overlaps with the region 231(i+1) and is less likely to be warped than the region 231S(i).

Figure 3A:
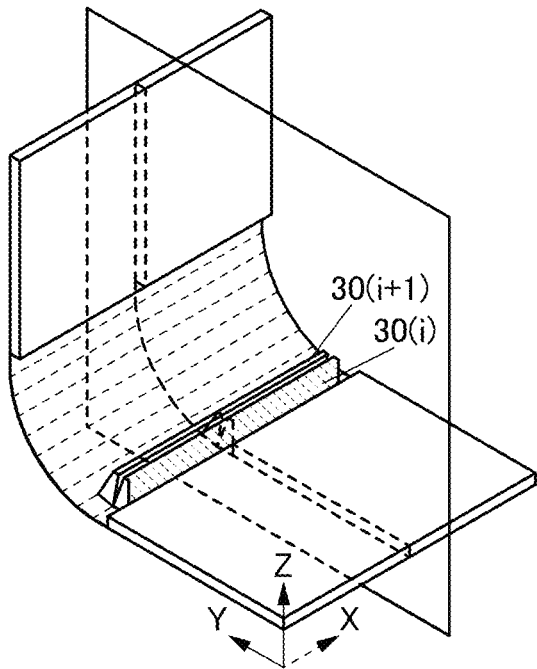
FIG. 3A to FIG. 3D are diagrams illustrating a structure of a display panel of one embodiment.
Figure 3B:
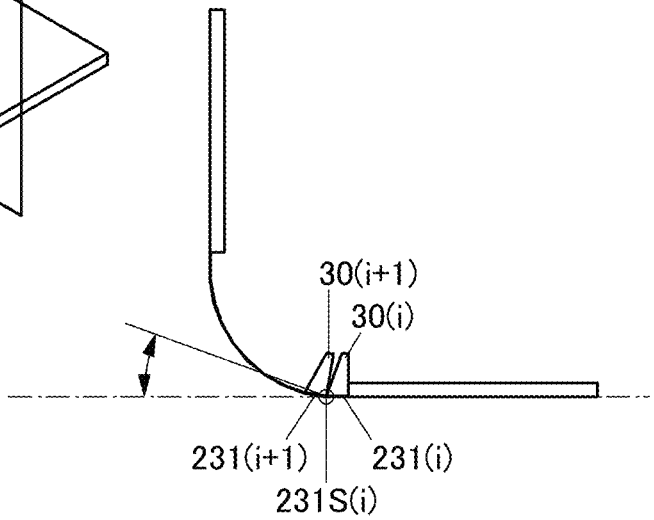

In addition, the support 30(i+1) can pivot on an axis extending in one direction (e.g., in the direction denoted by the arrow X in the diagram) with respect to the support 30(i) (see FIG. 3B). For example, the support 30(i+1) can pivot on an axis passing through the region 231S(i) and extending in the direction denoted by the arrow X with respect to the support 30(i).

Thus, the display region 231 can be bent so that a ridge is formed in the region 231S(i). Alternatively, the number of ridges formed in the region 231S(i) is limited to one, and a plurality of ridges can be prevented from being formed in the region 231S(i). Alternatively, a ridge with a small curvature radius can be prevented from being formed separately from a ridge with a large curvature radius. Alternatively, the bending direction can be restricted so as not to form a plurality of ridges protruding in directions opposite to each other in the region 231S(i). As a result, a novel display panel that is highly convenient, useful, or reliable can be provided.

Note that in this specification, a linear region obtained by connecting portions with the smallest curvature radius in a cross section orthogonal to a curved surface is referred to as a ridge. Furthermore, for convenience, a convex curved surface having no change in curvature radius is assumed to have one ridge.

For example when the display panel includes neither the support 30(i) nor the support 30(i+1), the display region 231 can be bent in various modes. Specifically, the display region 231 can be bent so that one ridge is formed (see FIG. 4A and FIG. 4B). Alternatively, the display region 231 can be bent so that a plurality of ridges, for example, a ridge E1 to a ridge E4, are formed (see FIG. 4C and FIG. 4D).

In the case where a plurality of ridges are formed, the ridge E3 or the ridge E4, which has an extremely small curvature radius, is formed in some cases in the display region 231. In a portion E5 where a ride disappears, the curvature radius is extremely decreased in some cases (see FIG. 4C). When the display region 231 is bent to have a smaller curvature radius than a predetermined value, the display region is broken in some cases. For example, when the display region 231 is bent with a curvature radius less than or equal to 1 mm, a display defect might be generated.

<Structure Example 2 of Display Panel>

Figure 3C:
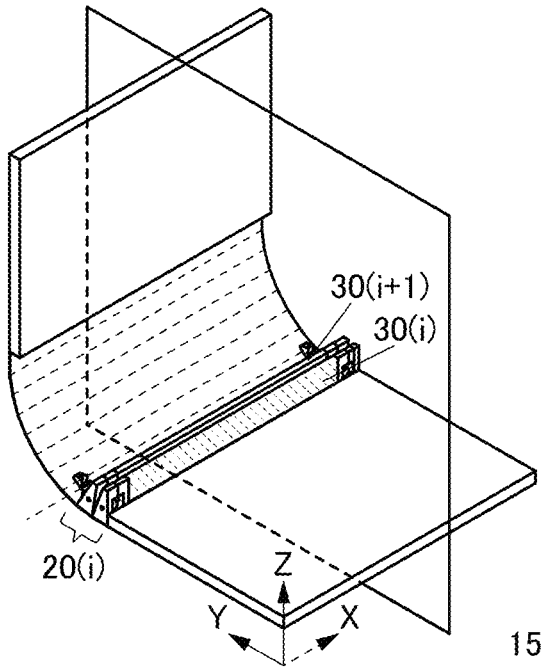
Figure 3D:
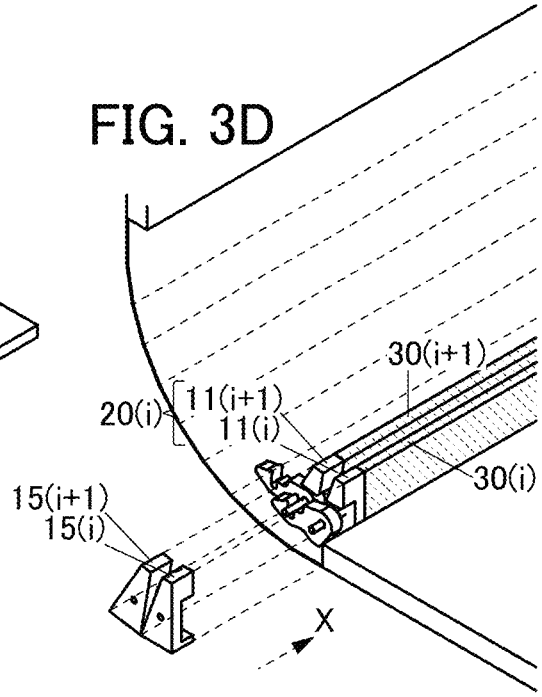
Figure 4A:
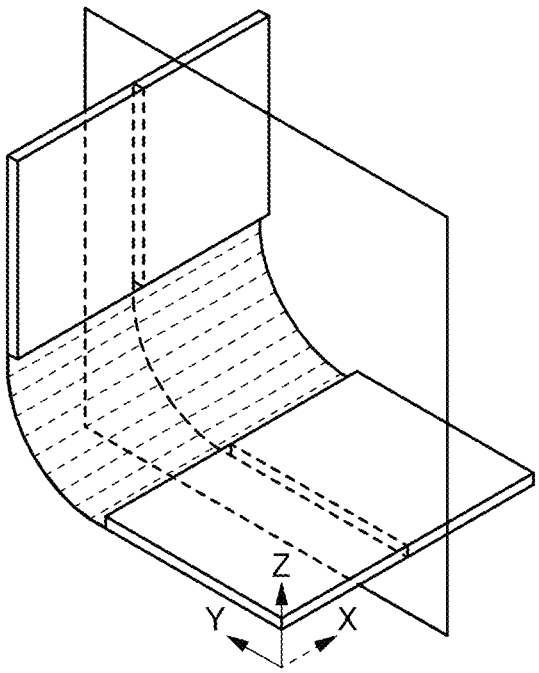
FIG. 4A to FIG. 4D are diagrams illustrating a function of a display panel of one embodiment.
Figure 4B:
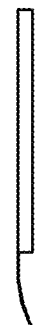
Figure 4C:
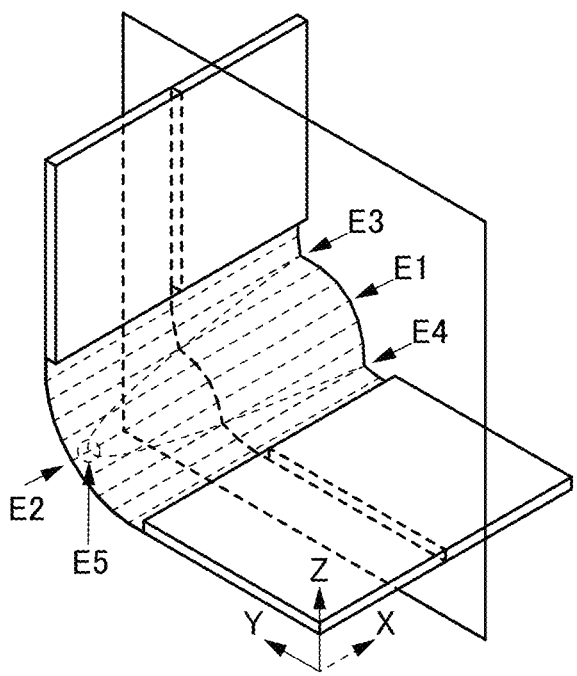
Figure 4D:
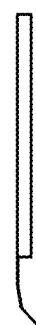

Another display panel described in this embodiment includes a hinge 20(i) (see FIG. 3C and FIG. 3D).

«Structure Example of Hinge 20(i)»

The hinge 20(i) includes a link 11(i) and a link 11(i+1) (see FIG. 3D). In addition, the hinge 20(i) includes a cover 15(i) and a cover 15(i+1). Thus, a mechanism of the hinge 20(i) can be protected.

The link 11(i) is connected to the support 30(i). The link 11(i+1) is connected to the support 30(i+1).

The link 11(i+1) can pivot on an axis extending in the one direction (e.g., in the direction denoted by the arrow X in the diagram) with respect to the link 11(i).

Thus, the support 30(i+1) can pivot on an axis extending in the one direction (e.g., in the direction denoted by the arrow X in the diagram) with respect to the support 30(i). As a result, a novel display panel that is highly convenient, useful, or reliable can be provided.

Note that this embodiment can be combined with any of the other embodiments in this specification as appropriate.

Embodiment 2

In this embodiment, a structure of a hinge that can be used in a display panel of one embodiment of the present invention will be described with reference to FIG. 5 to FIG. 14.

Figure 5A:
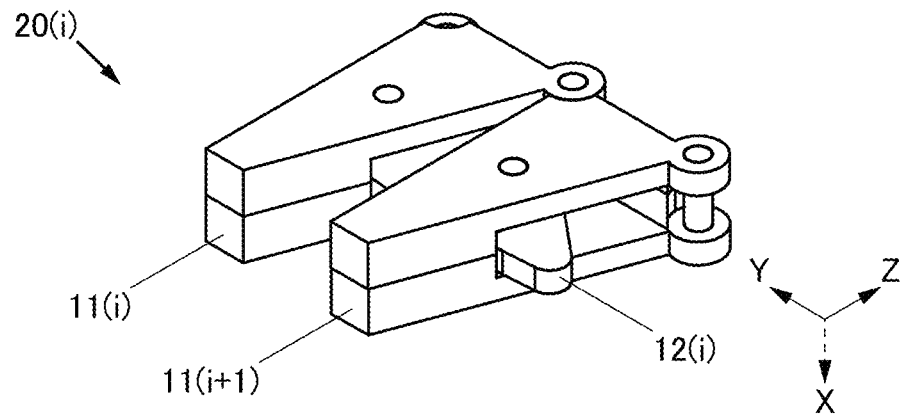
FIG. 5A and FIG. 5B are diagrams illustrating a structure of a hinge of one embodiment.
Figure 5B:
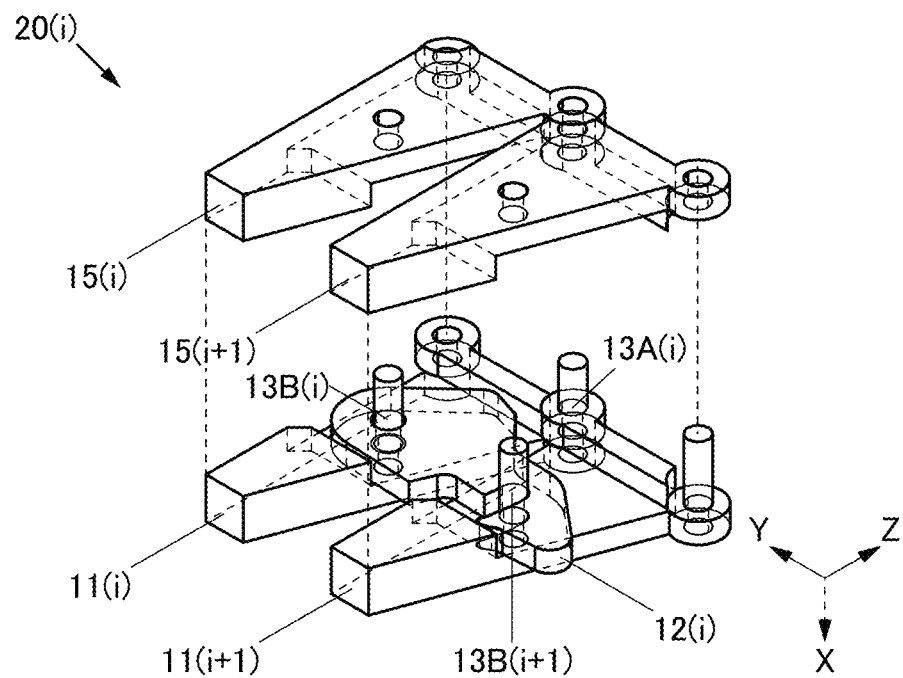

FIG. 5 illustrates a structure of a hinge that can be used for a display panel of one embodiment of the present invention. FIG. 5A is a perspective view of the hinge, and FIG. 5B is an exploded view of the hinge illustrated in FIG. 5A.

FIG. 6 illustrates a structure of a hinge that can be used for a display panel of one embodiment of the present invention. FIG. 6A is a top view of the hinge, and FIG. 6B to FIG. 6D are top views each illustrating a component included in the hinge illustrated in FIG. 6A.

Figure 7A:
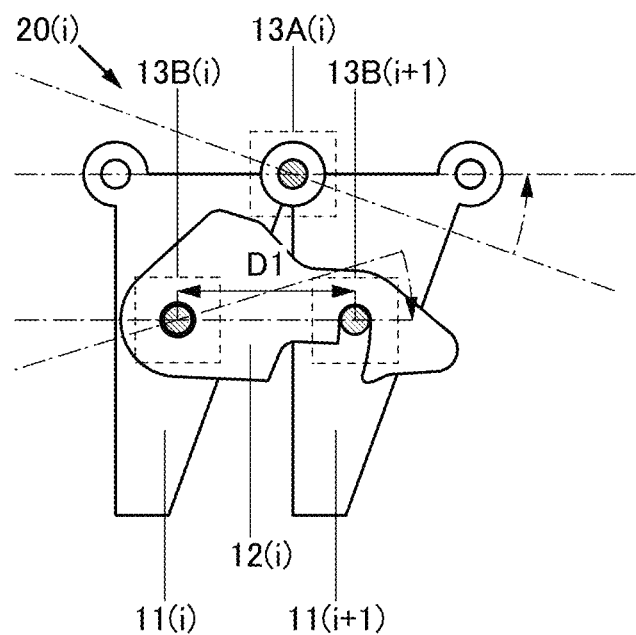
FIG. 7A and FIG. 7B are diagrams illustrating motion of a hinge of one embodiment.
Figure 7B:
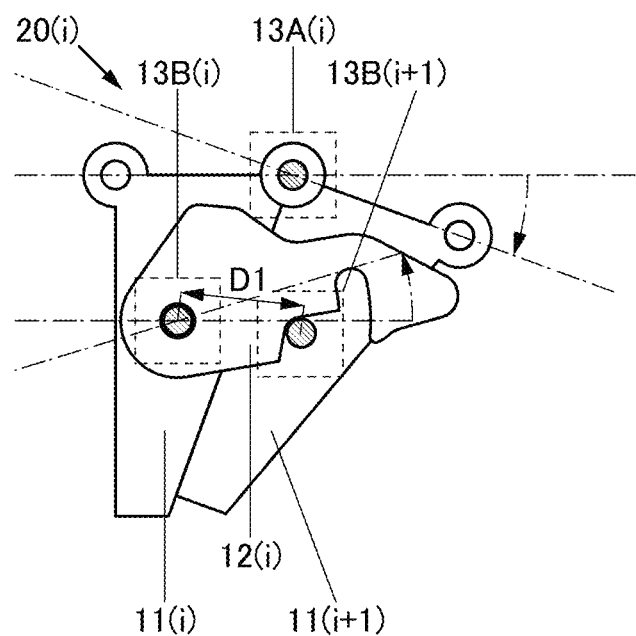

FIG. 7 illustrates motion of a hinge that can be used for a display panel of one embodiment of the present invention. FIG. 7A is a top view of the hinge, and FIG. 7B is a top view of a state different from that in FIG. 7A.

Figure 8A:
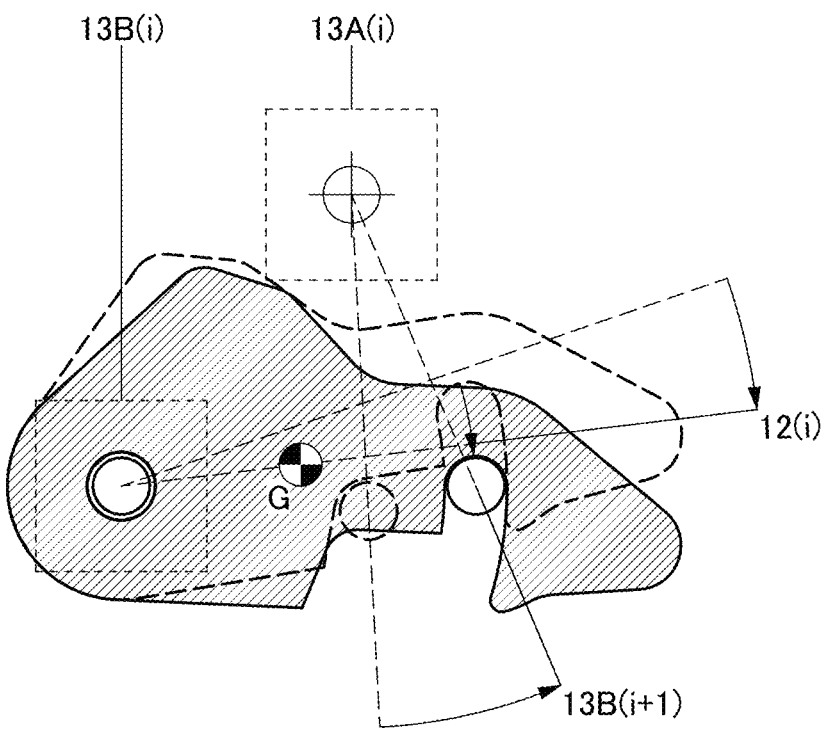
FIG. 8A and FIG. 8B are diagrams illustrating motion of a hinge of one embodiment.
Figure 8B:
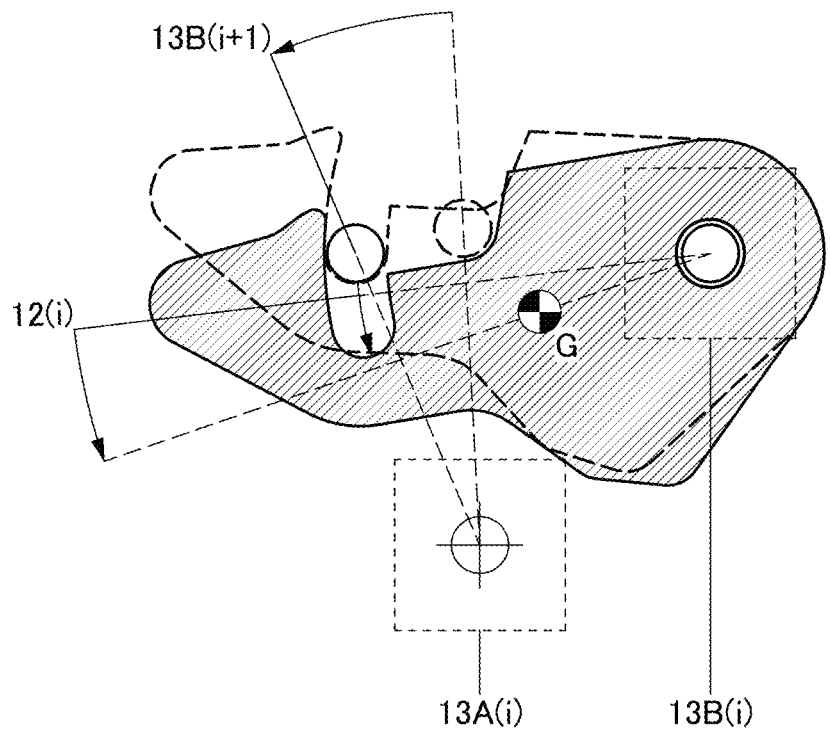

FIG. 8 illustrates motion of a hinge that can be used for a display panel of one embodiment of the present invention. FIG. 8A is a top view of a hook that can be used for the hinge, and FIG. 8B is a top view of the hook in a state different from that in FIG. 8A.

FIG. 9 illustrate a structure and motion of a hinge that can be used for a display panel of one embodiment of the present invention. FIG. 9A is a top view of the hinge, and FIG. 9B is a top view of the hinge in a state different from that in FIG. 9A. FIG. 9C to FIG. 9E are each a top view illustrating components included in the hinge illustrated in FIG. 9A.

FIG. 10 illustrate a structure and motion of a hinge that can be used for a display panel of one embodiment of the present invention. FIG. 10A is an exploded view of the hinge, and FIG. 10B is a top view illustrating part of FIG. 10A. FIG. 10C is an exploded view of the hinge in a state different from that in FIG. 10A, and FIG. 10D is a top view illustrating part of FIG. 10C.

Figure 11A:
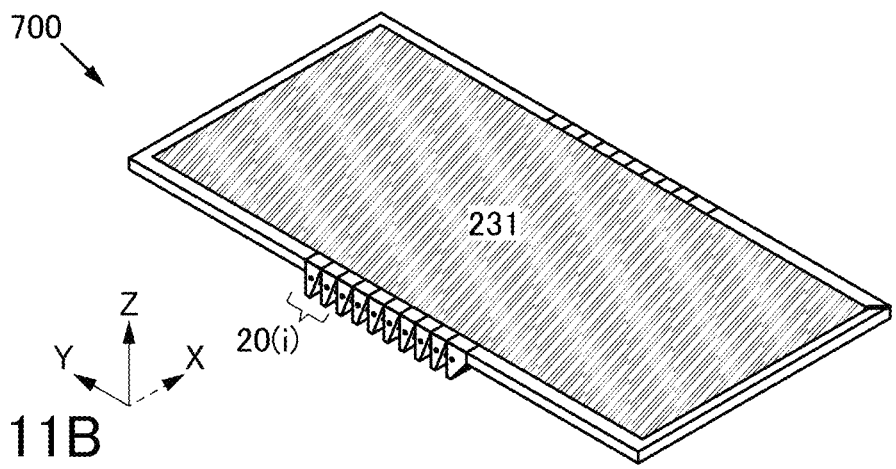
FIG. 11A to FIG. 11C are diagrams illustrating a structure of a display panel of one embodiment.
Figure 11B:
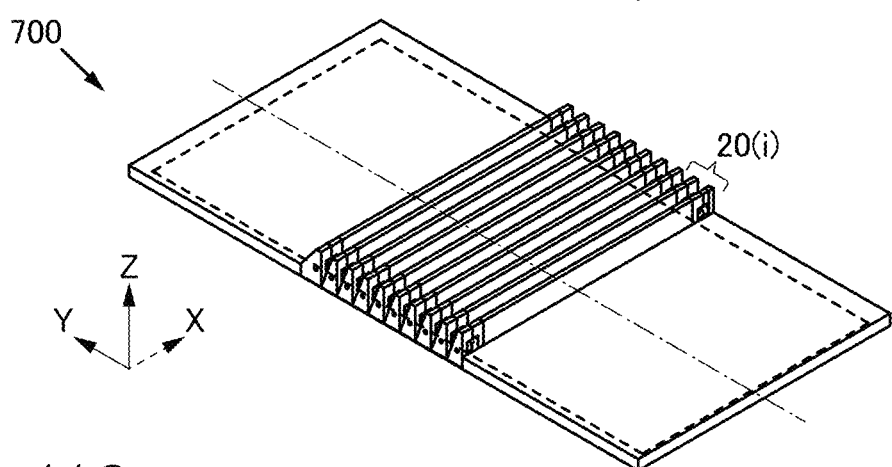
Figure 11C:
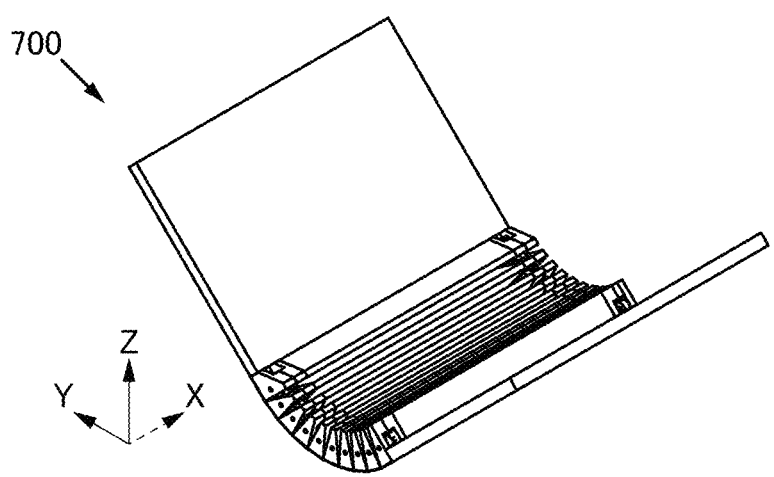

FIG. 11 illustrates a structure of a display panel of one embodiment of the present invention. FIG. 11A is a perspective view of the display panel of one embodiment of the present invention, and FIG. 11B is a perspective view of the display panel in a state different from that shown in FIG. 11A. FIG. 11C is a perspective view of the display panel in a state where the display panel shown in FIG. 11B is bent.

Figure 12A:
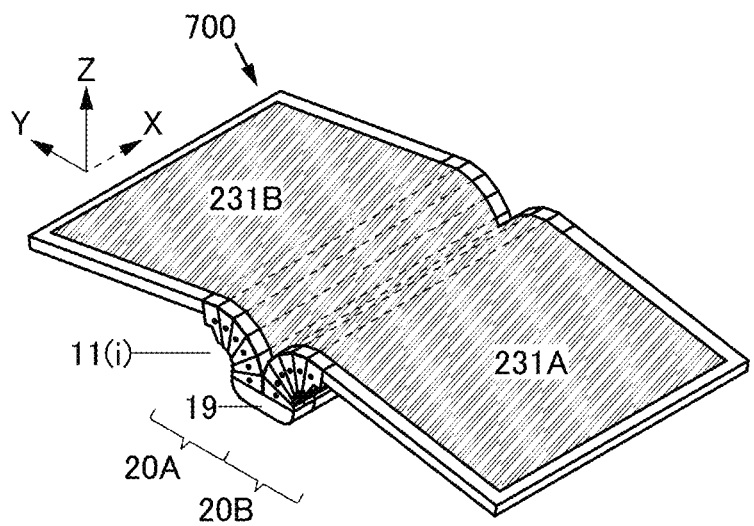
FIG. 12A to FIG. 12C are diagrams illustrating a structure of a display panel of one embodiment.
Figure 12B:
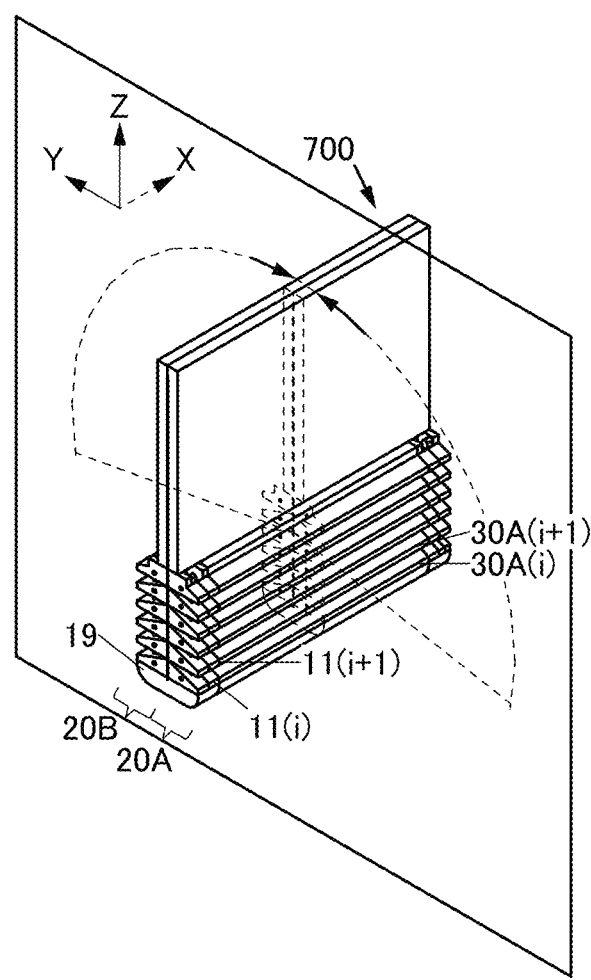
Figure 12C:
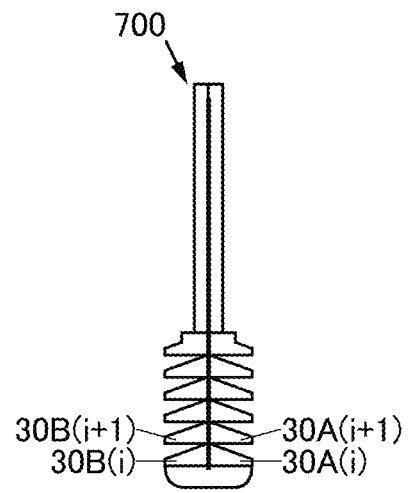

FIG. 12 illustrates a structure of a display panel of one embodiment of the present invention. FIG. 12A is a perspective view of the display panel of one embodiment of the present invention, and FIG. 12B is a perspective view of the display panel in a state different from that in FIG. 12A. FIG. 12C is a cross-sectional view along a section plane YZ in FIG. 12B.

Figure 13A:
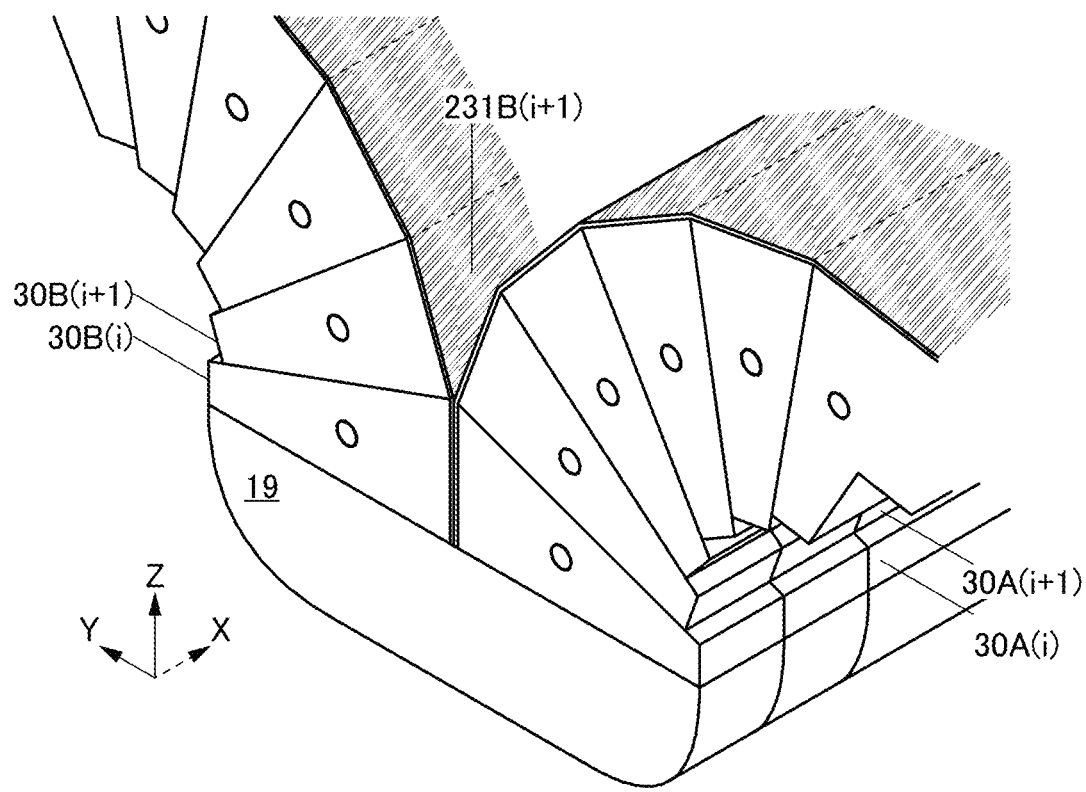
FIG. 13A and FIG. 13B are diagrams illustrating a structure of a display panel of one embodiment.
Figure 13B:
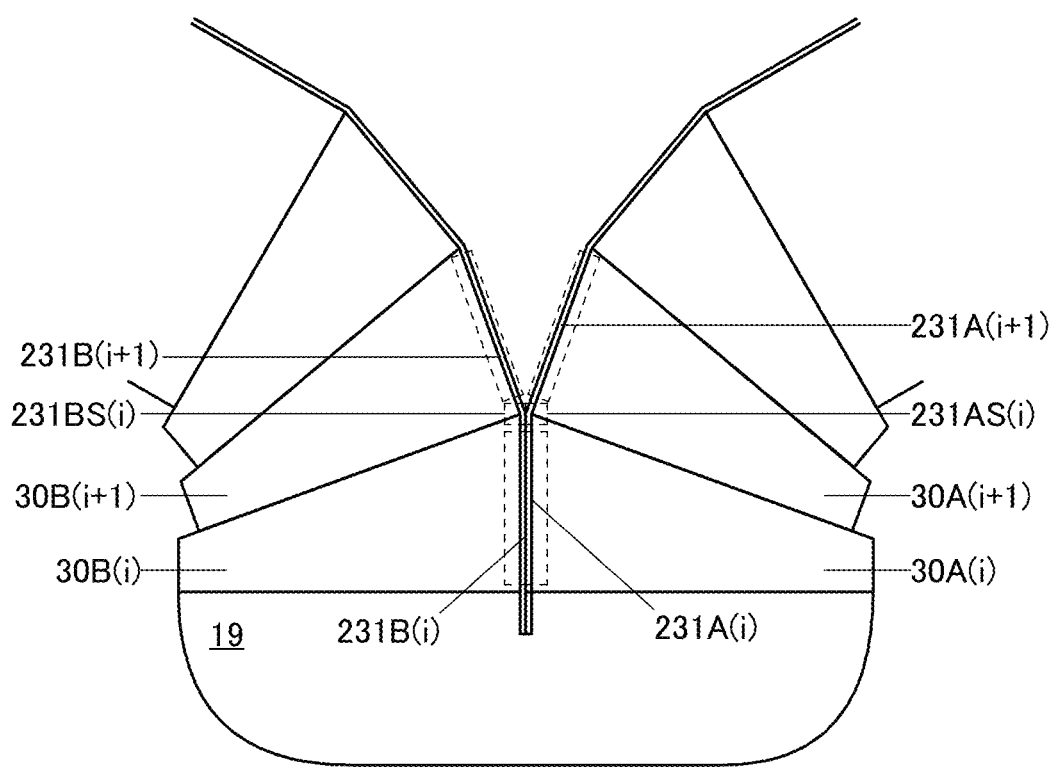

FIG. 13 illustrates a structure of a display panel of one embodiment of the present invention. FIG. 13A is a perspective view illustrating part of FIG. 12A, and FIG. 13B is a cross-sectional view illustrating part of FIG. 12C.

Figure 14:
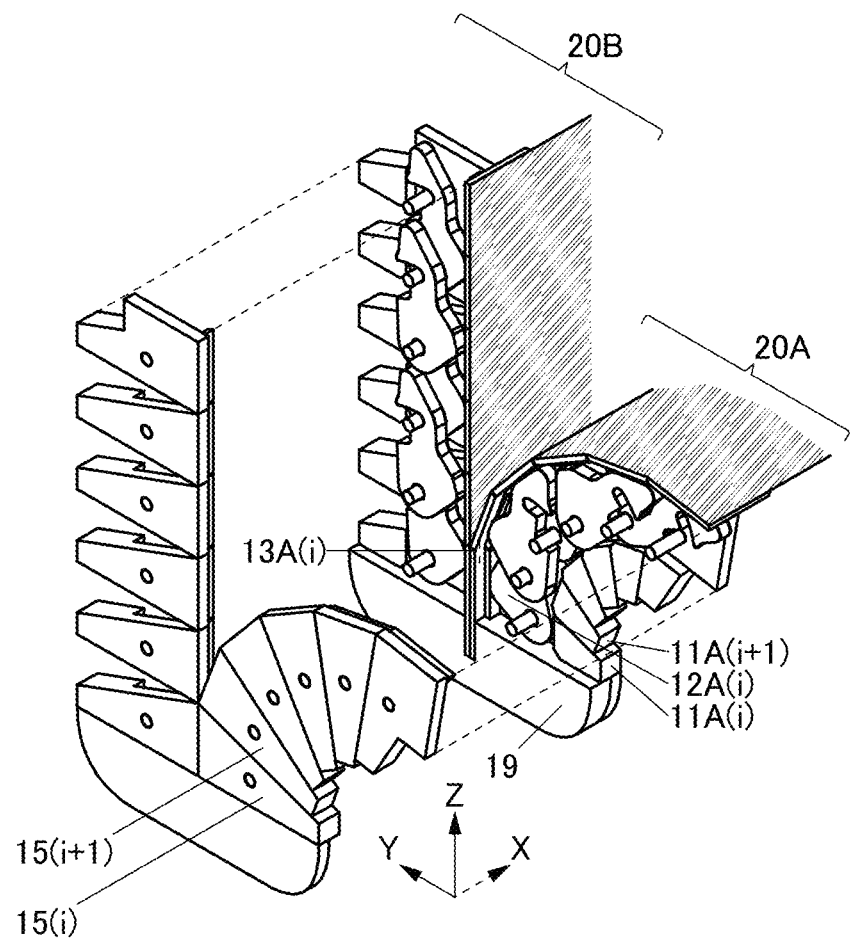
FIG. 14 is a diagram illustrating a structure of a display panel of one embodiment.

FIG. 14 illustrates a structure of a display panel of one embodiment of the present invention. FIG. 14 is an exploded view of a hinge that can be used for the display panel of one embodiment of the present invention.

<Structure Example 3 of Display Panel>

In the display panel described in this embodiment, the hinge $20(i)$ includes a hook $12(i)$, a joint $13A(i)$, a joint $13B(i)$, and a joint $13B(i+1)$ (see FIG. 5A and FIG. 5B).

«Structure Example of Link $11(i)$»

Figure 6A:
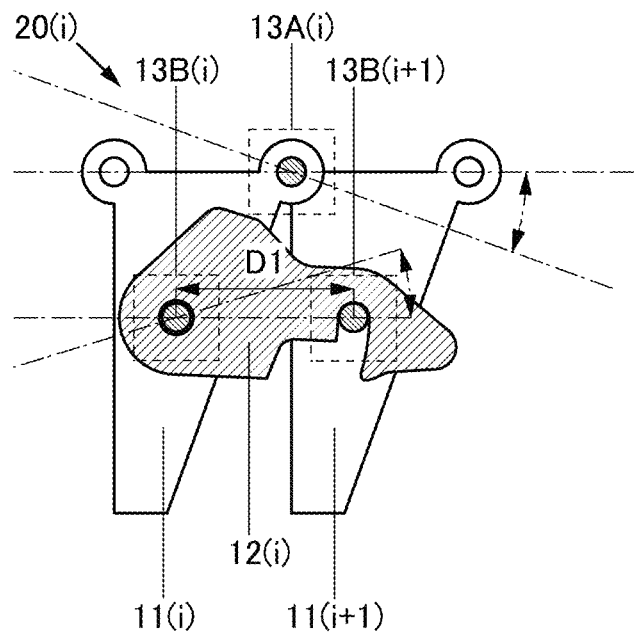
FIG. 6A to FIG. 6D are diagrams illustrating a structure of a hinge of one embodiment.
Figure 6B:
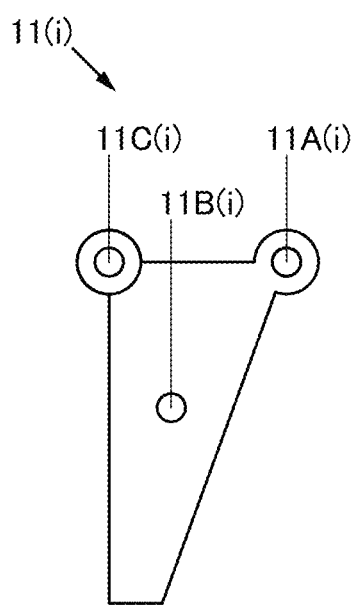

The link $11(i)$ includes an edge portion $11A(i)$ and an edge portion $11B(i)$ (see FIG. 6B). Furthermore, the link $11(i)$ includes an edge portion $11C(i)$.

«Structure Example of Link $11(i+1)$»

Figure 6C:
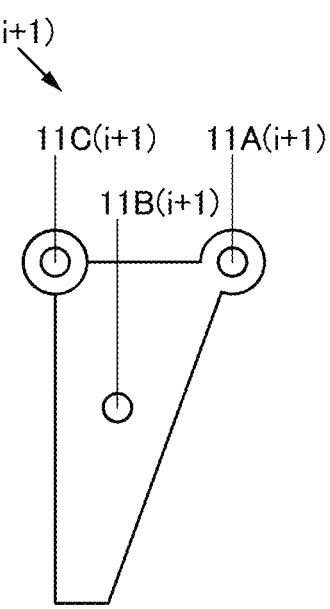

The link $11(i+1)$ includes an edge portion $11B(i+1)$ and an edge portion $11C(i+1)$ (see FIG. 6C). Furthermore, the link $11(i+1)$ includes an edge portion $11A(i+1)$.

«Structure Example 1 of Hook $12(i)$»

Figure 6D:
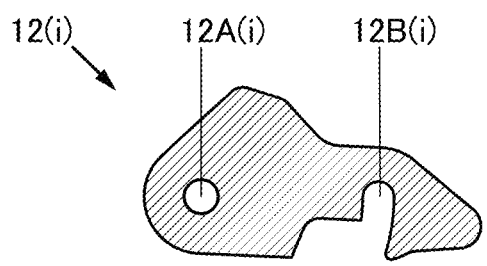

The hook $12(i)$ includes an edge portion $12A(i)$ and an edge portion $12B(i)$ (see FIG. 6D).

«Structure Example of Joint $13A(i)$»

The joint $13A(i)$ connects the edge portion $11A(i)$ and the edge portion $11C(i+1)$ so that the link $11(i)$ and the link $11(i+1)$ becomes a turning pair (see FIG. 5A, FIG. 6A, FIG. 7A, and FIG. 7B). For example, the joint $13A(i)$ can be used for an axis and bearings.

«Structure Example 1 of Joint $13B(i)$»

The joint $13B(i)$ connects the edge portion $11B(i)$ and the edge portion $12A(i)$ so that the link $11(i)$ and the hook $12(i)$ become a turning pair. For example, the joint $13B(i)$ can be used for an axis and bearings.

«Structure Example 1 of Joint $13B(i+1)$»

The joint $13B(i+1)$ is provided to have a first distance D1 from the joint $13B(i)$. Moreover, the joint $13B(i+1)$ is engaged with the hook $12(i)$ so that the first distance D1 is less than or equal to a predetermined value (see FIG. 7A and FIG. 7B). The joint $13B(i+1)$ and the hook $12(i)$ are connected to each other so as to change the first distance D1. For example, the joint $13B(i+1)$ and the hook $12(i)$ are connected so as to be a sliding pair. Furthermore, the edge portion $12B(i)$ can have a shape with a hollow with which the joint $13B(i+1)$ is engaged (see FIG. 6A and FIG. 6D).

Thus, the support $30(i+1)$ can pivot on an axis passing through the joint $13A(i)$ with respect to the support $30(i)$. Alternatively, the region $231S(i)$ can be bent so that the ridge is formed along the axis passing through the joint $13A(i)$.

Alternatively, the maximum pivoting range of the link $11(i+1)$ with respect to the link $11(i)$ can be limited. Alternatively, the region $231S(i)$ can be bent while the curvature radius is restricted. As a result, a novel display panel that is highly convenient, useful, or reliable can be provided.

<Structure Example 4 of Display Panel>

The hinge $20(i)$ included in the display panel described in this embodiment has the shortest first distance D1 when the link $11(i)$ and the link $11(i+1)$ are at a position where they interfere with each other (see FIG. 7A and FIG. 7B). For example, the sharpest bending the bending at the joint $13A(i)$ occurs at the position where the link $11(i)$ and the link $11(i+1)$ interfere with each other (see FIG. 7B).

Thus, the pivoting range of the link $11(i+1)$ with respect to the link $11(i)$ can be limited. Alternatively, the minimum and maximum pivoting ranges can be limited. Alternatively, the region $231S(i)$ can be bent while the minimum curvature radius is restricted. As a result, a novel display panel that is highly convenient, useful, or reliable can be provided.

«Structure Example 2 of Hook $12(i)$»

The hook $12(i)$ is engaged with the joint $13B(i+1)$ in conjunction with pivoting on the joint $13B(i)$ in one of directions (see FIG. 7A). For example, the hook $12(i)$ is engaged with the joint $13B(i)$ at a position where the first distance D1 has the longest value.

Furthermore, the hook $12(i)$ is taken off from the joint $13B(i+1)$ in conjunction with pivoting on the joint $13B(i)$ in the other direction (see FIG. 7B). For example, the joint $13B(i+1)$ is taken off from a hollow of the edge portion $12B(i)$ in the hook $12(i)$.

Thus, the link $11(i+1)$ can be made to stay at a predetermined position. Alternatively, the link $11(i+1)$ can be moved with respect to the link $11(i)$. Alternatively, the first distance D1 can be kept having a predetermined value. Alternatively, the first distance D1 can be changed. As a result, a novel display panel that is highly convenient, useful, or reliable can be provided.

«Structure Example 2 of Joint $13B(i)$»

The joint $13B(i)$ is provided apart from a center of gravity of the hook $12(i)$ (see FIG. 8A).

«Structure Example 3 of Hook $12(i)$»

The hook $12(i)$ can pivot under own weight on the joint $13B(i)$ (see FIG. 8A and FIG. 8B).

Thus, a user can engage the hook $12(i)$ with the joint $13B(i+1)$, tilting the hinge to one of predetermined directions, for example. Alternatively, the user can take the hook $12(i)$ off from the joint $13B(i+1)$, tilting the hinge to the other of the predetermined directions, for example. As a result, a novel display panel that is highly convenient, useful, or reliable can be provided.

<Structure Example 5 of Display Panel>

Figure 9A:
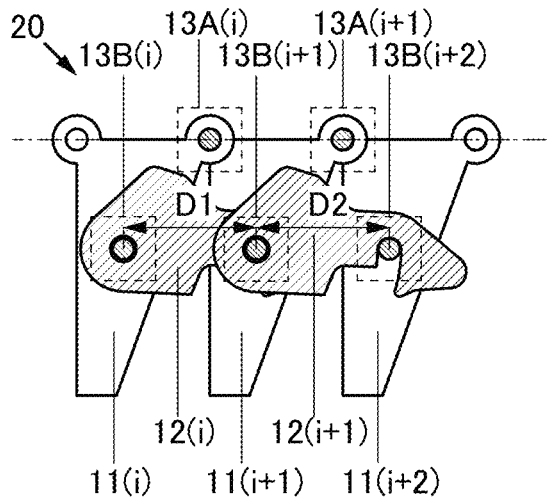
FIG. 9A to FIG. 9E are diagrams illustrating a structure and motion of a hinge of one embodiment.

The hinge $20$ included in the display panel described in this embodiment includes a link $11(i+2)$, a hook $12(i+1)$, a joint $13A(i+1)$, and a joint $13B(i+2)$ (see FIG. 9A).

«Structure Example 2 of Link $11(i+1)$»

Figure 9B:
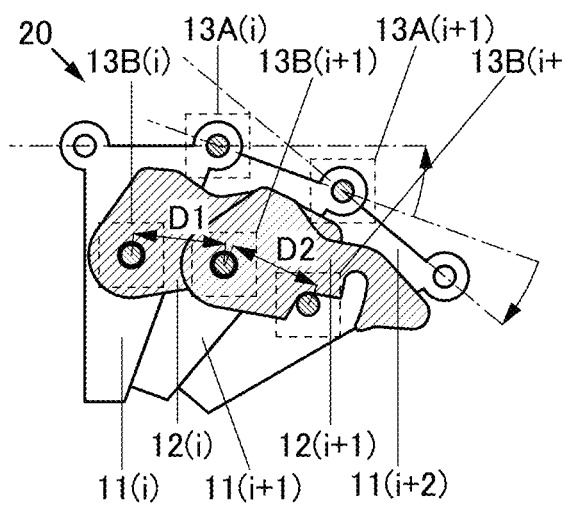
Figure 9C:
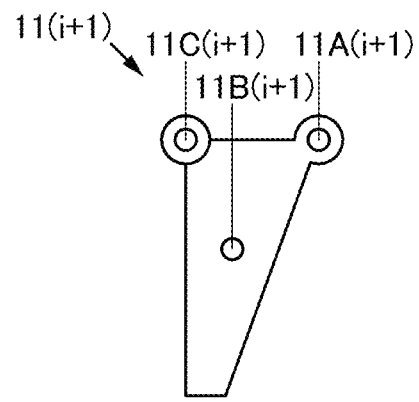

The link $11(i+1)$ includes the edge portion $11A(i+1)$ (see FIG. 9C).

«Structure Example of Link $11(i+2)$»

Figure 9D:
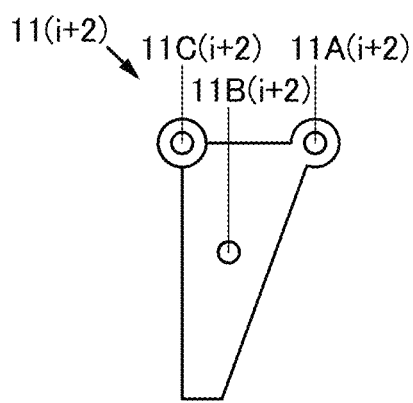

The link $11(i+2)$ includes an edge portion $11B(i+2)$ and an edge portion $11C(i+2)$ (see FIG. 9D). In addition, the link $11(i+2)$ includes an edge portion $11A(i+2)$.

«Structure Example of Hook $12(i+1)$»

Figure 9E:
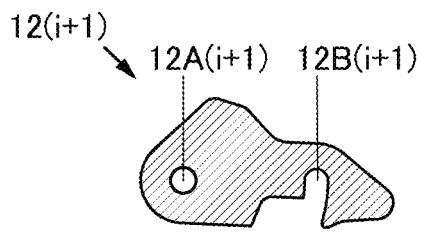

The hook $12(i+1)$ includes an edge portion $12A(i+1)$ and an edge portion $12B(i+1)$ (see FIG. 9E).

«Structure Example of Joint 13A(i+1)»

The joint 13A(i+1) connects the edge portion 11A(i+1) and the edge portion 11C(i+2) so that the link 11(i+1) and the link 11(i+2) become a turning pair (see FIG. 9A and FIG. 9B).

«Structure Example 2 of Joint 13B(i+1)»

The joint 13B(i+1) connects the edge portion 11B(i+1) and the edge portion 12A(i+1) so that the link 11(i+1) and the hook 12(i+1) become a turning pair (see FIG. 9A, FIG. 9B, and FIG. 9E). Note that the joint 13B(i+1) has a function of being engaged with the hook 12(i). In this manner, the number of components can be reduced. Furthermore, besides the joint for engagement with the hook 12(i), a joint for such a connection that the link 11(i+1) and the hook 12(i+1) become a turning pair may be provided.

«Structure Example of Joint 13B(i+2)»

The joint 13B(i+2) is provided to have a second distance D2 from the joint 13B(i+1). Furthermore, the joint 13B(i+2) is engaged with the hook 12(i+1) so that the second distance D2 is less than or equal to a predetermined value.

Thus, the maximum pivoting range of the link 11(i+2) with respect to the link 11(i+1) can be limited. Alternatively, for example, bending can occur at a plurality of portions, the joint 13A(i) and the joint 13A(i+1). As a result, a novel display panel that is highly convenient, useful, or reliable can be provided.

<Structure Example 6 of Display Panel>

The hinge 20 included in the display panel described in this embodiment has the shortest second distance D2 when the link 11(i+1) and the link 11(i+2) are at a position where they interfere with each other (see FIG. 9A and FIG. 9B).

Thus, the minimum value and the maximum value of pivoting range of the link 11(i+2) on the joint 13A(i+1) can be limited. As a result, a novel display panel that is highly convenient, useful, or reliable can be provided.

<Structure Example 7 of Display Panel>

In the hinge of the display panel described in this embodiment, the second distance D2 is less than or equal to the longest value of the first distance D1 and greater than or equal to the shortest value of the first distance D1.

Thus, the pivoting range of the link 11(i+2) on the joint 13A(i+1) can be substantially equal to the pivoting range of the link 11(i+1) on the joint 13A(i). As a result, a novel display panel that is highly convenient, useful, or reliable can be provided.

«Structure Example 3 of Joint 13B(i+1)»

Figure 10A:
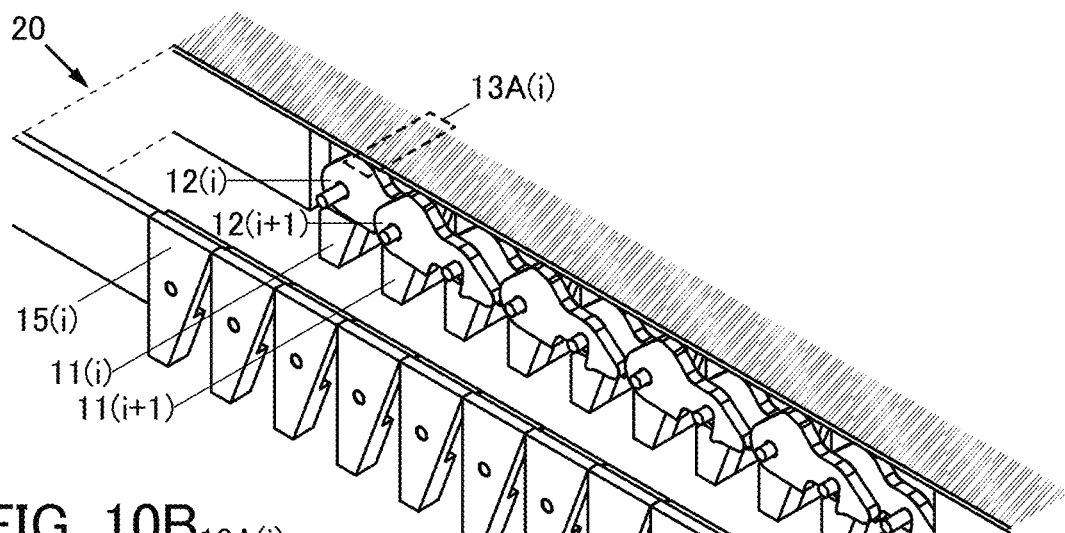
FIG. 10A to FIG. 10D are diagrams illustrating a structure and motion of a hinge of one embodiment.
Figure 10B:
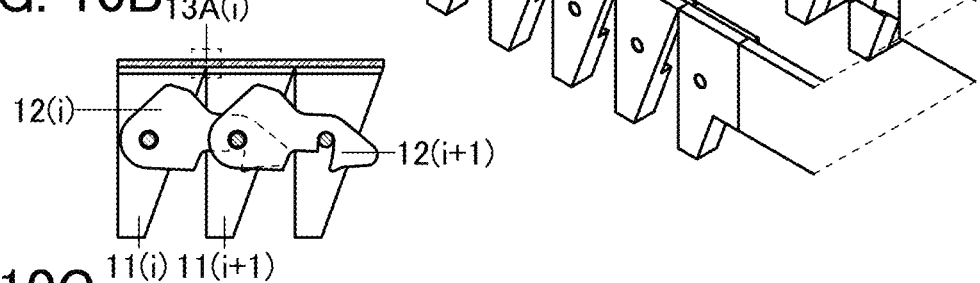
Figure 10C:
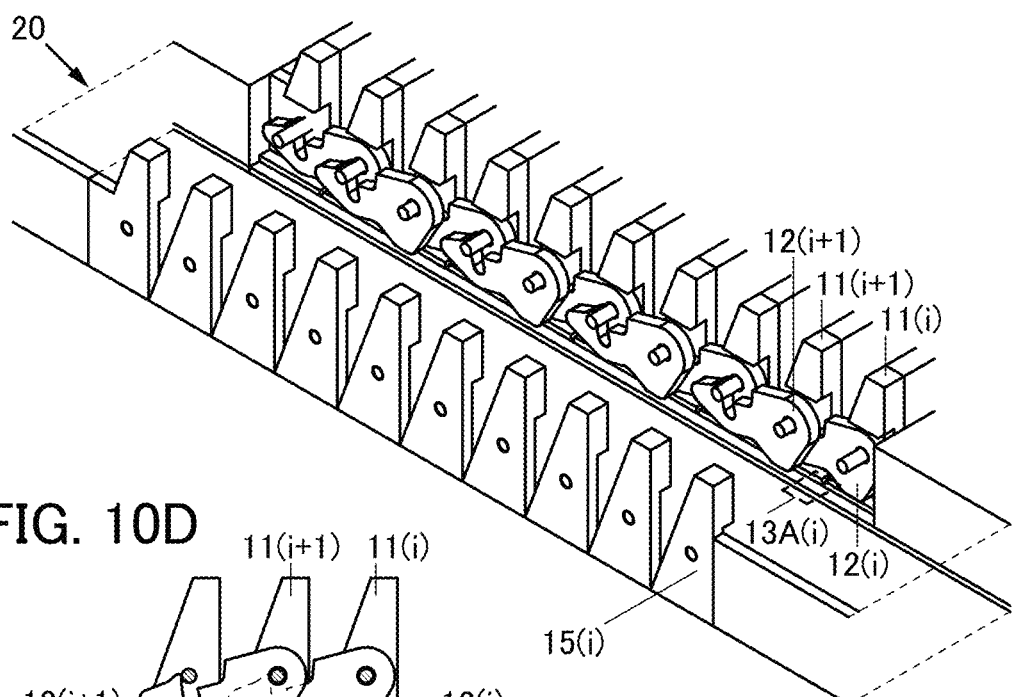
Figure 10D:
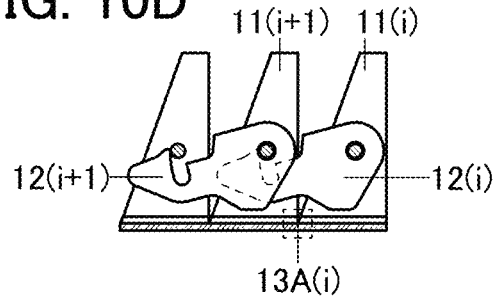

The joint 13B(i+1) is provided apart from a center of gravity of the hook 12(i+1) (see FIG. 10B and FIG. 10D). Furthermore, the hook 12(i+1) can pivot under own weight in synchronization with the hook 12(i) pivoting (see FIG. 10A and FIG. 10C).

Thus, for example, a user can engage the hook 12(i+1) with the joint 13B(i+2), tilting the hinge to one of predetermined directions, as in the case where the hook 12(i) is engaged with the joint 13B(i+1). Alternatively, for example, the user can take the hook 12(i+1) off from the joint 13B(i+2), tilting the hinge to the other of the predetermined directions, as in the case where the hook 12(i) is taken off from the joint 13B(i+1). As a result, a novel display panel that is highly convenient, useful, or reliable can be provided.

For example, when the display region 231 in the display panel 700 of one embodiment of the present invention faces upward, a user can engage the hook with the joint (see FIG. 10A, FIG. 10B, and FIG. 11A). When the hook is engaged with the joint, the distance D1 is kept having a predetermined value, and the display panel is not allowed to be bent.

Furthermore, when the display region 231 in the display panel 700 of one embodiment of the present invention faces downward, for example, a user can take the hook off from the joint (see FIG. 10C, FIG. 10D, and FIG. 11B). When the hook is taken off from the joint, the bending is allowed (see FIG. 11C).

<Structure Example 8 of Display Panel>

The display panel 700 described in this embodiment includes a display region 231A, a display region 231B, a connection portion 19, a support 30A(i), a support 30A(i+1), a support 30B(i), and a support 30B(i+1) (see FIG. 12A, FIG. 12B, and FIG. 12C).

«Structure Example of Display Region 231A»

The display region 231A includes a region 231A(i), a region 231A(i+1), and a region 231AS(i) (see FIG. 13B).

The region 231A(i) and the region 231A(i+1) each have a belt-like shape extending in one direction (e.g., in a direction denoted by an arrow X in the diagram) (see FIG. 13A).

The region 231AS(i) is sandwiched between the region 231A(i) and the region 231A(i+1) (see FIG. 13B).

«Structure Example of Display Region 231B»

The display region 231B includes a region 231B(i), a region 231B(i+1), and a region 231BS(i) (see FIG. 13B).

The region 231B(i) and the region 231B(i+1) each have a belt-like shape extending in one direction (e.g., in a direction denoted by an arrow X in the diagram), and the region 231B(i) faces with the region 231A(i). (see FIG. 13B)

The region 231BS(i) is sandwiched between the region 231B(i) and the region 231B(i+1) (see FIG. 13B).

«Structure Example of Connection Portion 19»

The connection portion 19 connects the display region 231A and the display region 231B.

«Structure Example of Support 30A(i)»

The support 30A(i) overlaps with the region 231A(i). For example, a narrow and long shape extending in a direction denoted by the arrow X can be employed for the support 30A(i).

The support 30A(i) is less likely to be warped than the region 231AS(i). In other words, the region 231AS(i) can be warped more easily than the support 30A(i). Alternatively, the region 231AS(i) is warped earlier than the support 30A(i) when application of force is gradually increased.

«Structure Example 1 of Support 30A(i+1)»

The support 30A(i+1) overlaps with the region 231A(i+1) and is less likely to be warped than the region 231AS(i).

In addition, the support 30A(i+1) can pivot on an axis extending in one direction (e.g., in a direction denoted by the arrow X in the diagram) with respect to the support 30A(i) (see FIG. 13B). For example, the support 30A(i+1) can pivot on an axis passing through the region 231AS(i) and extending in the direction denoted by the arrow X with respect to the support 30A(i).

«Structure Example of Support 30B(i)»

The support 30B(i) overlaps with the region 231B(i) and is less likely to be warped than the region 231BS(i).

«Structure Example of Support 30B(i+1)»

The support 30B(i+1) overlaps with the region 231B(i+1) and is less likely to be warped than the region 231BS(i).

In addition, the support 30B(i+1) can pivot on an axis extending in one direction (e.g., in a direction denoted by the arrow X in the diagram) with respect to the support 30B(i).

Thus, the first display region 231A and the second display region 231B can be placed side by side to be one continuous display region. Alternatively, the display panel can be folded so that the first display region 231A faces the second display region 231B. As a result, a novel display panel that is highly convenient, useful, or reliable can be provided.

Note that this embodiment can be combined with any of the other embodiments in this specification as appropriate.

Embodiment 3

In this embodiment, a structure of a display panel of one embodiment of the present invention will be described with reference to FIG. 15 to FIG. 18.

FIG. 15 illustrates a structure of the display panel of one embodiment of the present invention. FIG. 15A is a top view of the display panel of one embodiment of the present invention, and FIG. 15B illustrates part of FIG. 15A. FIG. 15C illustrates part of FIG. 15A, and FIG. 15D illustrates a structure different from that of FIG. 15C.

Figure 15A:
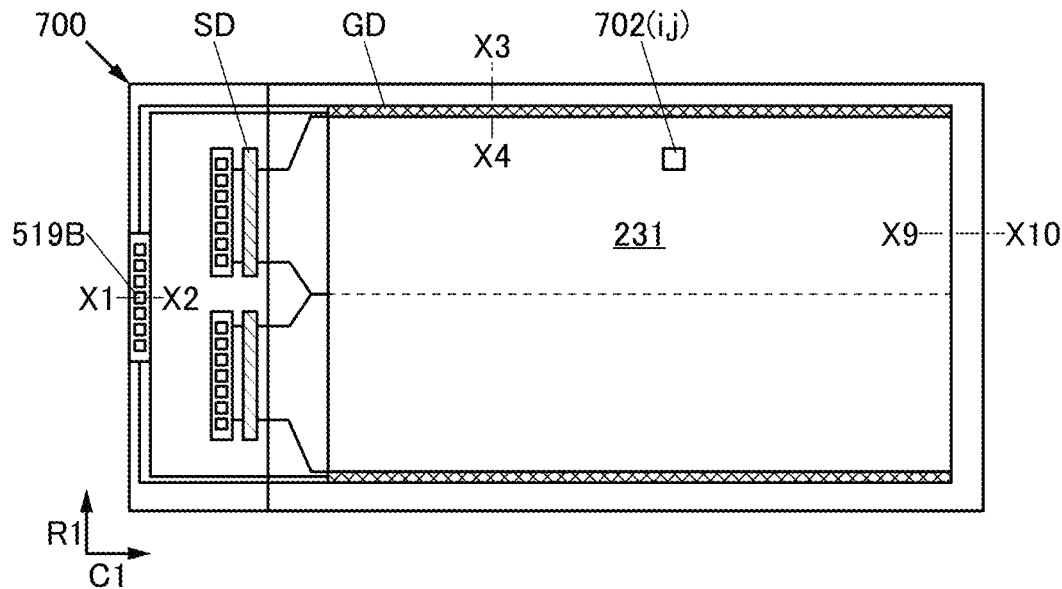
FIG. 15A to FIG. 15E are diagrams illustrating a structure of a display panel of one embodiment.
Figure 15B:
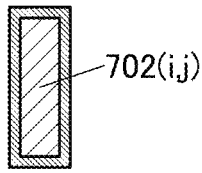
Figure 16A:
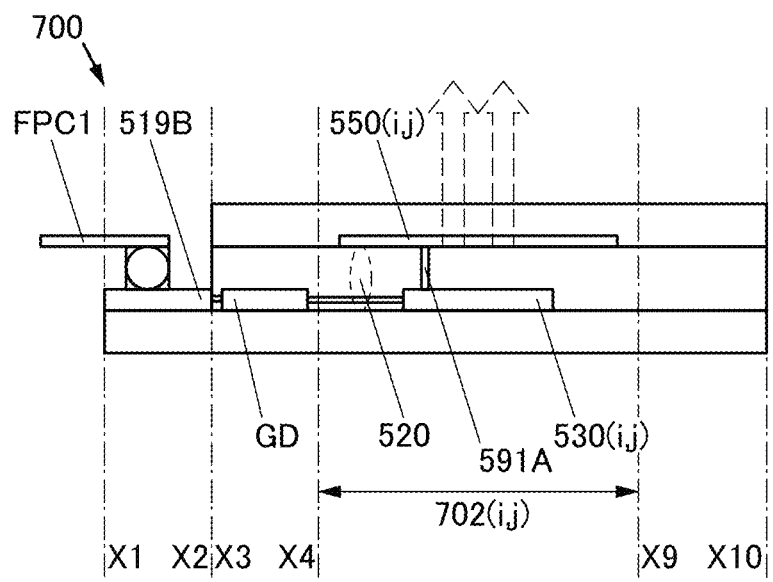
FIG. 16A and FIG. 16B are diagrams illustrating a structure of a display panel of one embodiment.
Figure 16B:
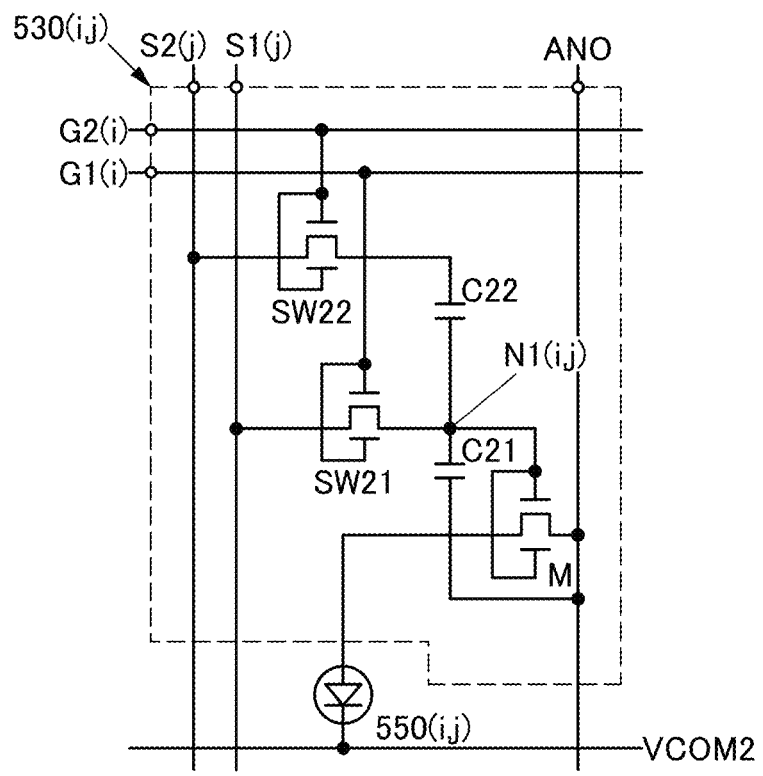

FIG. 16 illustrates a structure of a display panel of one embodiment of the present invention. FIG. 16A is a cross-sectional view taken along cutting lines X1-X2, X3-X4, and X9-X10 and of a pixel in FIG. 15A, and FIG. 16B is a circuit diagram illustrating a configuration of a pixel circuit 530(i, j).

Figure 17A:
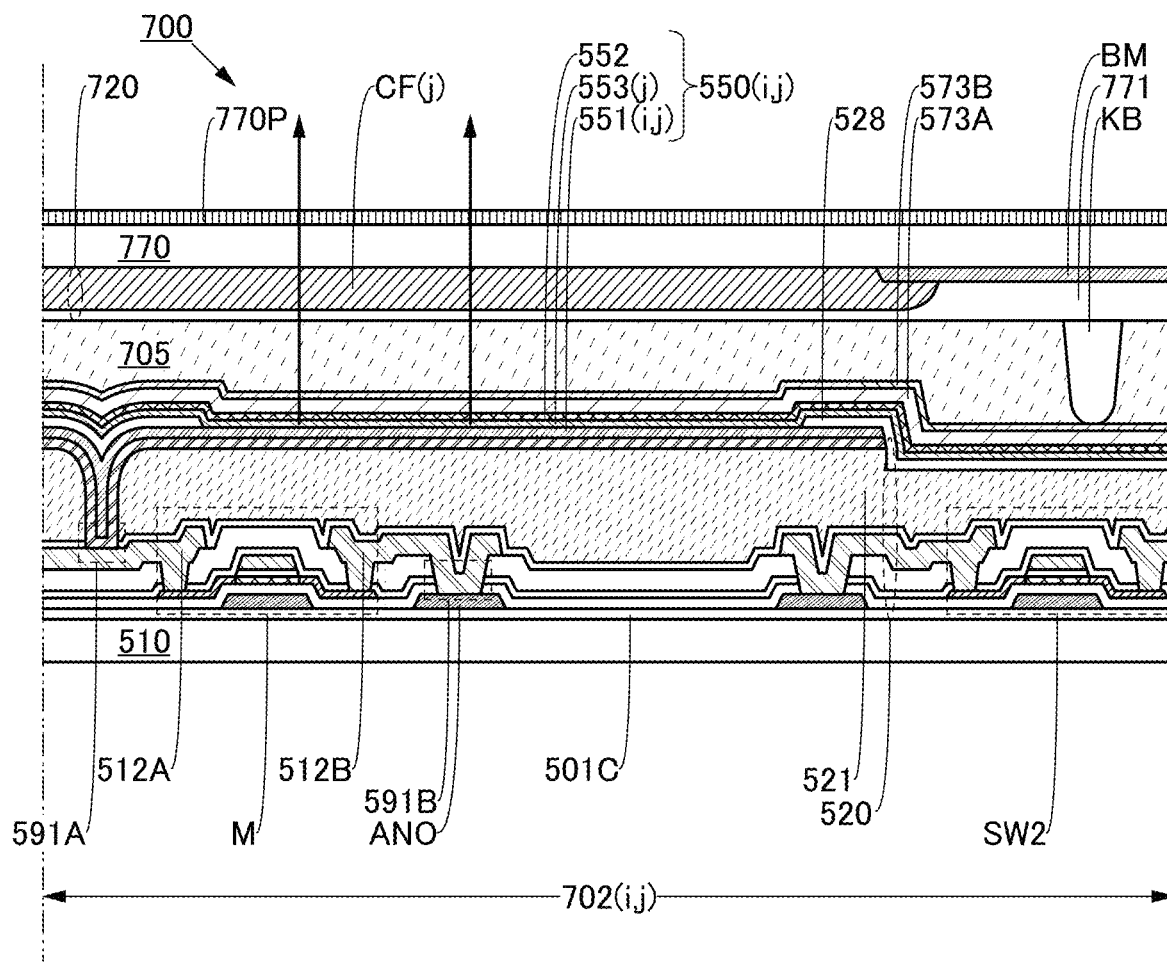
FIG. 17A and FIG. 17B are cross-sectional views illustrating a structure of a display panel of one embodiment.
Figure 17B:
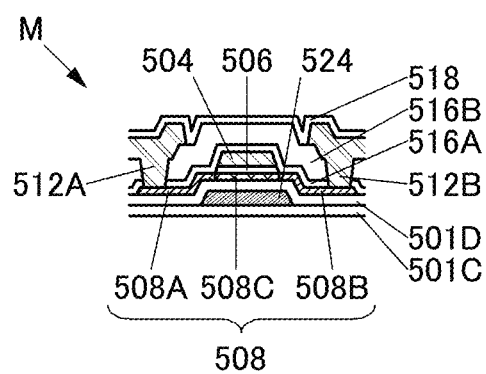

FIG. 17 illustrates a structure of a display panel of one embodiment of the present invention. FIG. 17A is a cross-sectional view of a pixel 702(i,j) in FIG. 15A, and FIG. 17B is a cross-sectional view illustrating part of FIG. 17A.

Figure 18A:
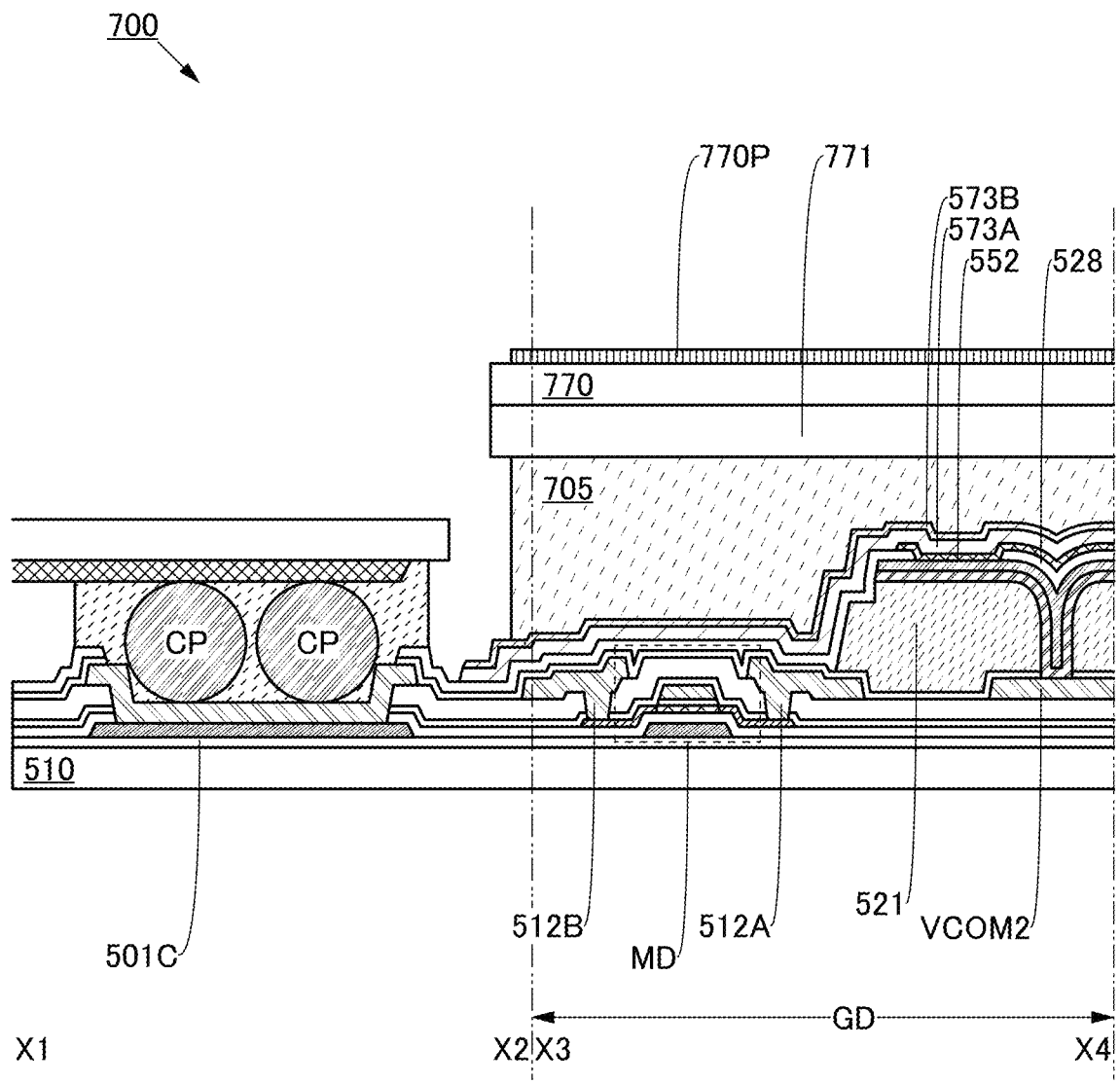
FIG. 18A and FIG. 18B are cross-sectional views illustrating a structure of a display panel of one embodiment.
Figure 18B:
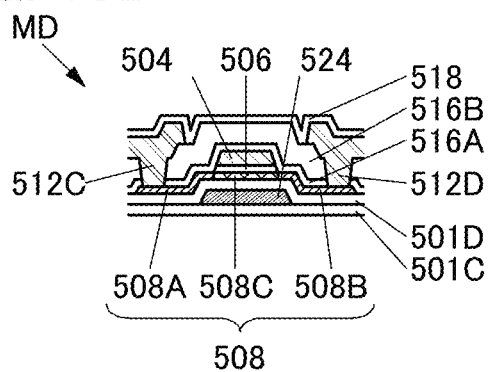

FIG. 18 illustrates a structure of a display panel of one embodiment of the present invention. FIG. 18A is a cross-sectional view taken along cutting lines X1-X2 and X3-X4 in FIG. 15A, and FIG. 18B is a cross-sectional view illustrating part of FIG. 18A.

Note that in this specification, an integer variable of 1 or more is sometimes used in reference numerals. For example, (p) where p is an integer variable of 1 or more is sometimes used in part of a reference numeral that specifies any of p components at a maximum. For another example, (m, n) where m and n are each an integer variable of 1 or more is sometimes used in part of a reference numeral that specifies any of m×n components at a maximum.

<Structure Example 1 of Display Panel 700>

A display panel 700 described in this embodiment includes a display region 231 and a functional layer 520 (see FIG. 15A and FIG. 16A).

«Structure Example 1 of Display Region 231»

The display region 231 includes the pixel 702(i,j).

«Structure Example of Pixel 702(i,j)»

The pixel 702(i,j) includes a display element 550(i,j) and the pixel circuit 530(i,j).

«Structure Example 1 of Functional Layer 520»

The functional layer 520 includes the pixel circuit 530(i, j). The functional layer 520 has an opening portion 591A.

The pixel circuit 530(i,j) is electrically connected to the display element 550(i,j) in the opening portion 591A (see FIG. 16A).

Accordingly, the pixel circuit 530(i,j) can be formed in the functional layer 520. Alternatively, the display element 550(i,j) can be driven with the use of the pixel circuit 530(i,j). As a result, a novel display panel that is highly convenient, useful, or reliable can be provided.

«Structure Example 1 of Pixel Circuit 530(i,j)»

The pixel circuit 530(i,j) is electrically connected to a scan line G1(i) and a signal line S1(j) (see FIG. 16B).

A switch, a transistor, a diode, a resistor, an inductor, a capacitor, or the like can be used in the pixel circuit 530(i, j), for example. Specifically, a transistor can be used as a switch.

For example, in the case where a plurality of transistors are used in a pixel circuit, a semiconductor film of one transistor can be formed in the step of forming a semiconductor film of another transistor, for example.

«Structure Example 2 of Pixel Circuit 530(i,j)»

The pixel circuit 530(i,j) includes a transistor M, a node N1(i,j) a switch SW21, a capacitor C21, a capacitor C22, and a switch SW22.

The transistor M includes a first electrode electrically connected to the display element 550(i,j), and the second electrode electrically connected to the conductive film ANO.

The node N1(i,j) is electrically connected to a gate electrode of the transistor M. Note that the display element 550(i,j) performs display based on a potential.

The switch SW21 includes a first terminal electrically connected to the node N1(i,j) and a second terminal electrically connected to a wiring. For example, a signal line S1(j) can be used as the wiring. Note that the switch SW21 has a function of switching a conduction state and a non-conduction state on the basis of a selection signal, for example.

The capacitor C21 includes a first electrode electrically connected to the node N1(i,j) and a second electrode electrically connected to a wiring. For example, the conductive film ANO can be used as the wiring.

The capacitor C22 includes a first electrode electrically connected to the node N1(i,j) and a second electrode electrically connected to a first terminal of the switch SW22.

The switch SW22 includes a first terminal electrically connected to a wiring. For example, a signal line S2(j) can be used as the wiring. Note that the switch SW22 has a function of switching between a conducting state and a non-conducting state on the basis of the selection signal, for example.

When the switch SW21 is in a non-conducting state, the switch SW22 can change from a non-conducting state to a conducting state. When the switch SW21 is in a non-conducting state, the switch SW22 can change from a conducting state to a non-conducting state.

In this manner, the potential of the node N1(i,j) can be controlled using the switch SW21 and the switch SW22. Alternatively, the potential of the node N1(i,j) can be controlled using the switch SW21, and the potential of the node N1(i,j) can be changed using the switch SW22. Alternatively, the changing potential can be supplied to the display element 550(i,j). Alternatively, display can be performed on the basis of the changing potential. Alternatively, the display of the display element 550(i,j) can be changed. Alternatively, an operation of the display element 550(i,j) can be emphasized. Alternatively, the response of the display element 550(i,j) can be made faster. As a result, a novel display panel that is highly convenient, useful, or reliable can be provided.

«Structure Example 3 of Pixel Circuit 530(i,j)»

A bottom-gate transistor or a top-gate transistor can be used in the pixel circuit 530(i,j), for example. Specifically, a transistor can be used as a switch.

«Structure Example of Transistor»

The transistor M includes a semiconductor film 508, a conductive film 504, a conductive film 512A, and a conductive film 512B (see FIG. 17B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region, and the semiconductor film 508 is sandwiched between the region and the conductive film 504. The conductive film 524 has a function of a second gate electrode. The conductive film 524 can be electrically connected to the conductive film 504, for example.

Note that in a process of forming the semiconductor film used in the transistor of the pixel circuit, the semiconductor film used in the transistor of a driver circuit can be formed, for example.

《Structure Example 1 of Semiconductor Film 508》

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the driving capability can be higher than that of a transistor using hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor using hydrogenated amorphous silicon for the semiconductor film 508.

Alternatively, the temperature required for fabrication of the transistor can be lower than that required for a transistor using single crystal silicon, for example.

Alternatively, the semiconductor film used for the transistor of the driver circuit can be formed through the same process as the semiconductor film used for the transistor of the pixel circuit. Alternatively, the driver circuit can be formed over the same substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head mounted display having less display unevenness can be provided.

《Structure Example 2 of Semiconductor Film 508》

For example, a metal oxide can be used for the semiconductor film 508. Specifically, a material described in Embodiment 12 can be used for the semiconductor film 508. Thus, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of the data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used for a switch or the like. In that case, the potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is sandwiched.

A stacked film in which a 400-nm-thick film containing silicon and nitrogen and a 200-nm-thick film containing silicon, oxygen, and nitrogen are stacked can be used as the insulating film 506, for example. Note that the film containing silicon and nitrogen includes a region; between the region and the semiconductor film 508, the film containing silicon, oxygen, and nitrogen is sandwiched.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering can be inhibited. Alternatively, power consumption can be reduced. Alternatively, a moving image with quick movements can be smoothly displayed. Alternatively, a photograph and the like can be displayed with a wide range of grayscale. As a result, a novel display panel that is highly convenient, useful, or reliable can be provided.

«Structure Example 3 of Semiconductor Film 508»

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

«Structure Example of Capacitor»

A capacitor includes one conductive film, a different conductive film, and an insulating film. The insulating film includes a region positioned between the one conductive film and the different conductive film.

For example, the conductive film 504, the conductive film 512A, and the insulating film 506 can be used for the capacitor.

«Structure Example 2 of Functional Layer 520»

The functional layer 520 includes an insulating film 521, an insulating film 518, an insulating film 516, the insulating film 506, an insulating film 501C, and the like (see FIG. 17A and FIG. 17B).

The insulating film 521 includes a region sandwiched between the pixel circuit 530(i,j) and the display element 550(i,j).

The insulating film 518 includes a region sandwiched between the insulating film 521 and the insulating film 501C.

The insulating film 516 includes a region positioned between the insulating film 518 and the insulating film 501C.

The insulating film 506 includes a region positioned between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can eliminate a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region sandwiched between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

«Structure Example 3 of Functional Layer 520»

The functional layer 520 includes a conductive film, a wiring, and a terminal. A material having conductivity can be used for the wiring, an electrode, the terminal, the conductive film, or the like.

«Wiring or the Like»

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive polymer can be used for the wiring or the like.

Note that a terminal 519B can be electrically connected to a flexible printed circuit FPC1, for example (see FIG. 16A). Specifically, the terminal 519B and the flexible printed circuit FPC1 can be electrically connected to each other using a conductive material CP, for example (see FIG. 18A).

<Structure Example 2 of Display Panel 700>

The display panel 700 includes a base material 510, a base material 770, and a sealant 705 (see FIG. 17A).

«Base Material 510 and Base Material 770»

A material having a light-transmitting property can be used for the base material 510 or the base material 770.

For example, a flexible material can be used for the base material 510 or the base material 770. Thus, a flexible display panel can be provided.

For example, a material with a thickness less than or equal to 0.7 mm and greater than or equal to 0.1 mm can be used. Specifically, a material polished to a thickness approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material, or the like can be used, for example.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as resin, a resin film, or plastic can be used for the base material 510 or the base material 770. Specifically, a material containing polyester, polyolefin, polyamide (nylon, aramid, or the like), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or resin can be prevented. Alternatively, diffusion of impurities that pass through a resin can be prevented.

Furthermore, paper, wood, or the like can be used for the base material 510 or the base material 770.

For example, a material having heat resistance high enough to withstand heat treatment in the fabricating process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a substrate which is for use in the process and has heat resistance to heat applied in the fabricating process, and the formed insulating film, transistor, capacitor, or the like is transferred to the base material 510 or the base material 770 can be used. Accordingly, an insulating film, a transistor, a capacitor, or the like can be formed on a flexible substrate, for example.

«Sealant 705»

The sealant 705 includes a region sandwiched between the functional layer 520 and the base material 770 and has a function of bonding the functional layer 520 and the base material 770 together (see FIG. 18A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<Structure Example 3 of Display Panel 700>

The display panel 700 includes a functional layer 720 (see FIG. 17A). In addition, the display panel 700 includes a structure body KB, a functional film 770P, or the like.

«Functional Layer 720»

The functional layer 720 includes a coloring film CF(j), a light-blocking film BM, and an insulating film 771.

«Coloring Film CF(j)»

The coloring film CF(j) includes a region sandwiched between the base material 770 and the display element 550($i,j$). For example, a material that selectively transmits light of a predetermined color can be used for the coloring layer CF(j). Specifically, a material that transmits red light, green light, or blue light can be used for the coloring layer CF(j).

«Insulating Film 771»

The insulating film 771 includes a region; between the region and the base material 770, the light-blocking film BM is sandwiched.

The insulating film 771 includes a region; between the region and the base material 770, the coloring layer CF(j) is sandwiched.

Alternatively, the insulating film 771 includes a region sandwiched between the coloring film CF(j) and the display element 550($i,j$). Thus, unevenness due to the thickness of the coloring film CF(j) can be reduced.

«Light-Blocking Film BM»

The light-blocking film BM includes an opening portion in a region overlapping with the pixel 702($i,j$). For example, a material of a dark color can be used for the light-blocking film BM. Thus, the display contrast can be increased.

«Structure Body KB»

A structure body KB includes a region sandwiched between the functional layer 520 and the base material 770. The structure body KB has a function of providing a predetermined space between the functional layer 520 and the base material 770.

«Functional Film 770P and the Like»

The functional film 770P includes a region overlapping with the display element 550($i,j$).

An anti-reflection film, a polarizing film, a retardation film, a light diffusion film, a condensing film, or the like can be used as the functional film 770P, for example.

For example, an anti-reflection film with a thickness less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film that self-heals from generated scratches, or the like can be used as the functional film 770P.

<Structure Example 4 of Display Panel 700>

The display panel 700 includes an insulating film 528 and an insulating film 573 (see FIG. 17A).

«Insulating Film 528»

The insulating film 528 includes a region sandwiched between the functional layer 520 and the base material 770, and the insulating film 528 includes an opening portion in a region overlapping with the display element 550($i,j$) (see FIG. 17A).

The material that can be used for the insulating film 521, for example, can be used for the insulating film 528. Specifically, a silicon oxide film, a film containing an acrylic resin, a film containing polyimide, or the like can be used as the insulating film 528.

«Insulating Film 573»

The insulating film 573 includes a region; between the region and the functional layer 520, the display element 550($i,j$) is sandwiched (see FIG. 17A).

For example, a single film or a stacked film in which a plurality of films are stacked can be used as the insulating film 573. Specifically, a stacked film in which an insulating film 573A formed by a method that hardly damages the display element 550($i,j$) and a dense insulating film 573B with a few defects are stacked can be used as the insulating film 573. Thus, diffusion of impurities into the display element 550($i,j$) can be inhibited. The reliability of the display element 550($i,j$) can be increased.

«Structure Example of Display Element 550($i,j$)»

An element controlling light emission can be used as the display element 550($i,j$). A light-emitting element can be used as the display element 550($i,j$), for example.

Specifically, an organic electroluminescence element, an inorganic electroluminescence element, a light-emitting diode, a QDLED (Quantum Dot LED), or the like can be used as the display element 550($i,j$) (see FIG. 17A).

For example, a layer 553($j$) containing a light-emitting material can be used for the display element 550($i,j$).

«Structure Example 1 of Layer 553($j$) Containing Light-Emitting Material»

A belt-like layered material that is long in the column direction along the signal line S2($j$) can be used for the layer 553($j$) containing a light-emitting material, for example.

Specifically, it is possible to use a belt-like layered material that is adjacent to the layer 553($j$) containing a light-emitting material and contains a material emitting light of a different hue from that from the adjacent material. Thus, for example, the hue of the light emitted from the display element 550($i,j$) can be different between columns.

For example, a material emitting blue light, a material emitting green light, or a material emitting red light can be used in the layer 553($j$) containing a light-emitting material.

«Structure Example 2 of Layer 553(j) Containing Light-Emitting Material»

A layered material stacked to emit white light can be used for the layer 553(j) containing a light-emitting material, for example.

Specifically, a plurality of materials emitting light with different hues can be used for the layer 553(j) containing a light-emitting material.

For example, a layered material in which a layer containing a light-emitting material including a fluorescent material that emits blue light and a layer containing materials that are other than fluorescent materials and that emit green light and red light are stacked can be used for the layer 553(j) containing a light-emitting material. Alternatively, a layered material in which a layer containing a light-emitting material including a fluorescent material that emits blue light, and a layer containing a material that is other than a fluorescent material and that emits yellow light are stacked can be used for the layer 553(j) containing a light-emitting material.

Note that the layer 553(j) containing a light-emitting material can be used with the coloring film CF(j) overlapping, for example. Thus, light of a predetermined hue can be extracted from white light. Alternatively, pixels displaying different hues can be arranged without separate formation of the layer 553(j) containing a light-emitting material.

«Structure Example 3 of Layer 553(j) Containing Light-Emitting Material»

A layered material stacked to emit blue light or ultraviolet rays can be used for the layer 553(j) containing a light-emitting material, for example.

Furthermore, the layer 553(j) containing a light-emitting material can be used with a layer that converts blue light or an ultraviolet ray into light with a different hue, which overlap therewith, for example. Thus, for example, blue light can be converted into the light of a predetermined hue. Alternatively, pixels displaying different hues can be arranged without separate formation of the layer 553(j) containing a light-emitting material.

«Structure Example 4 of Layer 553(j) Containing Light-Emitting Material»

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) containing a light-emitting material, for example. The intermediate layer includes a region sandwiched between two light-emitting units. The intermediate layer includes a charge-generation region, and the intermediate layer has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

Accordingly, the current efficiency of light emission can be increased. Alternatively, the density of current flowing through the light-emitting element at the same luminance can be reduced. Alternatively, the reliability of the light-emitting element can be increased.

For example, a light-emitting unit containing a material emitting light with one hue and a light-emitting unit containing a material emitting light with a different hue can be stacked and used for the layer 553(j) containing a light-emitting material. Alternatively, a light-emitting unit containing a material emitting light with one hue and a light-emitting unit containing a material emitting light with the same hue can be stacked and used for the layer 553(j) containing a light-emitting material. Specifically, two light-emitting units each containing a material emitting blue light can be stacked and used.

For the layer 553(j) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

«Electrode 551(i,j) and Electrode 552»

For example, the material that can be used for the wiring or the like can be used for the electrode 551(i,j) or the electrode 552. Specifically, a material that has a visible-light-transmitting property can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i,j) or the electrode 552. The distance between the electrode 551(i,j) and the electrode 552 is adjusted using the layer 553(j) containing a light-emitting material, for example.

Thus, a microcavity structure can be provided in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that efficiently reflects light can be used for the electrode 551(i,j) or the electrode 552. Specifically, a material containing silver, palladium, and the like or a material containing silver, copper, and the like can be used for the electrode 551(i,j) or the electrode 552.

The electrode 551(i,j) is electrically connected to the pixel circuit 530(i,j) in the opening portion 591A (see FIG. 17A). The electrode 551(i,j) overlaps with the opening portion formed in the insulating film 528, and the insulating film 528 is at the periphery of the electrode 551(i,j), for example.

Thus, a short circuit between the electrode 551(i,j) and the electrode 552 can be prevented.

«Structure Example 2 of Display Region 231»

The display region 231 includes a plurality of pixels. For example, a plurality of pixels having a function of displaying colors with different hues can be used for the display region 231.

This enables additive mixture or subtractive mixture of colors displayed by the plurality of pixels. Alternatively, it is possible to display a color of a hue that an individual pixel cannot display.

Note that in the case where a plurality of pixels capable of displaying colors with different hues are used for color mixture, each of the pixels can be rephrased as a subpixel. In addition, a set of subpixels can be rephrased as a pixel.

Figure 15C:
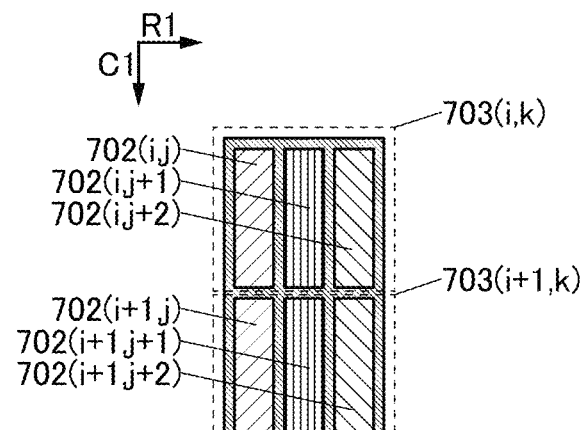

For example, the pixel 702(i,j) can be rephrased as a subpixel, and a set of the pixel 702(i,j), a pixel 702(i,j+1), and a pixel 702(i,j+2) can be rephrased as a pixel 703(i,k) (see FIG. 15C).

Figure 15D:
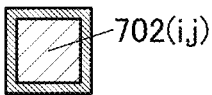
Figure 15E:
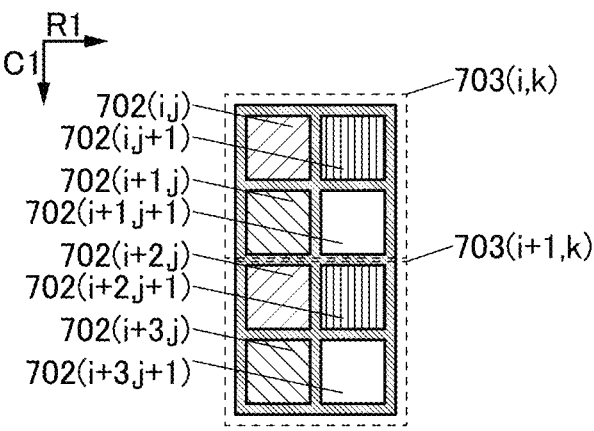

Alternatively, the pixel 702(i,j) can be rephrased as a subpixel, and a set of the pixel 702(i,j), a pixel 702(i,j+1), a pixel 702(i+1,j), and a pixel 702(i+1,j+1) can be rephrased as a pixel 703(i,k) (see FIG. 15D and FIG. 15E).

Specifically, a set of a subpixel displaying blue, a subpixel displaying green, and a subpixel displaying red can be used as the pixel 703(i,k). Alternatively, a set of a subpixel displaying cyan, a subpixel displaying magenta, and a subpixel displaying yellow can be used as the pixel 703(i,k).

Furthermore, the above set to which a subpixel displaying white or the like is added can be used as the pixel, for example.

«Structure Example 3 of Display Region 231»

The display region 231 includes the pixel 702(i,j), the pixel 702(i,j+1), and the pixel 702(i,j+2) (see FIG. 15C).

The pixel 702(i,j) displays blue having a chromaticity x of greater than or equal to 0.120 and less than or equal to 0.170 and a chromaticity y of greater than or equal to 0.020 and less than 0.060 in the CIE1931 chromaticity coordinates.

The pixel 702(i,j+1) displays green having a chromaticity x of greater than or equal to 0.130 and less than or equal to 0.250 and a chromaticity y of greater than 0.710 and less than or equal to 0.810 in the CIE1931 chromaticity coordinates.

The pixel 702(i,j+2) displays red having a chromaticity x of greater than 0.680 and less than or equal to 0.720 and a chromaticity y of greater than or equal to 0.260 and less than or equal to 0.320 in the CIE1931 chromaticity coordinates.

The pixel 702(i,j), the pixel 702(i,j+1), and the pixel 702(i,j+2) are provided so that the area ratio of their color gamut to the BT.2020-2 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

Accordingly, display with an extremely wide color gamut satisfying a color gamut of Recommendation ITU-R BT.2020-2 standard, which is an international standard, can be performed. Alternatively, extremely high-resolution display can be performed.

Note that this embodiment can be combined with any of the other embodiments in this specification as appropriate.

Embodiment 4

In this embodiment, a structure of a display panel of one embodiment of the present invention will be described with reference to FIG. 19.

Figure 19:
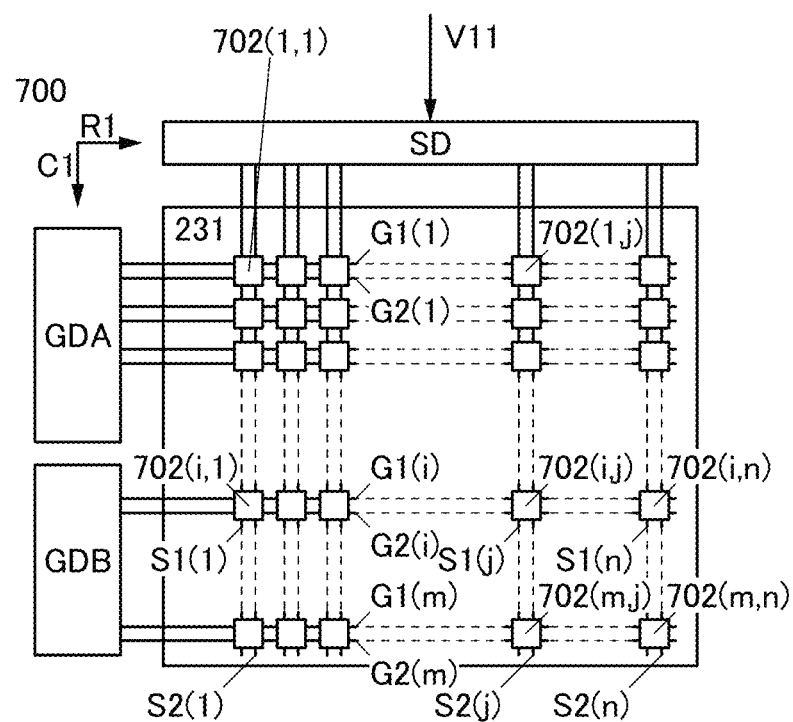
FIG. 19 is a block diagram illustrating a configuration of a display panel of one embodiment.

FIG. 19 is a block diagram illustrating the structure of the display panel of one embodiment of the present invention.

<Structure Example 1 of Display Panel 700>

The display panel 700 described in this embodiment includes the display region 231 (see FIG. 19).

«Structure Example 1 of Display Region 231»

The display region 231 includes a group of pixels 702(i,1) to 702(i,n), a different group of pixels 702(1,i) to 702(m,j), the scan line G1(i), and the signal line S1(j) (see FIG. 19). In addition, the scan line G2(i) and the signal line S2(j) are included. Note that i is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and the conductive film ANO.

The group of pixels 702(i,1) to 702(i,n) is arranged in a row direction (the direction indicated by an arrow R1 in the drawing) and includes the pixel 702(i,j).

The different group of pixels 702(1,j) to 702(m,j) is arranged in a column direction intersecting the row direction (the direction indicated by an arrow C1 in the drawing) and includes the pixel 702(i,j).

The scan line G1(i) is electrically connected to the group of pixels 702(i,1) to 702(i,n) arranged in the row direction.

The signal line S1(j) is electrically connected to the another group of pixels 702(1,j) to 702(m,j) arranged in the column direction.

Thus, image data can be supplied to a plurality of pixels. As a result, a novel display panel that is highly convenient, useful, or reliable can be provided.

«Structure Example 3 of Display Region 231»

The display region 231 includes a plurality of pixels in a matrix. For example, the display region 231 includes 7600 or more pixels in the row direction and the display region 231 includes 4300 or more pixels in the column direction. Specifically, 7680 pixels are provided in the row direction and 4320 pixels are provided in the column direction.

Thus, a high-resolution image can be displayed. As a result, a novel display panel that is highly convenient, useful, or reliable can be provided.

<Structure Example 2 of Display Panel>

The display panel 700 described in this embodiment includes one or more driver circuits. For example, a driver circuit GD and a driver circuit SD can be included (see FIG. 19).

«Driver Circuit GDA and Driver Circuit GDB»

A driver circuit GDA and a driver circuit GDB can be used as the driver circuit GD. For example, the driver circuit GDA and the driver circuit GDB each have a function of supplying a selection signal on the basis of control data.

Specifically, the driver circuit GDA and the driver circuit GDB each have a function of supplying a selection signal to one scan line at a frequency of 30 Hz or higher, preferably 60 Hz or higher, on the basis of the control data. Accordingly, a moving image can be smoothly displayed.

Alternatively, the driver circuit GDA and the driver circuit GDB each have a function of supplying a selection signal to one scan line at a frequency lower than 30 Hz, preferably lower than 1 Hz, further preferably less than once a minute, on the basis of the control data. Accordingly, a still image in which flickering is reduced can be displayed.

In the case where a plurality of driver circuits are included, for example, the frequency at which the driver circuit GDA supplies a selection signal and the frequency at which the driver circuit GDB supplies a selection signal can be made different from each other. Specifically, a selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

A bottom-gate transistor or a top-gate transistor can be used in the driver circuit GD, for example. Specifically, a transistor MD can be used in the driver circuit GD (see FIG. 18).

Note that the semiconductor film used for the transistor of the driver circuit GD can be formed, for example, in a step of forming the semiconductor film used for the transistor of the pixel circuit 530(*i,j*).

«Driver Circuit SD»

The driver circuit SD has a function of generating an image signal on the basis of data V11 and a function of supplying the image signal to a pixel circuit electrically connected to one display element (see FIG. 19).

A variety of sequential circuits such as a shift register can be used as the driver circuit SD, for example.

For example, an integrated circuit formed on a silicon substrate can be used as the driver circuit SD.

The integrated circuit can be connected to a terminal by a COG (Chip on glass) method or a COF (Chip on Film) method, for example. Specifically, an anisotropic conductive film can be used to connect the integrated circuit to a terminal.

Note that this embodiment can be combined with any of the other embodiments in this specification as appropriate.

Embodiment 5

In this embodiment, a configuration of a display device of one embodiment of the present invention will be described with reference to FIG. 20.

FIG. 20 illustrates the configuration of the display device of one embodiment of the present invention. FIG. 20A is a block diagram of the display device of one embodiment of the present invention, and FIG. 20B to FIG. 20D are projection views each illustrating the appearance of the display device of one embodiment of the present invention.

<Structure Example of Display Device>

The display device described in this embodiment includes the display panel 700 and a control portion 238 (see FIG. 20A).

«Structure Example 1 of Control Portion 238»

The control portion 238 is supplied with image information VI and control information CI. For example, a clock signal, a timing signal, or the like can be used as the control information CI.

The control portion 238 generates information V11 on the basis of the image information VI and generates a control signal SP on the basis of the control information CI. Furthermore, the control portion 238 supplies the information V11 and the control signal SP.

The information V11 includes a grayscale of 8 bits or more, preferably 12 bits or more, for example. In addition, a clock signal, a start pulse, or the like of a shift register used for a driver circuit can be used as the control signal SP, for example.

«Structure Example 2 of Control Portion 238»

For example, a decompression circuit 234 and an image processing circuit 235 can be used in the control portion 238.

«Decompression Circuit 234»

The decompression circuit 234 has a function of decompressing the image information VI supplied in a compressed state. The decompression circuit 234 includes a memory portion. The memory portion has a function of storing decompressed image information, for example.

«Image Processing Circuit 235»

The image processing circuit 235 includes a memory region, for example. The memory region has a function of storing information included in the image information VI, for example.

The image processing circuit 235 has a function of generating the information V11 by correcting the image information VI on the basis of a predetermined characteristic curve and a function of supplying the information V11, for example.

«Structure Example 1 of Display Panel»

The display panel 700 is supplied with the information V11 and the control signal SP. For example, a driver circuit can be used in the display panel 700. Specifically, the display panel 700 described in Embodiment 3 or Embodiment 4 can be used.

«Driver Circuit»

The driver circuit operates on the basis of the control signal SP. Using the control signal SP enables a synchronized operation of a plurality of driver circuits.

For example, a driver circuit GDA(1), a driver circuit GDA(2), a driver circuit GDB(1), and a driver circuit GDB(2) can be used in the display panel. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and the driver circuit SDC(1) can be used in the display panel. The driver circuit SDA(1), the driver circuit SDA(2), the driver circuit SDB(1), the driver circuit SDB(2), the driver circuit SDC(1), and the driver circuit SDC(1) are supplied with the control signal SP and the data V11 and capable of supplying an image signal.

«Structure Example of Pixel 702(*i,j*)»

The pixel 702(*i,j*) performs display on the basis of the information V11.

Thus, the image information can be displayed using the display element. As a result, a novel display device that is highly convenient, useful, or reliable can be provided. Alternatively, for example, a television receiver system (see FIG. 20B), a video monitor (see FIG. 20C), a notebook computer (see FIG. 20D), or the like can be provided.

«Structure Example 2 of Display Panel»

For example, a control circuit 233 can be used for the display panel 700. Specifically, the control circuit 233 formed over a rigid substrate can be used for the display panel 700. The control circuit 233 formed over the rigid substrate can be electrically connected to the control portion 238 with the use of a flexible printed circuit.

«Control Circuit 233»

The control circuit 233 has a function of generating and supplying the control signal SP. For example, a clock signal, a timing signal, or the like can be used as the control signal SP. Specifically, a timing controller can be used as the control circuit 233.

Note that this embodiment can be combined with any of the other embodiments in this specification as appropriate.

Embodiment 6

In this embodiment, a configuration of an input/output device of one embodiment of the present invention will be described with reference to FIG. 21.

Figure 21:
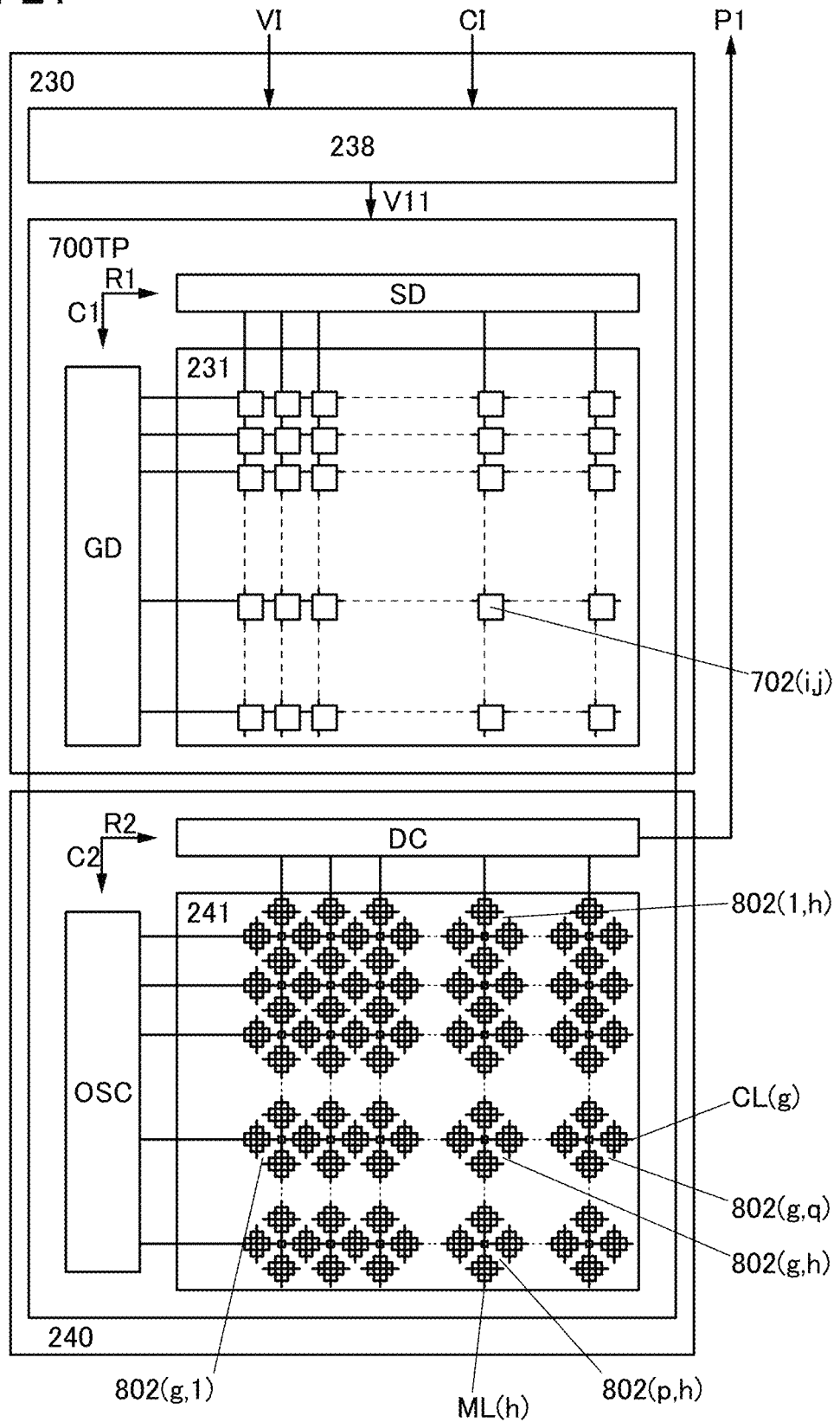
FIG. 21 is a block diagram illustrating a structure of an input/output device of one embodiment.

FIG. 21 is a block diagram showing the configuration of the input/output device of one embodiment of the present invention.

<Structure Example 1 of Input/Output Device>

The input/output device described in this embodiment includes an input portion 240 and a display portion 230 (see FIG. 21).

«Display Portion 230»

The display portion 230 includes a display panel. For example, the display panel 700 described in Embodiment 3 or Embodiment 4 can be used for the display portion 230. Note that a structure including the input portion 240 and the display portion 230 can be referred to as an input/output panel 700TP.

«Structure Example 1 of Input Portion 240»

The input portion 240 includes a sensing region 241. The input portion 240 has a function of sensing an object approaching the sensing region 241.

The sensing region 241 includes a region overlapping with the pixel 702(i,j).

Accordingly, an object approaching a region overlapping with the display portion can be sensed while image information is displayed using the display portion. Alternatively, a finger or the like that approaches the display portion can be used as a pointer to input position information. Alternatively, position information can be associated with image information displayed on the display portion. As a result, a novel input/output device that is highly convenient, useful, or reliable can be provided.

«Structure Example 1 of Sensing Region 241»

The sensing region 241 includes one or a plurality of sensors, for example.

The sensing region 241 includes a group of sensors 802(g,1) to 802(g,q) and a different group of sensors 802(1,h) to 802(p,h). Note that g is an integer greater than or equal to 1 and less than or equal to p, h is an integer greater than or equal to 1 and less than or equal to q, and p and q are each an integer greater than or equal to 1.

The group of sensors 802(g,1) to 802(g,q) includes a sensor 802(g,h) and is provided in a row direction (the direction indicated by an arrow R2 in the drawing). Note that the direction indicated by the arrow R2 may be the same as or different from the direction indicated by the arrow R1.

The different group of sensors 802(1,h) to 802(p,h) includes the sensor 802(g,h) and is provided in a column direction (the direction indicated by an arrow C2 in the drawing) that intersects the row direction.

«Sensor»

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Alternatively, different instructions can be associated with sensing information depending on the kind of a pointer that has been determined. Specifically, in the case where it is determined that a finger is used as a pointer, sensing information can be associated with a gesture. Alternatively, in the case where it is determined that a stylus pen is used as a pointer, sensing information can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

«Structure Example 2 of Input Portion 240»

The input portion 240 includes an oscillation circuit OSC and a sensing circuit DC (see FIG. 21).

The oscillation circuit OSC supplies a search signal to the sensor 802(g,h). For example, a rectangular wave, a sawtooth wave, a triangular wave, or a sine wave can be used as the search signal.

The sensor 802(g,h) generates and supplies a sensing signal that changes in accordance with the search signal and the distance to a pointer approaching the sensor 802(g, h).

The sensing circuit DC supplies input information in response to the sensing signal.

Accordingly, the distance from an approaching pointer to the sensing region 241 can be sensed. Alternatively, the position in the sensing region 241 where the pointer comes the closest can be sensed.

Note that this embodiment can be combined with any of the other embodiments in this specification as appropriate.

Embodiment 7

In this embodiment, a structure of a data processing device of one embodiment of the present invention will be described with reference to FIG. 22 to FIG. 24 and FIG. 29 to FIG. 41.

Figure 22A:
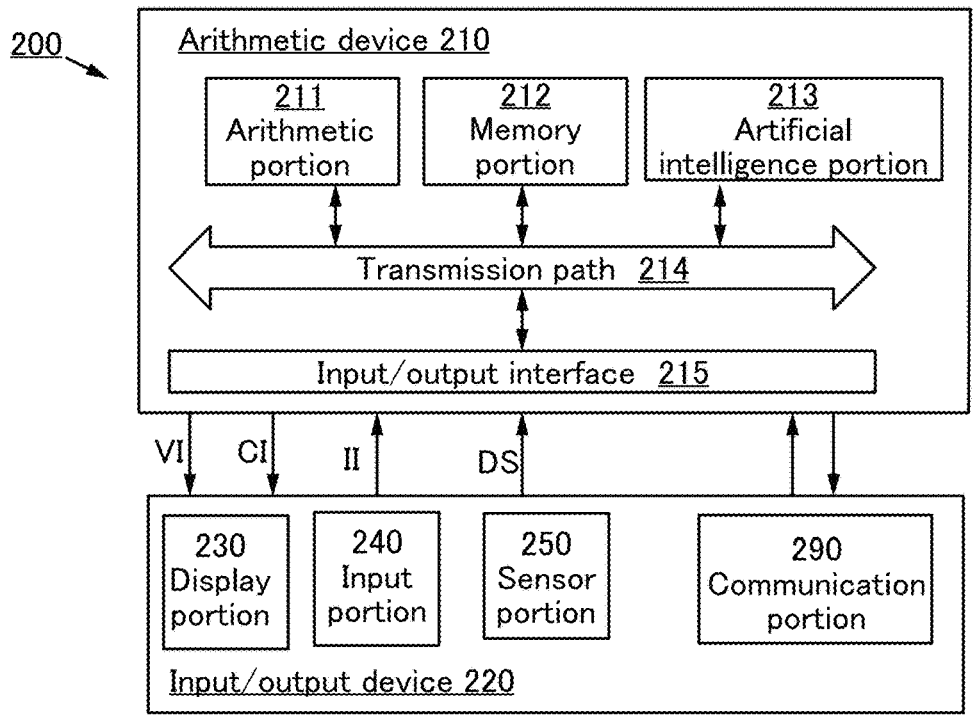
FIG. 22A to FIG. 22C are a block diagram and projection views illustrating a structure of a data processing device of one embodiment.
Figure 22B:
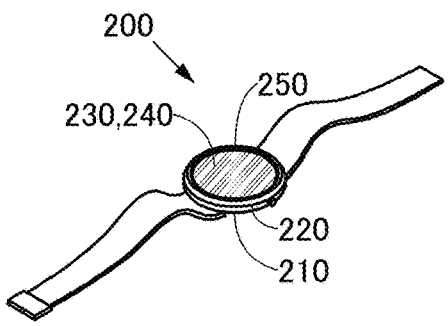
Figure 22C:
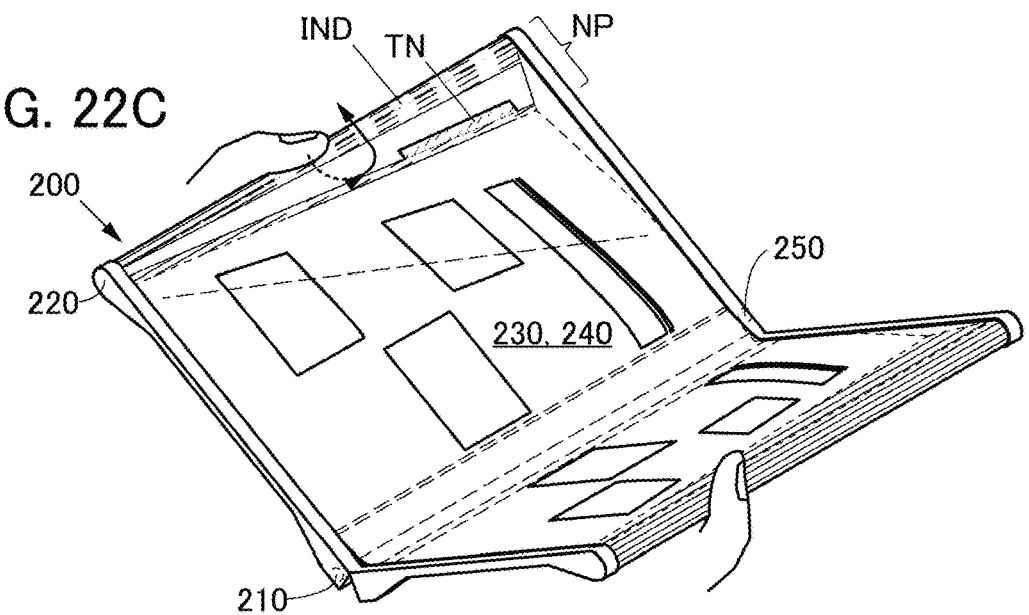

FIG. 22A is a block diagram illustrating a structure of a data processing device of one embodiment of the present invention. FIG. 22B and FIG. 22C are projection views illustrating examples of the appearance of the data processing device.

Figure 23A:
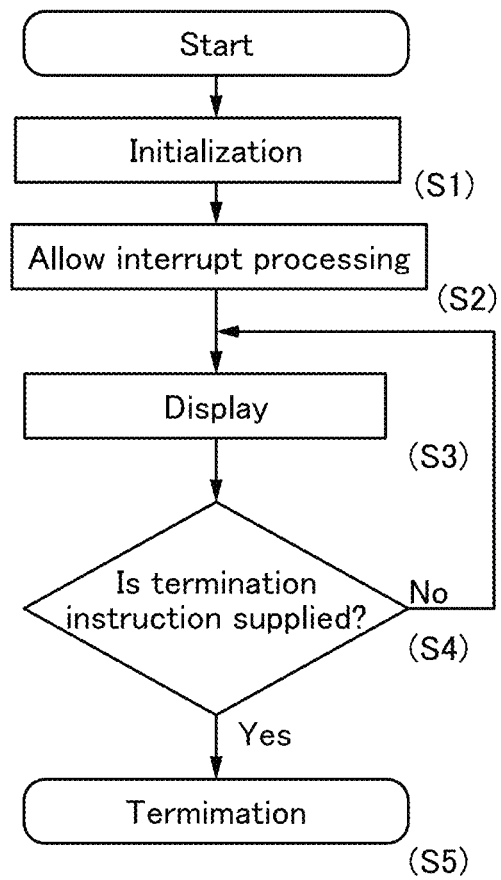
FIG. 23A and FIG. 23B are flow charts showing a driving method of a data processing device of one embodiment.
Figure 23B:
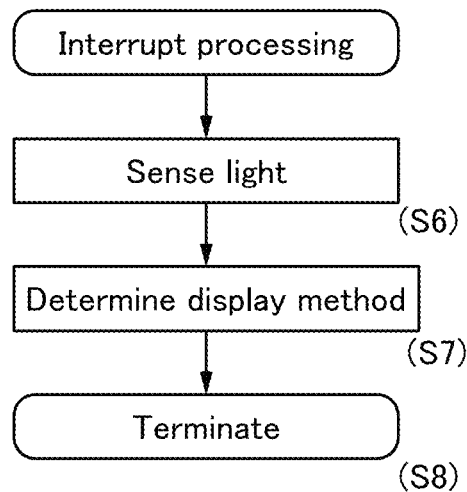

FIG. 23 shows flow charts describing a program of one embodiment of the present invention. FIG. 23A is a flow chart showing main processing of the program of one embodiment of the present invention, and FIG. 23B is a flow chart showing interrupt processing.

Figure 24A:
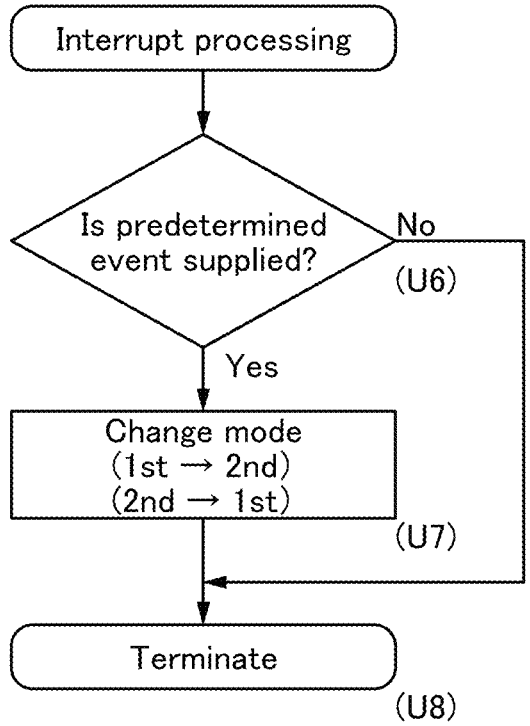
FIG. 24A to FIG. 24C are diagrams showing a driving method of a data processing device of one embodiment.
Figure 24B:
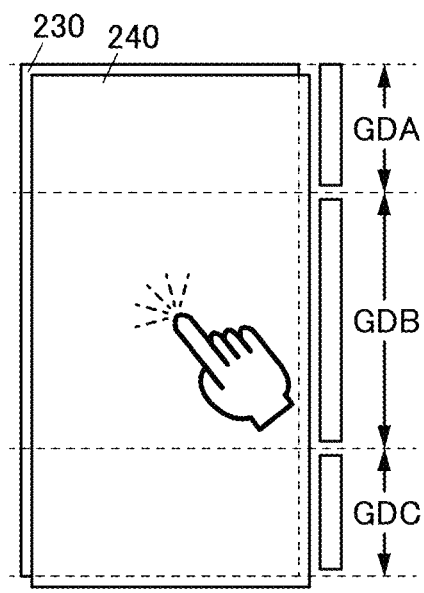
Figure 24C:
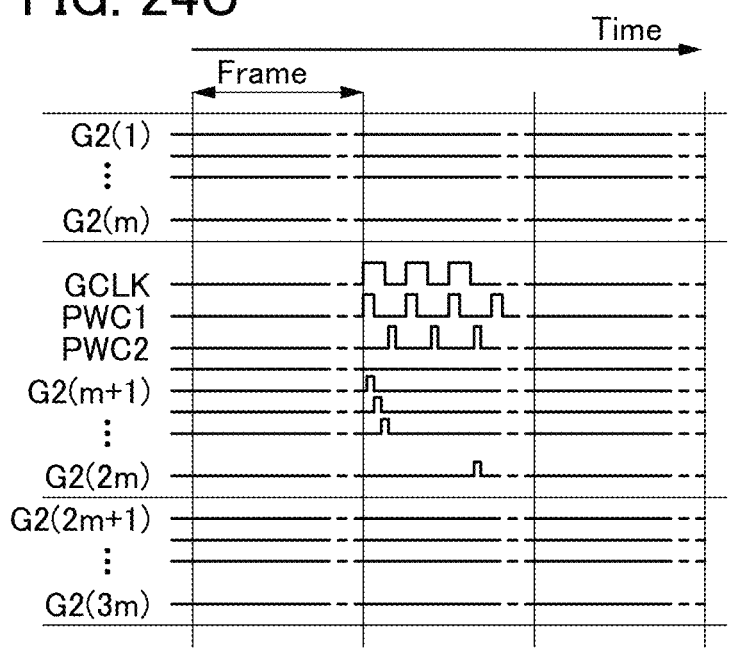

FIG. 24 shows a program of one embodiment of the present invention. FIG. 24A is a flow chart showing interrupt processing of the program of one embodiment of the present invention. FIG. 24B is a schematic view illustrating an operation of the data processing device, and FIG. 24C is a timing chart showing the operation of the data processing device of one embodiment of the present invention.

Figure 29A:
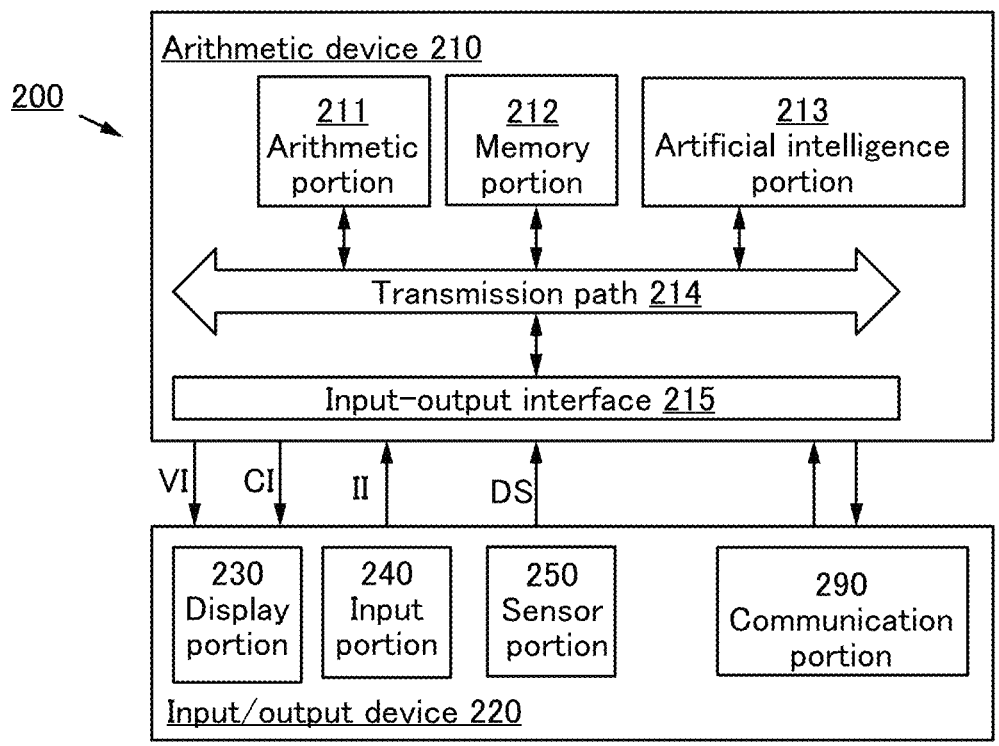
FIG. 29A to FIG. 29C are diagrams illustrating a structure of a display panel of one embodiment.
Figure 29B:
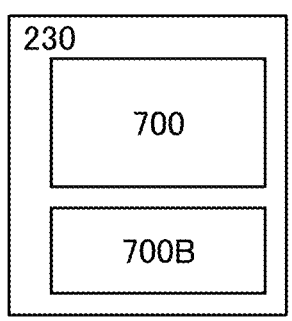
Figure 29C:
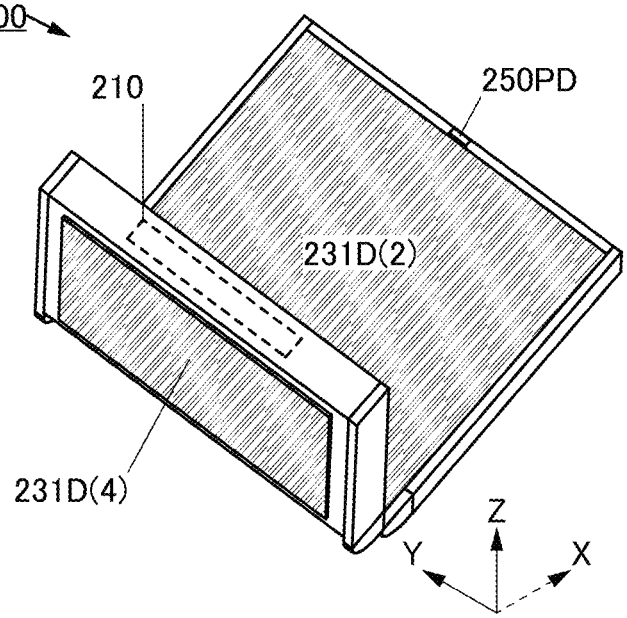

FIG. 29 illustrates a structure of a data processing device of one embodiment of the present invention. FIG. 29A is a block diagram illustrating the structure of the data processing device of one embodiment of the present invention, and FIG. 29B is a block diagram illustrating a structure of a display portion illustrated in FIG. 29A. FIG. 29C is a perspective view illustrating the appearance of the data processing device of one embodiment of the present invention.

FIG. 30 illustrates a structure of a data processing device of one embodiment of the present invention. FIG. 30A is a perspective view illustrating a state where a hinge of the data processing device of one embodiment of the present invention is opened, and FIG. 30B is a perspective view illustrating a state where a display panel of the data processing device illustrated in FIG. 30A is bent. FIG. 30C is a perspective view illustrating a state where the hinge of the data processing device illustrated in FIG. 30A is closed, and FIG. 30D is a perspective view illustrating the data processing device illustrated in FIG. 30C seen in another direction.

FIG. 31 illustrates a structure of a data processing device of one embodiment of the present invention. FIG. 31A is a perspective view illustrating a display portion and an input portion of the data processing device illustrated in FIG. 30A, and FIG. 31B is a cross-sectional view taken along a section plane XZ of the display portion and the input portion illustrated in FIG. 31A. FIG. 31C is a perspective view illustrating the display portion and the input portion of the display device in a bent state in FIG. 30B, and FIG. 31D is a perspective view illustrating the display portion and the input portion of the data processing device illustrated in FIG. 30C.

Figure 32A:
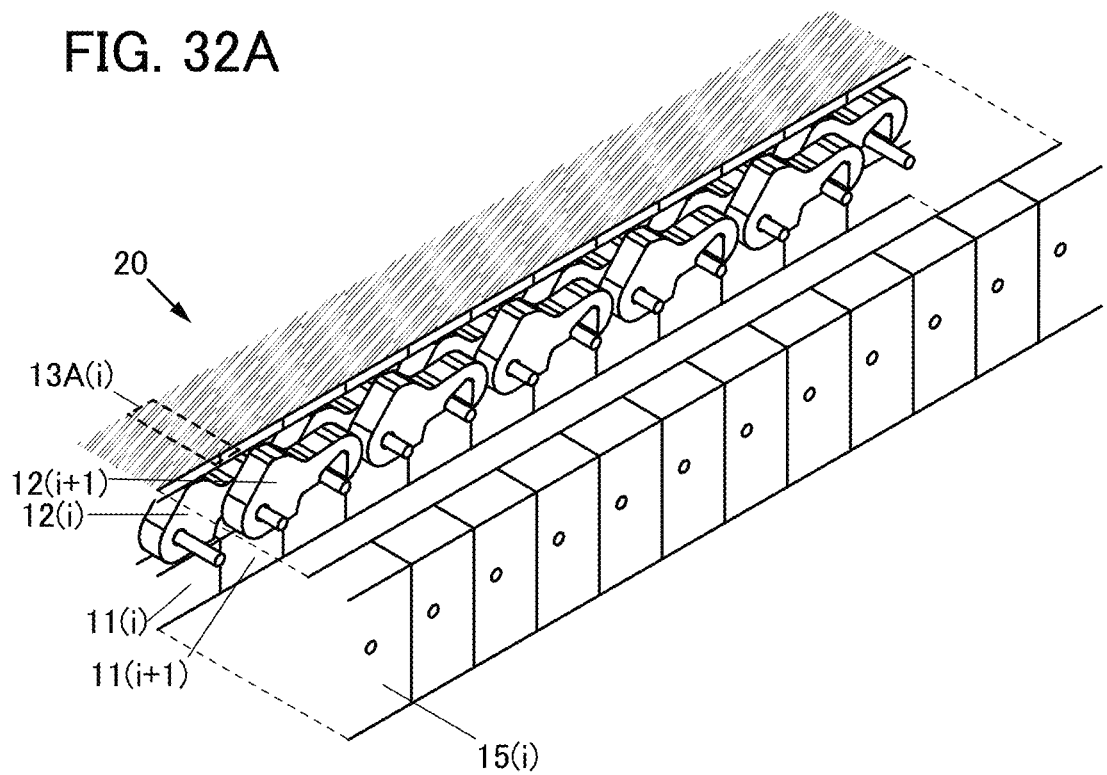
FIG. 32A to FIG. 32C are diagrams each illustrating a structure of a data processing device of one embodiment.
Figure 32B:
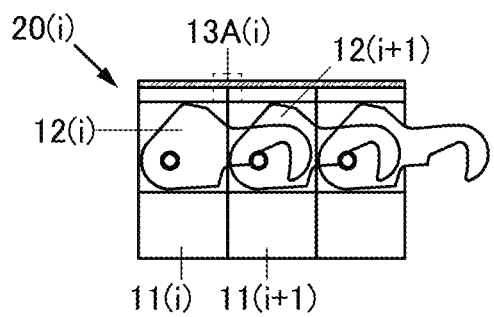
Figure 32C:
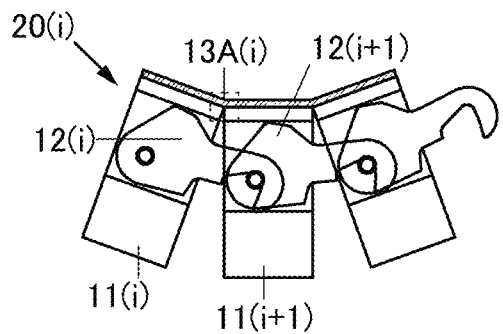

FIG. 32 illustrates a structure of a data processing device of one embodiment of the present invention. FIG. 32A is a perspective view illustrating a state of the hinge of the data processing device illustrated in FIG. 30A. FIG. 32B illustrates part of the hinge illustrated in FIG. 32A, and FIG. 32C illustrates a state where part of the hinge illustrated in FIG. 32B is bent.

Figure 33A:
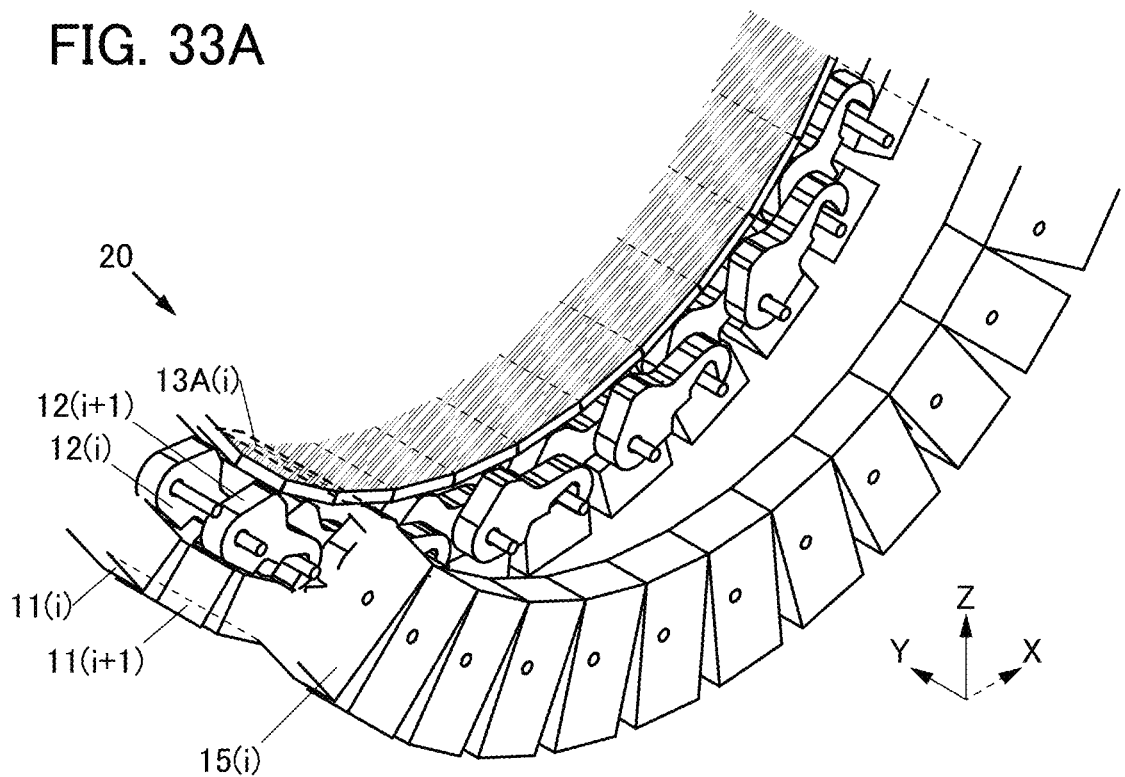
FIG. 33A and FIG. 33B are diagrams illustrating a structure of a data processing device of one embodiment.
Figure 33B:
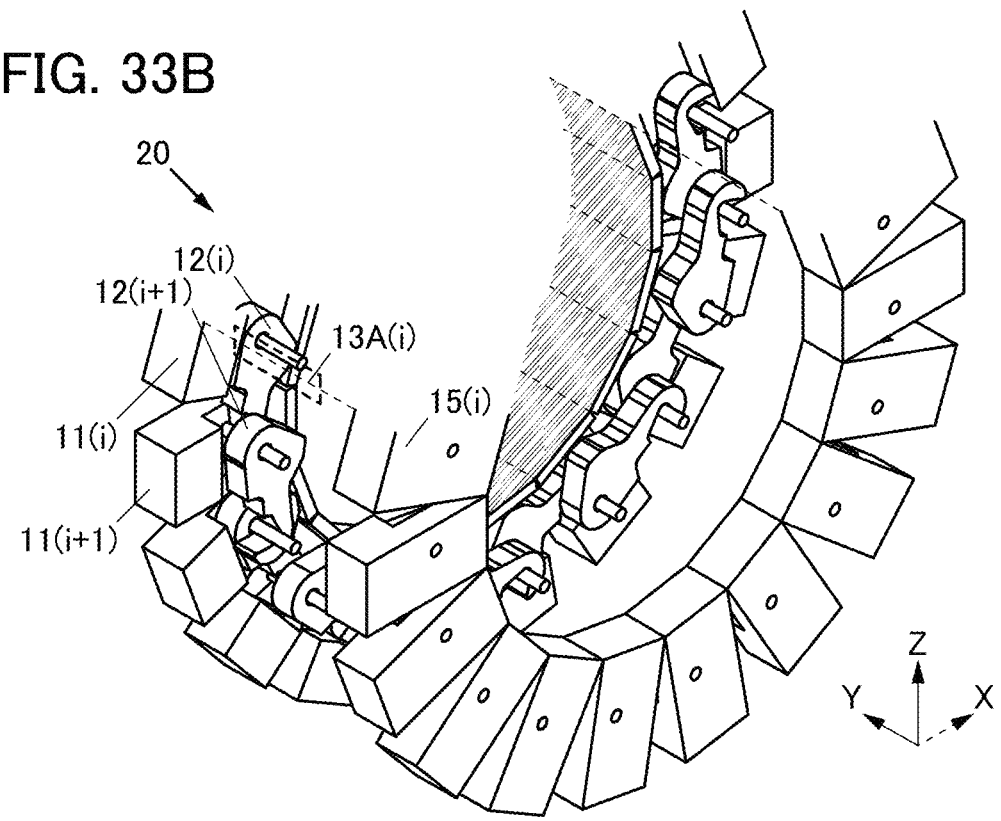

FIG. 33 illustrates a structure of a data processing device of one embodiment of the present invention. FIG. 33A is a perspective view illustrating a state of the hinge of the data processing device illustrated in FIG. 30B, and FIG. 33B is a perspective view illustrating a state of the hinge of the data processing device illustrated in FIG. 30C.

FIG. 34 illustrates a structure of a data processing device of one embodiment of the present invention. FIG. 34A is a perspective view illustrating a state where a hinge of the data processing device of one embodiment of the present invention is opened, and FIG. 34B is a perspective view illustrating a state where a display panel of the data processing device illustrated in FIG. 34A is bent. FIG. 34C is a perspective view illustrating a state where the hinge of the data processing device illustrated in FIG. 34A is closed, and FIG. 34D is a perspective view illustrating the data processing device illustrated in FIG. 34C seen in another direction.

FIG. 35 illustrates a structure of a data processing device of one embodiment of the present invention. FIG. 35A is a perspective view illustrating the display portion of the data processing device illustrated in FIG. 34C, and FIG. 35B is a cross-sectional view taken along a section plane XZ of the display portion illustrated in FIG. 35A. FIG. 35C is a schematic view illustrating a curved line drawn on the section plane XZ by the display portion illustrated in FIG. 35B. FIG. 35D illustrates the display portion in a state different from that of the display portion illustrated in FIG. 35C.

Figure 36A:
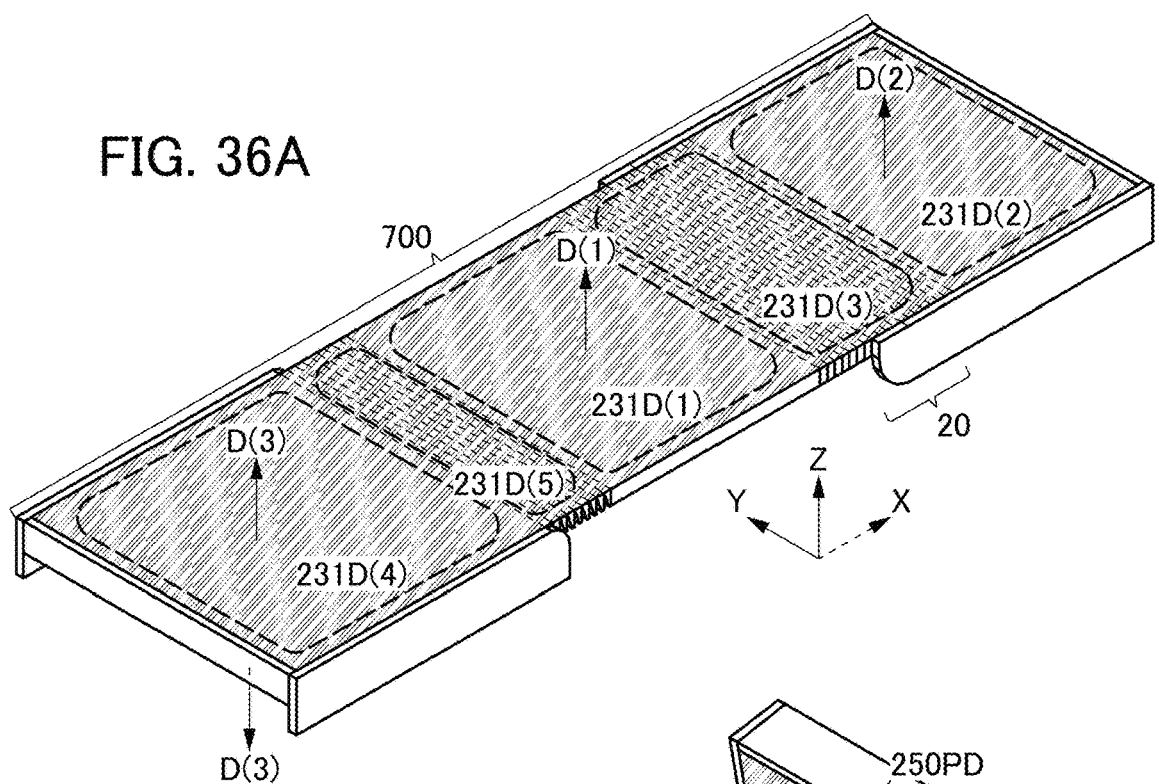
FIG. 36A and FIG. 36B are diagrams illustrating a structure of a data processing device of one embodiment.
Figure 36B:
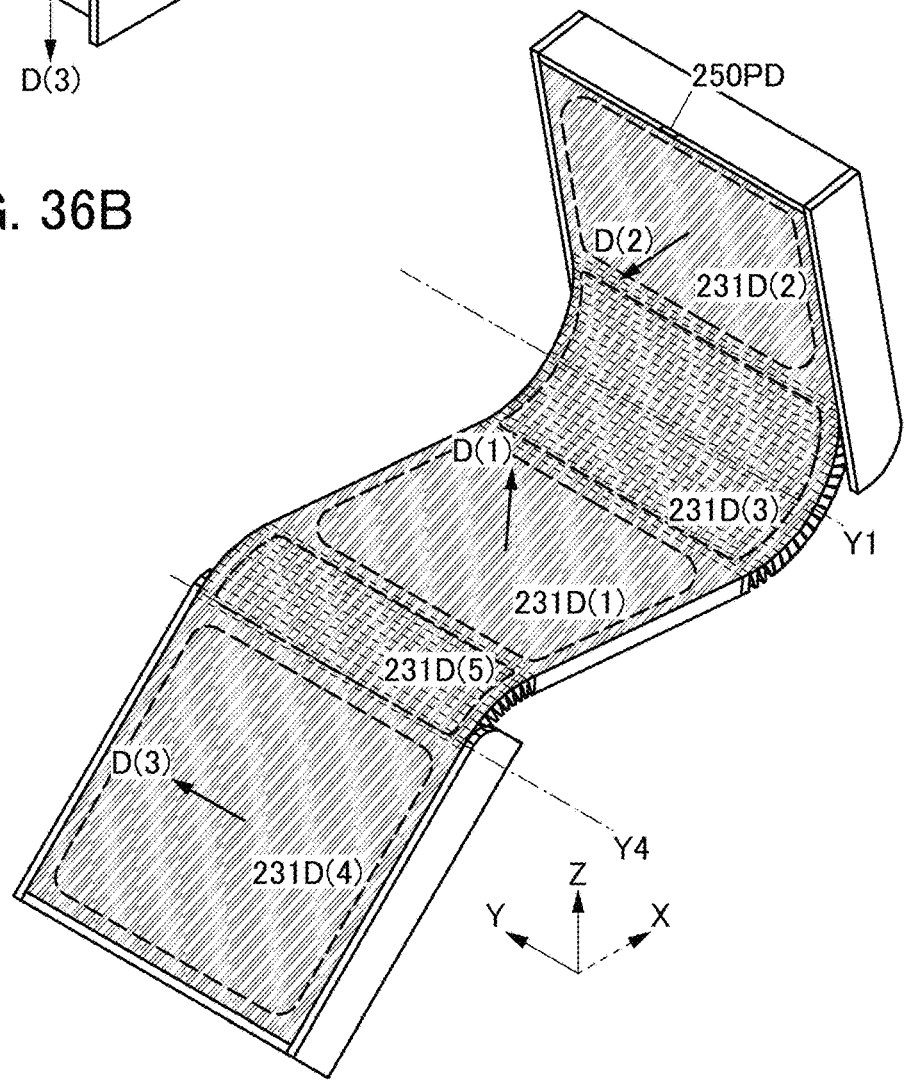

FIG. 36 illustrates a structure of a data processing device of one embodiment of the present invention. FIG. 36A is a perspective view illustrating a state where a hinge of the data processing device of one embodiment of the present invention is opened, and FIG. 36B is a perspective view illustrating a state where a display panel of the data processing device illustrated in FIG. 36A is bent.

Figure 37A:
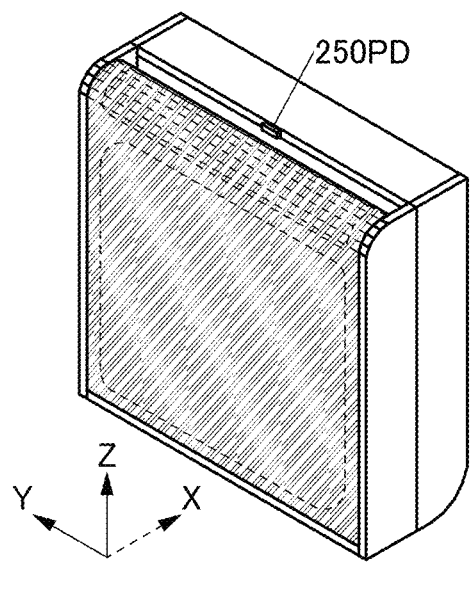
FIG. 37A and FIG. 37B are diagrams illustrating a structure of a data processing device of one embodiment.
Figure 37B:
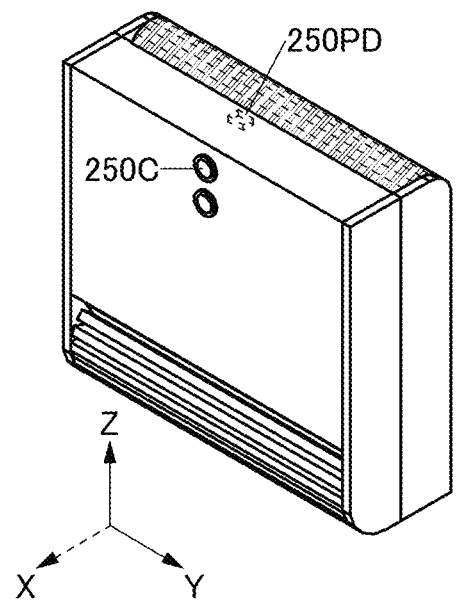

FIG. 37 illustrates a structure of a data processing device of one embodiment of the present invention. FIG. 37A is a perspective view illustrating a state where the hinge of the data processing device illustrated in FIG. 36A is closed, and FIG. 37B is a perspective view of the data processing device illustrated in FIG. 36A seen in another direction.

FIG. 38 illustrates a structure of a data processing device of one embodiment of the present invention. FIG. 38A is a perspective view illustrating the display portion of the data processing device illustrated in FIG. 37A, and FIG. 38B is a cross-sectional view taken along a section plane XZ of the display portion illustrated in FIG. 38A. FIG. 38C is a schematic view illustrating a curved line drawn on the section plane XZ by the display portion illustrated in FIG. 38B. FIG. 38D illustrates the display portion in a state different from that of the display portion illustrated in FIG. 38C.

Figure 39:
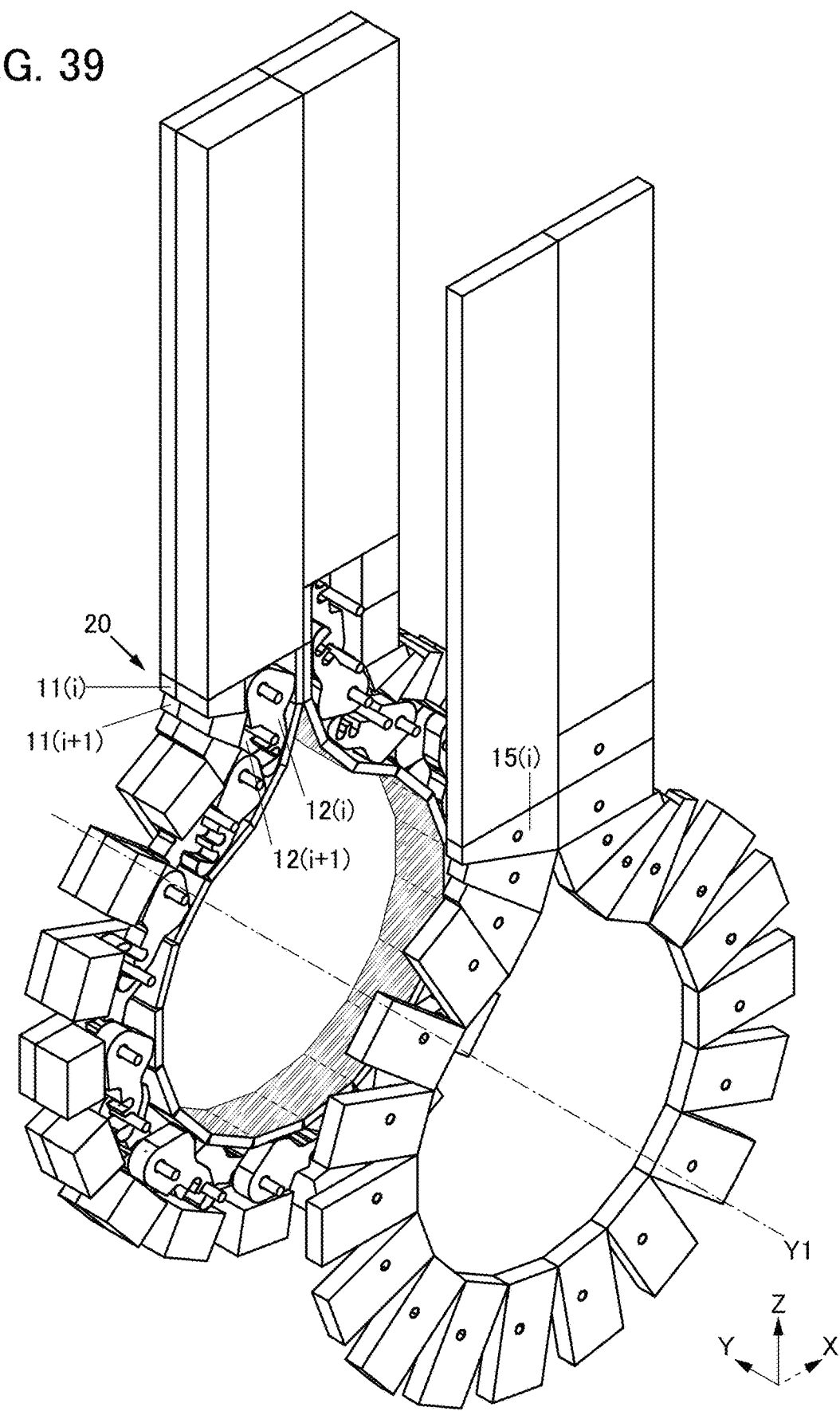
FIG. 39 is a diagram illustrating a structure of a data processing device of one embodiment.

FIG. 39 illustrates a structure of a data processing device of one embodiment of the present invention. FIG. 39 is a perspective view illustrating a state of the hinge of the data processing device illustrated in FIG. 35A.

Figure 40:
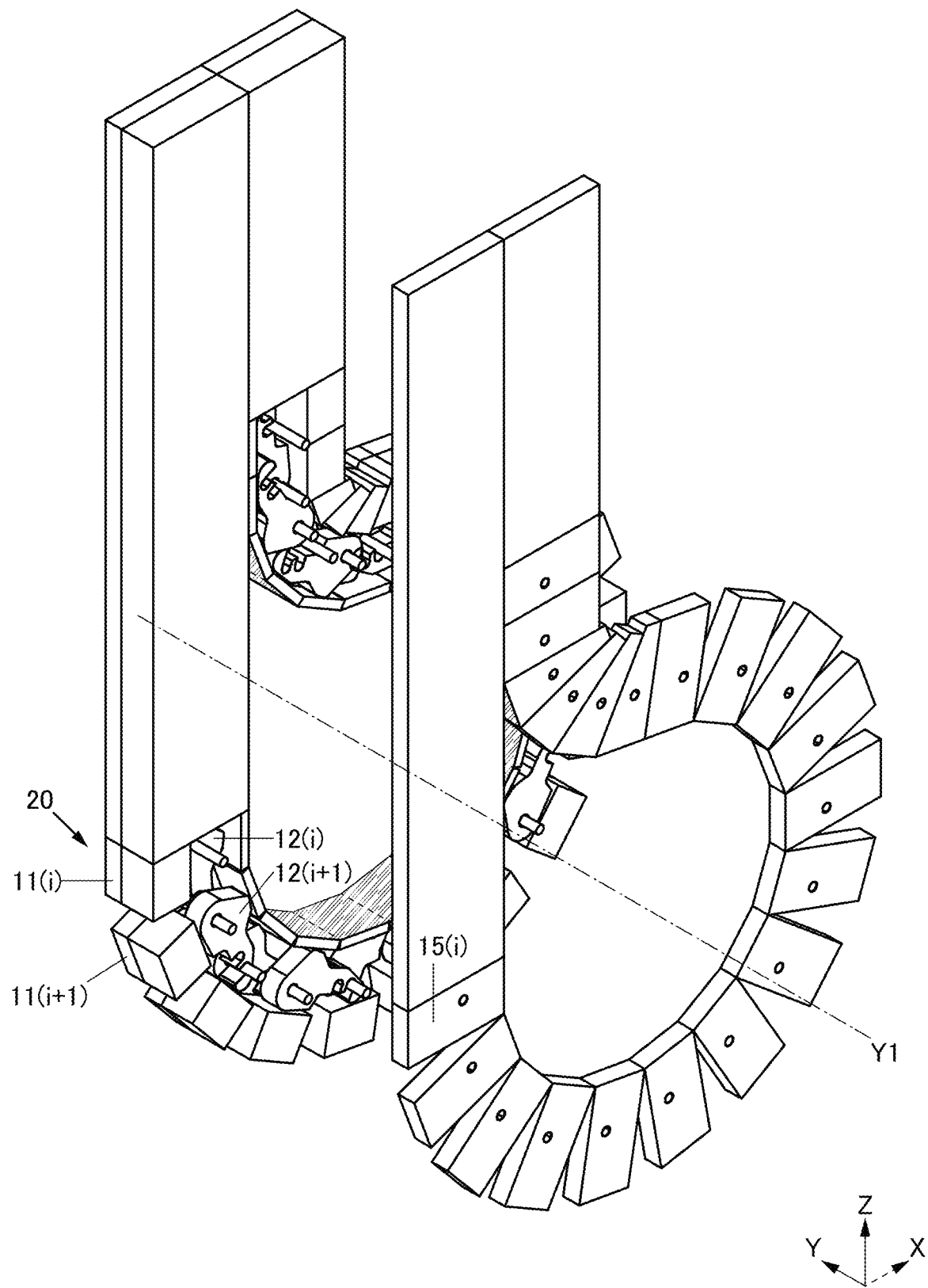
FIG. 40 is a diagram illustrating a structure of a data processing device of one embodiment.

FIG. 40 illustrates a structure of a data processing device of one embodiment of the present invention. FIG. 40 is a perspective view illustrating a state of the hinge of the data processing device illustrated in FIG. 38A.

Figure 41A:
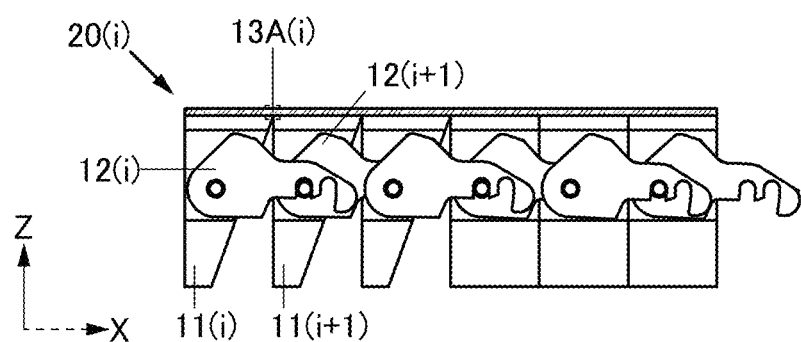
FIG. 41A and FIG. 41B are diagrams illustrating a structure of a data processing device of one embodiment.
Figure 41B:
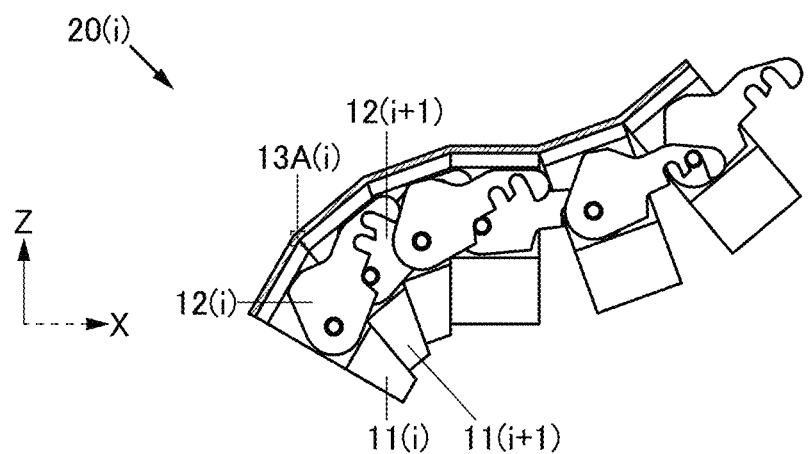

FIG. 41 illustrates a structure of a data processing device of one embodiment of the present invention. FIG. 41A illustrates a state where part of the hinge of the data processing device in FIG. 39 is extended. FIG. 41B illustrates a state where the part of the hinge in FIG. 39 is bent.

<Structure Example 1 of Data Processing Device>

The data processing device described in this embodiment includes an arithmetic device 210 and an input/output device 220 (see FIG. 22A). Note that the input/output device 220 is electrically connected to the arithmetic device 210. A data processing device 200 can also include a housing (see FIG. 22B and FIG. 22C).

«Structure Example 1 of Arithmetic Device 210»

The arithmetic device 210 is supplied with input information II or the sensing information DS. The arithmetic device 210 generates control information CI and image information VI on the basis of input information II or sensing information DS and supplies the control information CI and the image information VI.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

«Arithmetic Portion 211»

The arithmetic portion 211 has a function of executing a program, for example.

«Memory Portion 212»

The memory portion 212 has a function of storing, for example, the program executed by the arithmetic portion 211, initial information, setting information, an image, or the like.

Specifically, a hard disk, a flash memory, a memory using a transistor including an oxide semiconductor, or the like can be used.

«Input/Output Interface 215 and Transmission Path 214»

The input/output interface 215 includes a terminal or a wiring and has a function of supplying information and being supplied with information. The input/output interface 215 can be electrically connected to the transmission path 214, for example. The input/output interface 215 can also be electrically connected to the input/output device 220.

The transmission path 214 includes a wiring and has a function of supplying information and being supplied with information. The transmission path 214 can be electrically connected to the input/output interface 215, for example. The transmission path 214 can also be electrically connected to the arithmetic portion 211, the memory portion 212, or the input/output interface 215.

«Structure Example of Input/Output Device 220»

The input/output device 220 supplies the input information II and the sensing information DS. The input/output device 220 is supplied with the control information CI and the image information VI (see FIG. 22A).

As the input information II, for example, a scan code of a keyboard, position information, operation information of buttons, sound information, or image information can be used. As the sensing information DS, for example, illuminance information, attitude information, acceleration information, bearing information, pressure information, temperature information, humidity information, or the like of an environment where the information processing device 200 is used, or the like can be used.

As the control information CI, for example, a signal controlling the luminance for displaying the image information VI, a signal controlling the color saturation, or a signal controlling the hue can be used. Alternatively, a signal that changes display of part of the image data V1 can be used as the control data CI.

The input/output device 220 includes the display portion 230, the input portion 240, and a sensor portion 250. For example, the input/output device described in Embodiment 6 can be used as the input/output device 220. The input/output device 220 can include a communication portion 290.

«Structure Example of Display Portion 230»

The display portion 230 displays the image information VI on the basis of the control information CI.

The display portion 230 includes the control portion 238, the driver circuit GD, the driver circuit SD, and the display panel 700 (see FIG. 20). For example, the display device described in Embodiment 5 can be used for the display portion 230.

«Structure Example of Input Portion 240»

The input portion 240 generates the input information II. For example, the input portion 240 has a function of supplying position information P1.

For example, a human interface or the like can be used as the input portion 240 (see FIG. 22A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes information on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image information by using a gesture of moving a finger in contact with the touch panel along the touch panel.

The user can supply a "dragging instruction" for pulling out and displaying a navigation panel NP at an edge portion of the display region 231 by using a gesture of moving a finger in contact with the edge portion of the display region 231 (see FIG. 22C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. Alternatively, the instruction can be supplied by using the finger pressing pressure. Consequently, the user can turn the pages of an e-book reader like flipping through the pages of a paper book. Alternatively, the user can search a certain page with the aid of the thumbnail images TN or the index images IND.

«Structure Example of Sensor Portion 250»

The sensor portion 250 generates the sensing information DS. The sensor portion 250 has a function of sensing the illuminance of the environment where the data processing device 200 is used and a function of supplying illuminance information, for example.

The sensor portion 250 has a function of sensing the ambient conditions and supplying the sensing information. Specifically, illuminance information, attitude information, acceleration information, bearing information, pressure information, temperature information, humidity information, or the like can be supplied.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensor portion 250.

«Communication Portion 290»

The communication portion 290 has a function of supplying information to a network and obtaining information from the network.

«Housing»

Note that the housing has a function of storing the input/output device 220 or the arithmetic device 210. Alternatively, the housing has a function of supporting the display portion 230 or the arithmetic device 210.

Thus, the control information can be generated on the basis of the input information or the sensing information. Alternatively, the image information can be displayed on the basis of the input information or the sensing information. Alternatively, the data processing device can determine the intensity of light received by the housing of the data processing device and operate under the environment where the data processing device is used. Alternatively, a user of the data processing device can select a display method. As a result, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a display panel is an input portion as well as a display portion.

«Structure Example 2 of Arithmetic Device 210»

The arithmetic device 210 includes an artificial intelligence portion 213 (see FIG. 22A).

The artificial intelligence portion 213 is supplied with the input information II or the sensing information DS, and the artificial intelligence portion 213 infers the control information CI on the basis of the input information II or the sensing information DS. Moreover, the artificial intelligence portion 213 supplies the control information CI.

In this manner, the control information CI for display that can be felt suitable can be generated. Alternatively, display that can be felt suitable is possible. Alternatively, the control information CI for display that can be felt comfortable can be generated. Alternatively, display that can be felt comfortable is possible. As a result, a novel data processing device that is highly convenient, useful, or reliable can be provided.

[Natural Language Processing on Input Data II]

Specifically, the artificial intelligence portion 213 can perform natural language processing on the input information II to extract one feature from the whole input information II. For example, the artificial intelligence portion 213 can infer emotion or the like put in the input information II, which can be a feature. The artificial intelligence portion 213 can infer the color, design, font, or the like empirically felt suitable for the feature. The artificial intelligence portion 213 can generate information specifying the color, design, or font of a letter or information specifying the color or design of the background, and the information can be used as the control information CI.

Specifically, the artificial intelligence portion 213 can perform natural language processing on the input information II to extract some words included in the input information II. For example, the artificial intelligence portion 213 can extract expressions including a grammatical error, a factual error, emotion, and the like. The artificial intelligence portion 213 can generate the control information CI for displaying extracted part in the color, design, font, or the like different from those of another part, and the information can be used as the control information CI.

[Image Processing on Input Data II]

Specifically, the artificial intelligence portion 213 can perform image processing on the input information II to extract one feature from the input information II. For example, the artificial intelligence portion 213 can infer the age where the input information II is shot, whether the input information is shot indoors or outdoors, whether the input information is shot in the daytime or at night, or the like, which can be a feature. The artificial intelligence portion 213 can infer the color tone empirically felt suitable for the feature and generate the control information CI for use of the color tone for display. Specifically, information specifying color (e.g., full color, monochrome, or sepia) used for expression of a gradation can be used as the control information CI.

Specifically, the artificial intelligence portion 213 can perform image processing on the input information II to extract some images included in the input information II. For example, the artificial intelligence portion 213 can generate the control information CI for displaying a boundary between extracted part of the image and another part. Specifically, the artificial intelligence portion 213 can generate the control information CI for displaying a rectangle surrounding the extracted part of the image.

[Inference Using Sensing Data DS]

Specifically, the artificial intelligence portion 213 can generate an inference RI using the sensing data DS. Alternatively, the artificial intelligence portion 213 can generate the control data CI on the basis of the inference RI so that the user of the data processing device 200 can feel comfortable.

Specifically, the artificial intelligence portion 213 can generate the control information CI for adjustment of display brightness on the basis of the ambient illuminance or the like so that the display brightness can be felt comfortable. Alternatively, the artificial intelligence portion 213 can generate the control information CI for adjustment of volume on the basis of the ambient noise or the like so that the volume can be felt comfortable.

As the control information CI, a clock signal, a timing signal, or the like that is supplied to the control portion 238 included in the display portion 230 can be used. Alternatively, a clock signal, a timing signal, or the like that is supplied to a control portion included in the input portion 240 can be used as the control data CI.

<Structure Example 2 of Data Processing Device>

Another structure of the data processing device of one embodiment of the present invention will be described with reference to FIG. 23A and FIG. 23B.

«Program»

A program of one embodiment of the present invention has the following steps (see FIG. 23A).

[First Step]

In a first step, setting is initialized (see (S1) in FIG. 23A).

For example, predetermined image information which is to be displayed on start-up, a predetermined mode of displaying the image information, and information for determining a predetermined display method for displaying the image information are acquired from the memory portion 212. Specifically, one still image information or another moving image information can be used as the predetermined image information. Furthermore, a first mode or a second mode can be used as the predetermined mode.

[Second Step]

In a second step, interrupt processing is allowed (see (S2) in FIG. 23A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image information is displayed by a predetermined mode or a predetermined display method selected in the first step or the interrupt processing (see (S3) in FIG. 23A). Note that the predetermined mode determines a mode of displaying the information, and the predetermined display method determines a method for displaying the image information. For example, the image information VI can be used as information to be displayed.

One method for displaying the image information VI can be associated with the first mode, for example. Alternatively, another method for displaying the image information VI can be associated with the second mode. Thus, a display method can be selected on the basis of the selected mode.

«First Mode»

Specifically, a method for supplying selection signals to a scan line at a frequency of 30 Hz or higher, preferably 60 Hz or higher, to perform display in response to the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

«Second Mode»

Specifically, a method for supplying selection signals to a scan line at a frequency lower than 30 Hz, preferably lower than 1 Hz, further preferably less than once a minute, to perform display in response to the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image information is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied (Yes), whereas the program proceeds to the third step when the termination instruction has not been supplied (No) (see (S4) in FIG. 23A).

For example, the termination instruction supplied in the interrupt processing may be used for the determination.

[Fifth Step]

In the fifth step, the program terminates (see (S5) in FIG. 23A).

«Interrupt Processing»

The interrupt processing includes a sixth step to an eighth step described below (see FIG. 23B).

[Sixth Step]

In the sixth step, the illuminance of the environment where the data processing device 200 is used is sensed using the sensor portion 250, for example (see (S6) in FIG. 23B). Note that the color temperature or chromaticity of ambient light may be sensed instead of the illuminance of the environment.

[Seventh Step]

In the seventh step, a display method is determined on the basis of the sensed illuminance information (see (S7) in FIG. 23B). For example, a display method is determined such that the display brightness is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see (S8) in FIG. 23B).

<Structure Example 3 of Data Processing Device>

Another structure of the data processing device of one embodiment of the present invention is described with reference to FIG. 24.

FIG. 24A is a flow chart showing a program of one embodiment of the present invention. FIG. 24A is a flow chart showing interrupt processing different from the interrupt processing shown in FIG. 23B.

Note that Structure example 3 of data processing device has a difference from the interrupt processing described with reference to FIG. 23B in that the interrupt processing includes a step of changing a mode on the basis of a supplied predetermined event. Different portions will be described in detail here, and refer to the above description for portions that can use similar structures.

«Interrupt Processing»

The interrupt processing includes a sixth step to an eighth step described below (see FIG. 24A).

[Sixth Step]

In the sixth step, the program proceeds to the seventh step when a predetermined event has been supplied (Yes), whereas the program proceeds to the eighth step when the predetermined event has not been supplied (No) (see (U6) in FIG. 24A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 24A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 24B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 24B and FIG. 24C). Specifically, the frequency of supply of the selection signal from the driver circuit GDB can be changed in accordance with a "tap" event suppling the signal to a touch panel with a finger or the like.

A signal GCLK is a clock signal controlling an operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2(2$m$) in response to the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 24A). Note that in a period in which the main processing is executed, the interrupt processing may be repeatedly executed.

«Predetermined Event»

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, the drag speed, and the like can be used to assign arguments to an instruction associated with a predetermined event.

For example, information sensed by the sensor portion 250 is compared with a predetermined threshold value, and the compared results can be used for the event.

Specifically, a pressure sensor or the like in contact with a button or the like that is provided so as to be pushed in a housing can be used for the sensor portion 250.

«Instruction Associated with Predetermined Event»

For example, the termination instruction can be associated with a predetermined event.

For example, "page-turning instruction" for switching display from one displayed image information to another image information can be associated with a predetermined event Note that an argument determining the page-turning speed or the like, which is used when the "page-turning instruction" is executed, can be supplied using the predetermined event.

For example, "scroll instruction" for moving the display position of displayed part of image information and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image information, or the like can be associated with a predetermined event. Note that an argument determining the brightness of a generated image can be associated with a predetermined event. An argument determining the brightness of a generated image may be determined on the basis of ambient brightness sensed by the sensor portion 250.

For example, an instruction for acquiring information distributed via a push service using the communication portion 290 or the like can be associated with a predetermined event.

Note that position information sensed by the sensor portion 250 may be used for the determination of the presence or absence of a qualification for acquiring information. Specifically, it may be determined that there is a qualification for acquiring information in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 22C). Alternatively, materials distributed in a conference room in, for example, a company can be received and used for a conference material.

<Structure Example 4 of Data Processing Device>

The data processing device 200 described in this embodiment includes the display portion 230 and the input portion 240 (see FIG. 29A).

«Structure Example of Display Portion»

The display portion includes a plane 231D(1), a plane 231D(2), a plane 231D(3), and a plane 231D(4) (see FIG. 30A and FIG. 30C).

The plane 231D(3) includes a region sandwiched between the plane 231D(1) and the plane 231D(2), and can be bent (see FIG. 30A and FIG. 30B). For example, a display panel including the hinge 20 can be used in the display portion (see FIG. 32A and FIG. 33). Specifically, the hinge 20(i) including the link 11(i), the link 11(i+1), the hook 12(i), the hook 12(i+1), and the joint 13A(i) can be used.

For example, a pair of materials selected so as to attract each other can be used for the link 11(i) and the link 11(i+1) (see FIG. 32B and FIG. 32C). Specifically, a magnet and a ferromagnet can be used. Alternatively, snap-fit joints or a hook-and-loop fastener can be used. Using any of the above materials enables easy separation of the link 11(i+1) in contact with the link 11(i) from the link 11(i). Alternatively, a state where the link 11(i) and the link 11(i+1) are in contact with each other can be stably maintained. Alternatively, a predetermined shape formed with the plane 231D(1), the plane 231D(2), and the plane 231D(3) can be stably maintained. For example, one continuous flat plane can be formed using the plane 231D(1), the plane 231D(2), and the plane 231D(3). Alternatively, one continuous curved plane can be formed using the plane 231D(1), the plane 231D(2), and the plane 231D(3). Alternatively, a plane without "slacking" or wrinkles can be formed using the plane 231D(1), the plane 231D(2), and the plane 231D(3).

The plane 231D(1) performs display toward a first direction D(1), and the plane 231D(2) performs display toward a second direction D(2).

The second direction D(2) faces the first direction D(1) when the plane 231D is bent (see FIG. 30B and FIG. 30C).

The plane 231D(4) performs display toward a third direction D(3), and the third direction D(3) is opposite to the second direction D(2) (see FIG. 30C). In other words, the plane 231D(4) and the plane 231D(3) are arranged back to back.

«Structure Example of Input Portion 240»

The input portion 240 includes a sensing region 241D(1), a sensing region 241D(2), a sensing region 241D(3), and a sensing region 241D(4) (see FIG. 31B). For example, a touch panel can be used in the input portion 240 and the display portion. Specifically, a capacitive touch panel or an optical touch panel can be used for the input portion 240. For example, a pointer approaching the sensing region 241D(1) to the sensing region 241D(4) may be captured using an optical touch panel or an image sensor, so that a gesture of a user is recognized. Alternatively, a program may be executed using the recognized gesture.

The sensing region 241D(1) has a function of sensing an object approaching the plane 231D(1), the sensing region 241D(2) has a function of sensing an object approaching the plane 231D(2), and the sensing region 241D(3) has a function of sensing an object approaching the plane 231D(3). Alternatively, the sensing region 241D(4) has a function of sensing an object approaching the plane 231D(4).

Thus, the plane 231D(3) can be bent so that the plane 231D(1) and the plane 231D(2) face each other. Alternatively, the display portion can be folded so that the plane 231D(1) and the plane 231D(2) face each other. Alternatively, when the display portion is folded so that the plane 231D(1) and the plane 231D(2) are on an inner side, display on the plane 231D(4) can be seen. Alternatively, an object approaching the plane 231D(1) to the plane 231D(4) can be sensed. Alternatively, a finger or the like that approaches the display portion can be used as a pointer to input position information. Alternatively, position information can be associated with image information displayed on the display portion. As a result, a novel data processing device that is highly convenient, useful, or reliable can be provided.

<Structure Example 5 of Data Processing Device>

The data processing device 200 described in this embodiment includes the sensor portion 250, the arithmetic device 210, and the display portion 230 (see FIG. 29A).

«Structure Example 1 of Sensor Portion 250»

The sensor portion 250 supplies a sensing signal on the basis of a bending level of the plane 231D(3). For example, the state of the plane 231D(3) can be sensed using an acceleration sensor or a pressure sensor.

«Structure Example 1 of Arithmetic Device 210»

The arithmetic device 210 controls display of the plane 231D(1), the plane 231D(2), and the plane 231D(3) on the basis of the sensing signal.

Thus, when the plane 231D(1) and the plane 231D(2) face each other, for example, display on the plane 231D(1) to the plane 231D(3) can be stopped. Alternatively, power consumption can be reduced. As a result, a novel data processing device that is highly convenient, useful, or reliable can be provided.

«Structure Example 2 of Sensor Portion 250»

The sensor portion 250 includes a photoelectric conversion element 250PD, and the photoelectric conversion element 250PD senses the amount of light coming from the second direction D(2). Note that the amount of light changes in accordance with approaching of the plane 231D(1) (see FIG. 30B and FIG. 30C).

Thus, for example, a state where the plane 231D(1) faces the plane 231D(2) can be sensed. Alternatively, in the state where the plane 231D(1) faces the plane 231D(2), the plane 231D(1) to the plane 231D(3) can be set in anon-display state. Alternatively, the plane 231D(4) can display an image. As a result, a novel data processing device that is highly convenient, useful, or reliable can be provided.

«Structure Example 3 of Sensor Portion 250»

The sensor portion 250 includes an image sensor (see FIG. 30D). For example, an image sensor can be used as a camera 250C.

The image sensor captures a fourth direction D(4), and the fourth direction D(4) is opposite to the first direction D(1).

Thus, for example, an image captured by the image sensor can be displayed on the plane 231D(4) in a state where the plane 231D(1) and the plane 231D(2) face each other. Alternatively, an image captured by the image sensor can be displayed on the plane 231D(1) to the plane 231D(3) with the hinge opened. Alternatively, an image captured by the image sensor can be displayed also on the plane 231D(4) with the hinge opened. As a result, a novel data processing device that is highly convenient, useful, or reliable can be provided.

<Structure Example 6 of Data Processing Device>

The data processing device described in this embodiment includes the display portion 230, and the display portion 230 includes the display panel 700 (see FIG. 29A and FIG. 29B). The display portion 230 includes a display panel 700B.

«Structure Example 1 of Display Panel 700»

Figure 34A:
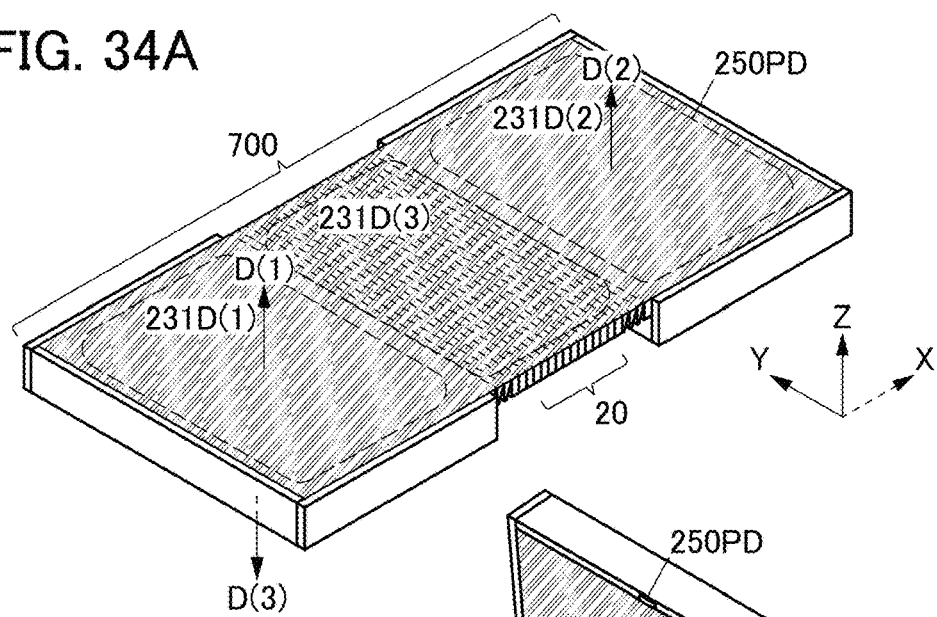
FIG. 34A to FIG. 34D are diagrams illustrating a structure of data processing device of one embodiment.

The display panel 700 includes the plane 231D(1), the plane 231D(2), and the plane 231D(3) (see FIG. 34A). The display panel 700B includes the plane 231D(4) (see FIG. 34C).

Figure 34B:
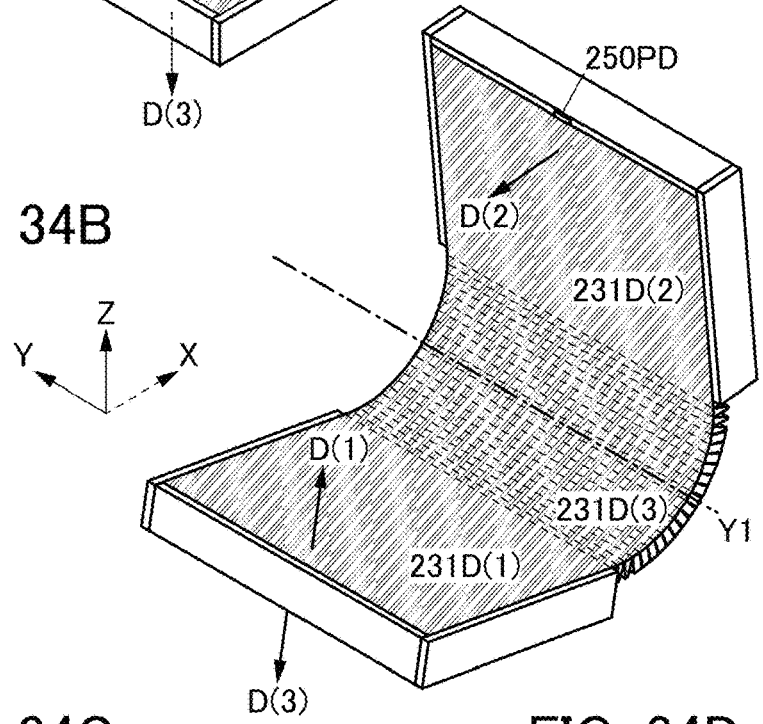
Figure 34C:
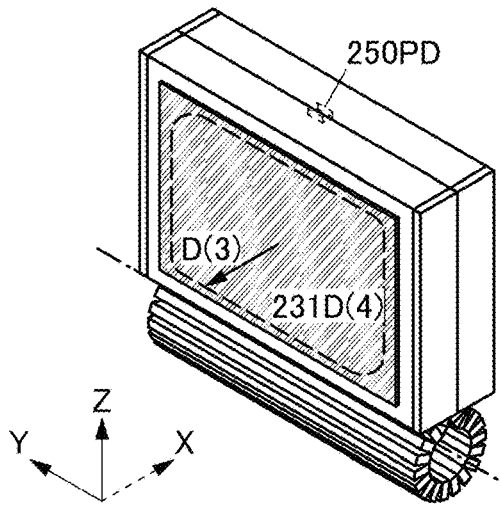
Figure 34D:
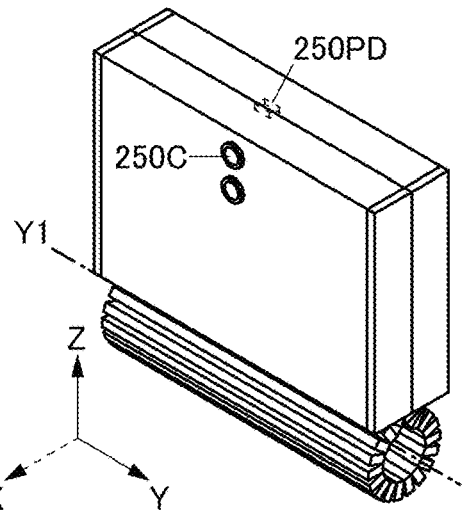

The plane 231D(3) is sandwiched between the plane 231D(1) and the plane 231D(2) and can be bent around an axis extending in one direction (see FIG. 34B and FIG. 34C). For example, the plane 231D(3) can be bent around an axis Y1. Specifically, a display panel including the hinge 20 can be used for the display portion 230 (see FIG. 39). Specifically, the hinge 20(i) including the link 11(i), the link 11(i+1), the hook 12(i), the hook 12(i+1), and the joint 13A(i) can be used. Note that FIG. 41A illustrates a state of the hinge 20(i) extended, and FIG. 41B illustrates a state of the hinge 20(i) bent.

Figure 35A:
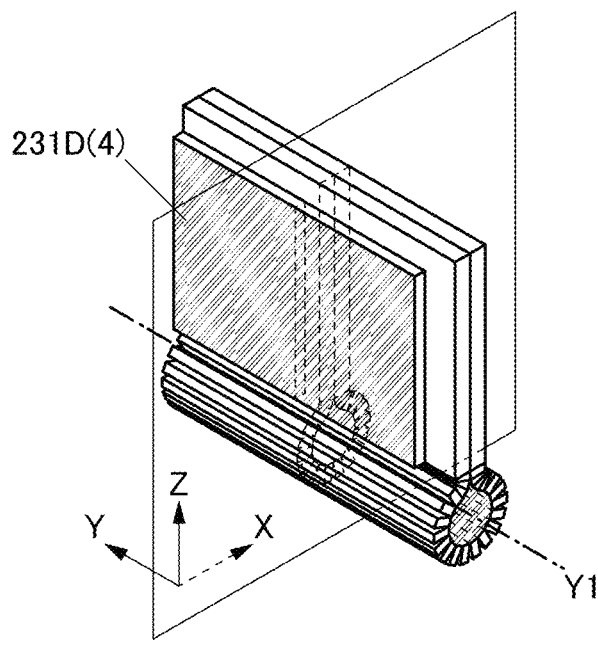
FIG. 35A to FIG. 35D are diagrams illustrating a structure of a data processing device of one embodiment.
Figure 35B:
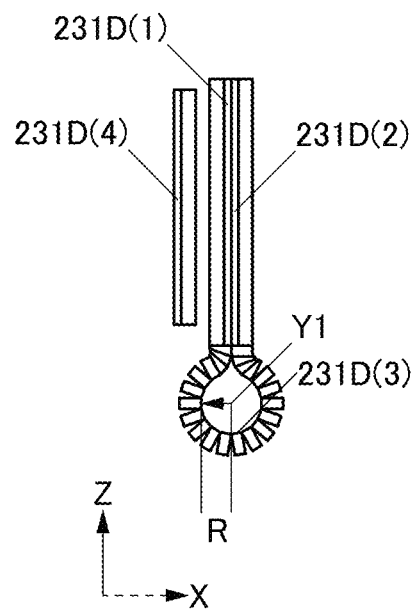
Figure 35C:
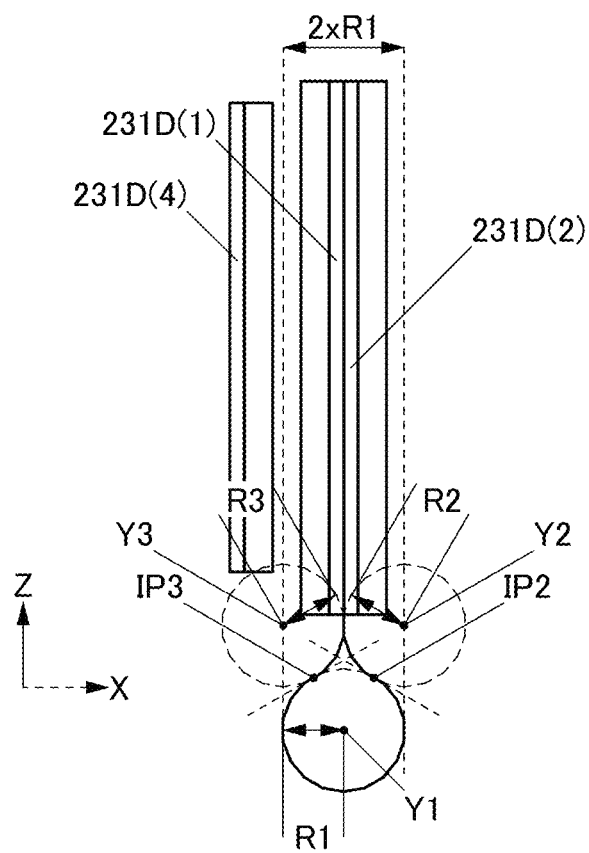

The plane 231D(3) is bent to draw a curved line in a plane across the axis, and the curved line has an inflection point (see FIG. 35A to FIG. 35C). For example, the plane 231D(3) draws a curved line in a plane XZ across the axis Y1 (see FIG. 35C). The curved line includes an arc with the axis Y1 as a center, an arc with an axis Y2 as a center, and an arc with an axis Y3 as a center. Furthermore, the arc with the axis Y2 as a center is connected with the arc with the axis Y1 as a center at an inflection point IP2, and the arc with the axis Y3 as a center is connected with the arc with the axis Y1 as a center at an inflection point IP3.

Note that an axis parallel to the axis Y1 can be used as the axis Y2. Alternatively, the axis parallel to the axis Y1 can be used as the axis Y3. Alternatively, the plane 231D(3) may be bent to draw a polygon, instead of a curved line, in the plane XZ across the axis Y1. For example, a polygon with four or more vertexes, preferably a polygon with six or more vertexes, may be drawn. Alternatively, a polygon with an interior angle greater than or equal to 120° and less than 180°, preferably an interior angle greater than or equal to 150° and less than 180°, further preferably an interior angle greater than or equal to 160° and less than 180° may be drawn.

«Structure Example 2 of Display Panel 700»

Furthermore, the plane 231D(3) of the display panel 700 has a curvature radius R1 while being bent (see FIG. 35C). In the case where the curvature radius of the plane 231D(3) is changed at a bent portion, the smallest curvature radius at the bent portion can be a curvature radius R1.

Figure 35D:
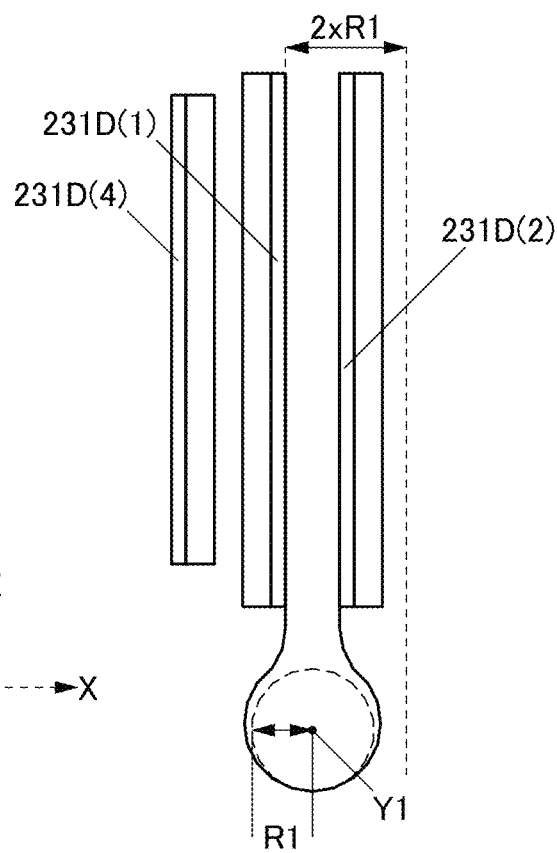

The plane 231D(2) includes a region along the plane 231D(1), and the region has a distance from the plane 231D(1), which is a smaller value than twice the curvature radius R1 (see FIG. 35C and FIG. 35D).

Thus, the plane 231D(2) can be made to approach and be along the plane 231D(1). Alternatively, the plane 231D(2) can be made to approach the plane 231D(1) while be kept facing the plane 231D(1). Alternatively, a portion where the plane 231D(1) and the plane 231D(2) overlap with each other can be made thin. Alternatively, the volume can be made small. As a result, a novel data processing device that is highly convenient, useful, or reliable can be provided.

<Structure Example 7 of Data Processing Device>

Another structure of the data processing device of one embodiment of the present invention is described with reference to FIG. 36 to FIG. 38.

Note that the data processing device described with reference to FIG. 36 to FIG. 38 has a difference from the display panel described with reference to FIG. 34 and FIG. 35 in that the display panel 700 includes the plane 231D(4) and a plane 231D(5). Different portions will be described in detail here, and refer to the above description for portions that can use similar structures.

«Structure Example 3 of Display Panel 700»

The display panel 700 includes the plane 231D(1) to the plane 231D(5) (see FIG. 36A and FIG. 36B).

Figure 38A:
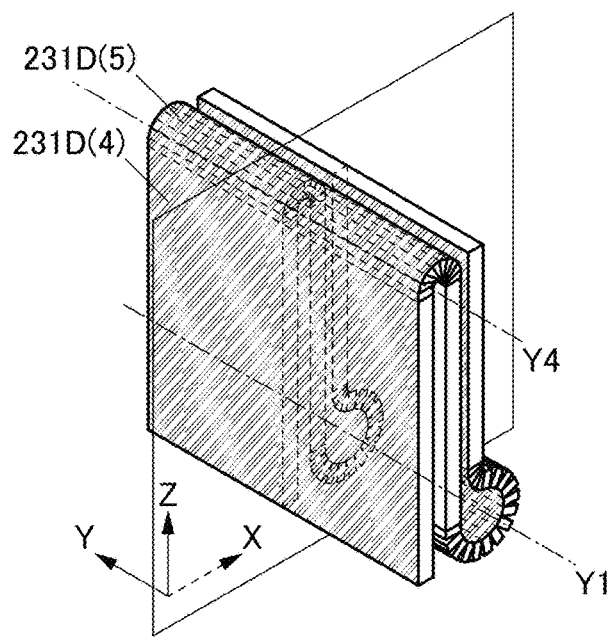
FIG. 38A to FIG. 38D are diagrams illustrating a structure of a data processing device of one embodiment.

The plane 231D(3) is sandwiched between the plane 231D(1) and the plane 231D(2) and be bent around an axis extending in one direction (see FIG. 36B and FIG. 38A). The plane 231D(5) is sandwiched between the plane 231D(1) and the plane 231D(4) and can be bent around an axis extending in one direction. For example, the plane 231D(3) can be bent around an axis Y1, and the plane 231D(5) can be bent around an axis Y4. Specifically, a display panel including the hinge 20 can be used for the display portion 230 (see FIG. 40). Specifically, the hinge 20(i) including the link 11(i), the link 11(i+1), the hook 12(i), the hook 12(i+1), the joint 13A(i) can be used.

Figure 38B:
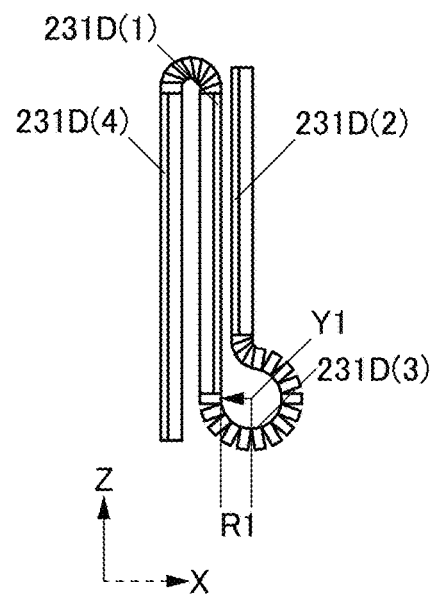

Furthermore, the plane 231D(3) of the display panel 700 has a curvature radius R1 while being bent (see FIG. 38B). In the case where the curvature radius of the plane 231D(3) is changed at a bent portion, the smallest curvature radius at the bent portion can be the curvature radius R1.

Figure 38C:
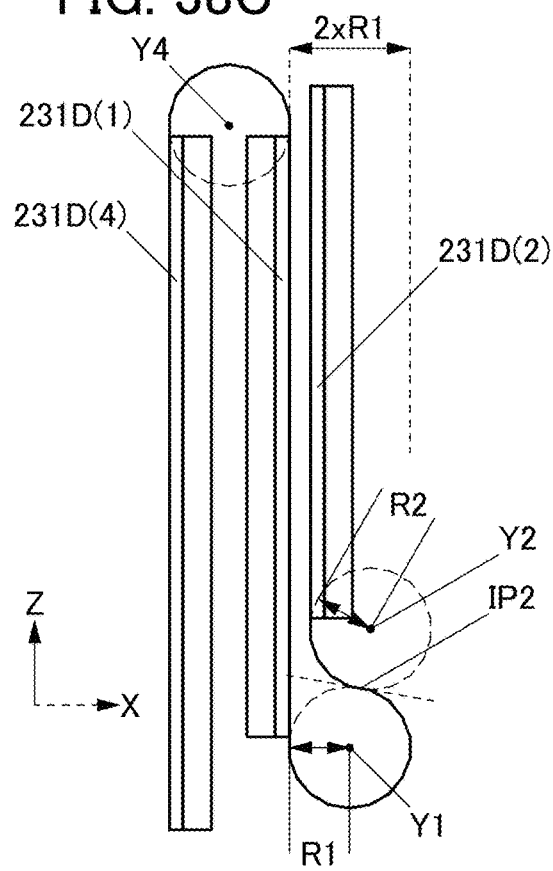
Figure 38D:
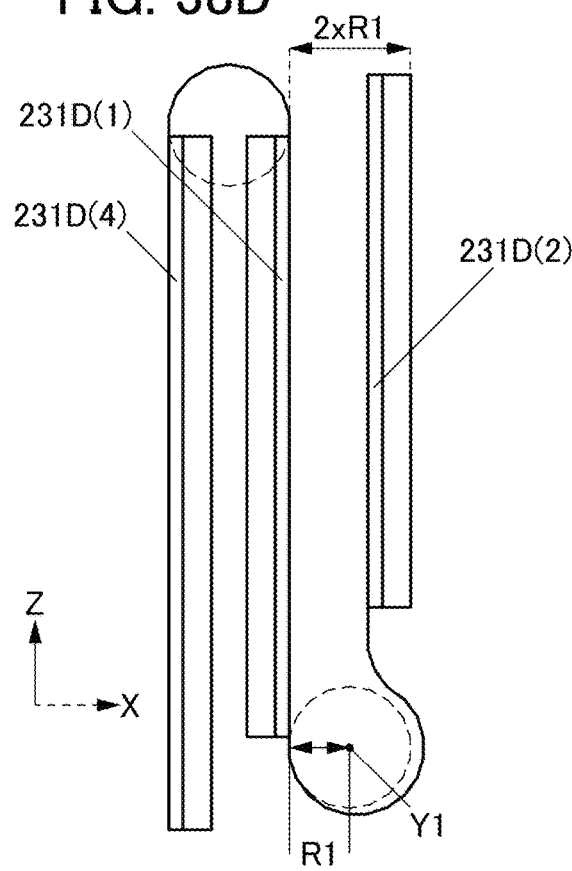

The plane 231D(2) includes a region along the plane 231D(1), and the region has a distance from the plane 231D(1), which is a smaller value than twice the curvature radius R1 (see FIG. 38C and FIG. 38D).

Note that this embodiment can be combined with any of the other embodiments in this specification as appropriate.

Embodiment 8

In this embodiment, structures of a data processing device of one embodiment of the present invention will be described with reference to FIG. 25, FIG. 26, and FIG. 28.

Figure 28:
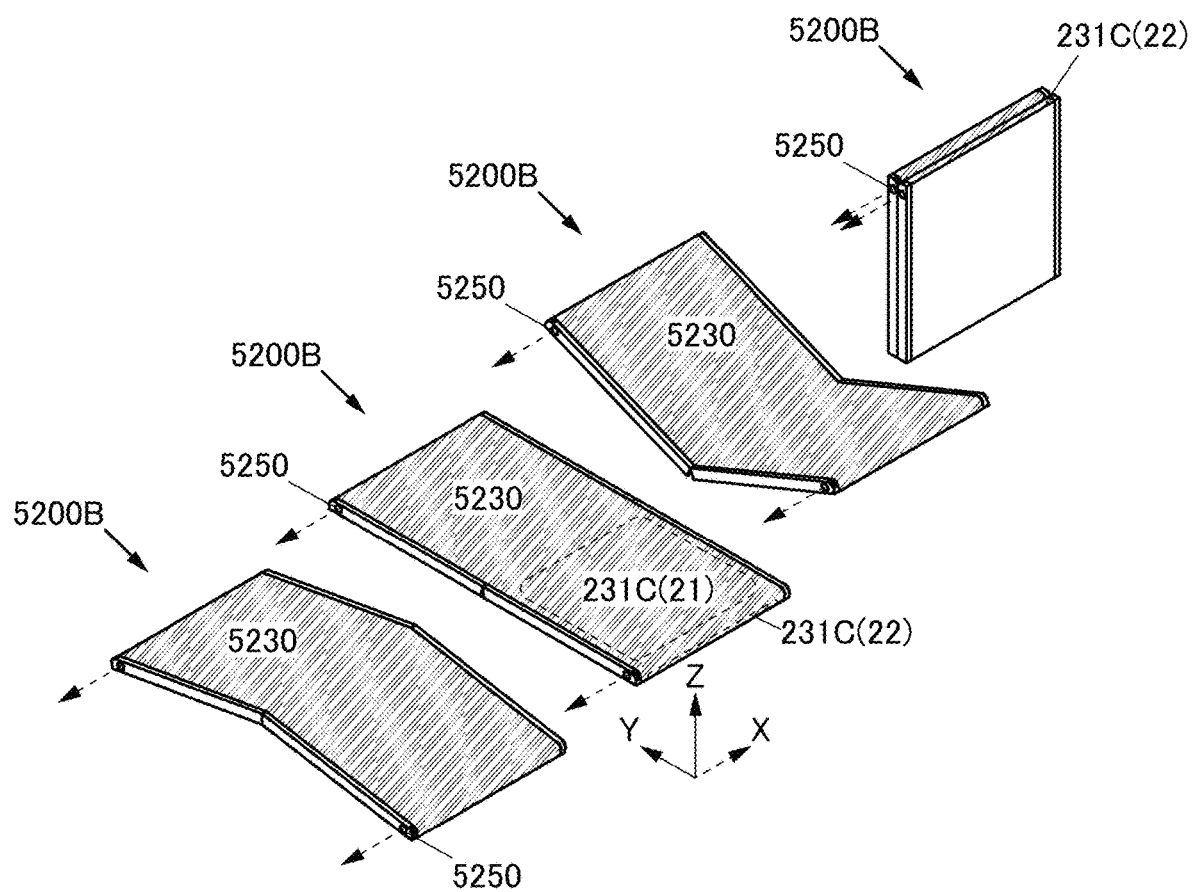
FIG. 28 is a diagram illustrating a structure of a display panel of one embodiment.

FIG. 25, FIG. 26, and FIG. 28 illustrate structures of the data processing device of one embodiment of the present invention. FIG. 25A is a block diagram of the data processing device, and FIG. 25B to FIG. 25E are perspective views each illustrating a structure of the data processing device. In addition, FIG. 26A to FIG. 26E are perspective views each illustrating a structure of the data processing device. FIG. 28 is a perspective view illustrating a structure of the data processing device.

<Data Processing Device>

Figure 25A:
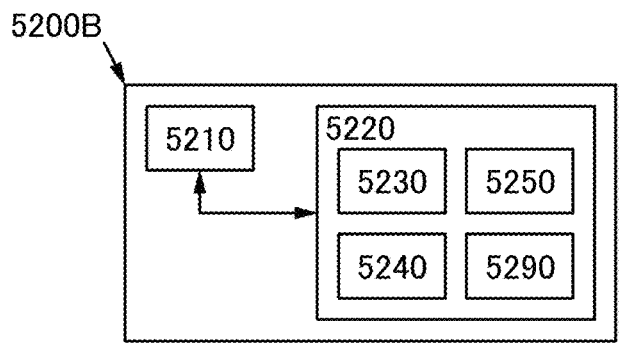
FIG. 25A to FIG. 25E are diagrams each illustrating a structure of a data processing device of one embodiment.

A data processing device 5200B described in this embodiment includes an arithmetic device 5210 and an input/output device 5220 (see FIG. 25A).

The arithmetic device 5210 has a function of being supplied with operation information and a function of supplying image information on the basis of the operation information.

The input/output device 5220 includes a display portion 5230, an input portion 5240, a sensor portion 5250, and a communication portion 5290 and has a function of supplying operation information and a function of being supplied with image information. The input/output device 5220 also has a function of supplying sensing information, a function of supplying communication information, and a function of being supplied with communication information.

The input portion 5240 has a function of supplying operation information. For example, the input portion 5240 supplies operation information on the basis of operation by a user of the information processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 3 or Embodiment 4 can be used for the display portion 5230.

The sensor portion 5250 has a function of supplying sensing information. For example, the sensor portion 5250 has a function of sensing a surrounding environment where the data processing device is used and supplying sensing information.

Specifically, an illuminance sensor, an imaging device, an attitude detection device, a pressure sensor, a human motion sensor, or the like can be used as the sensor portion 5250.

The communication portion 5290 has a function of being supplied with communication information and a function of supplying communication information. For example, the communication portion 5290 has a function of being connected to another electronic device or a communication network through wireless communication or wired communication. Specifically, the communication portion 5290 has a function of wireless local area network communication, telephone communication, near field communication, or the like.

«Structure Example 1 of Data Processing Device»

Figure 25B:
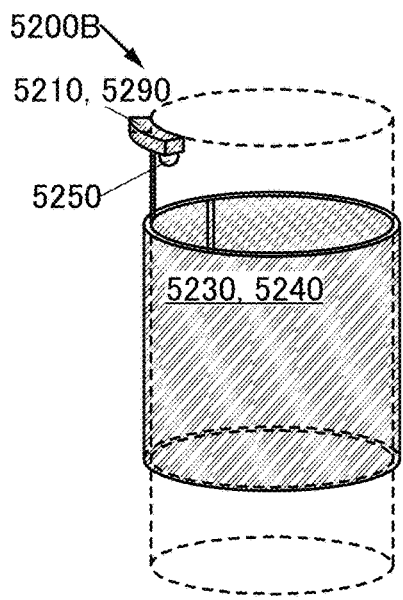

For example, the display portion 5230 can have an outer shape along a cylindrical column or the like (see FIG. 25B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

«Structure Example 2 of Data Processing Device»

Figure 25C:
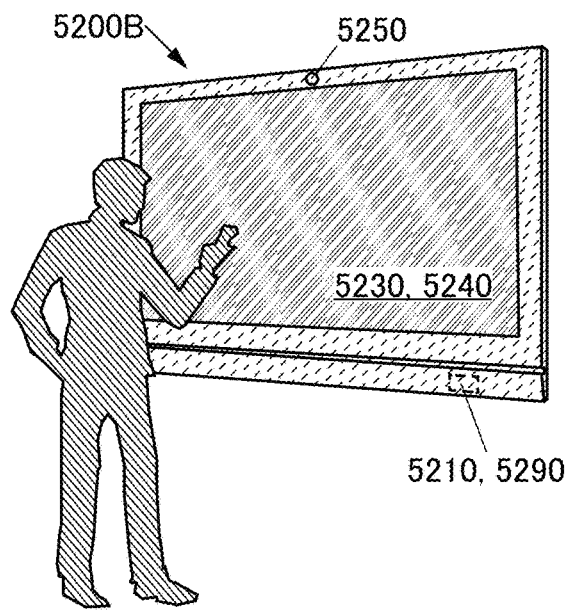

For example, the data processing device has a function of generating image data on the basis of the track of a pointer used by a user (see FIG. 25C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

«Structure Example 3 of Data Processing Device»

Figure 25D:
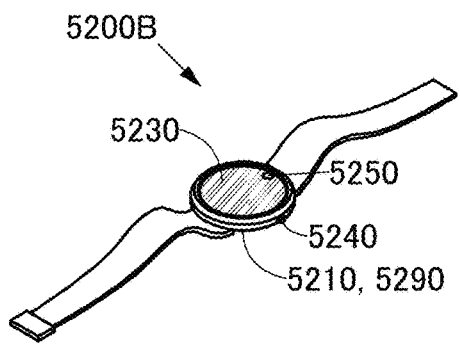

The data processing device can receive information from another device, and the information can be displayed on the display portion 5230 (see FIG. 25D). Several options can be displayed. The user can choose some from the options and send a reply to a transmitter of the information. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

«Structure Example 4 of Data Processing Device»

Figure 25E:
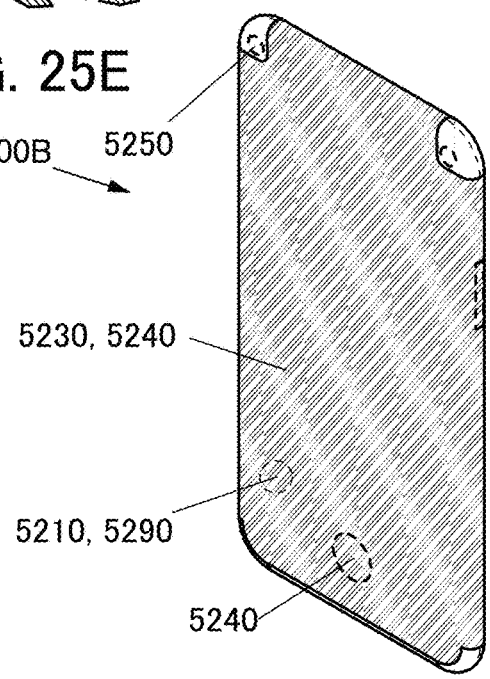

For example, the display portion 5230 has a surface gently curved along a side surface of a housing (see FIG. 25E). The display portion 5230 includes a display panel, and the display panel has a function of displaying information on the front surface, the side surfaces, the top surface, and the rear surface, for example. Thus, for example, a mobile phone can display information not only on its front surface but also on its side surfaces, its top surface, and its rear surface.

«Structure Example 5 of Data Processing Device»

Figure 26A:
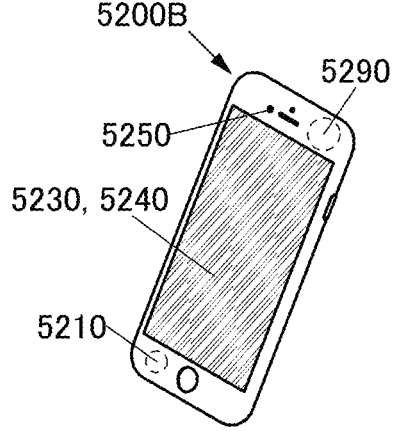
FIG. 26A to FIG. 26E are diagrams each illustrating a structure of a data processing device of one embodiment.

For example, the data processing device can receive information via the Internet and display the information on the display portion 5230 (see FIG. 26A). A created message can be checked on the display portion 5230. The created message can be sent to another device. For example, the data processing device has a function of changing its display method in accordance with the illuminance of a usage environment. Thus, the power consumption of a smartphone can be reduced. Alternatively, for example, a smartphone can display an image so as to be suitably used even in an environment under strong external light, e.g., outdoors in fine weather.

«Structure Example 6 of Data Processing Device»

Figure 26B:
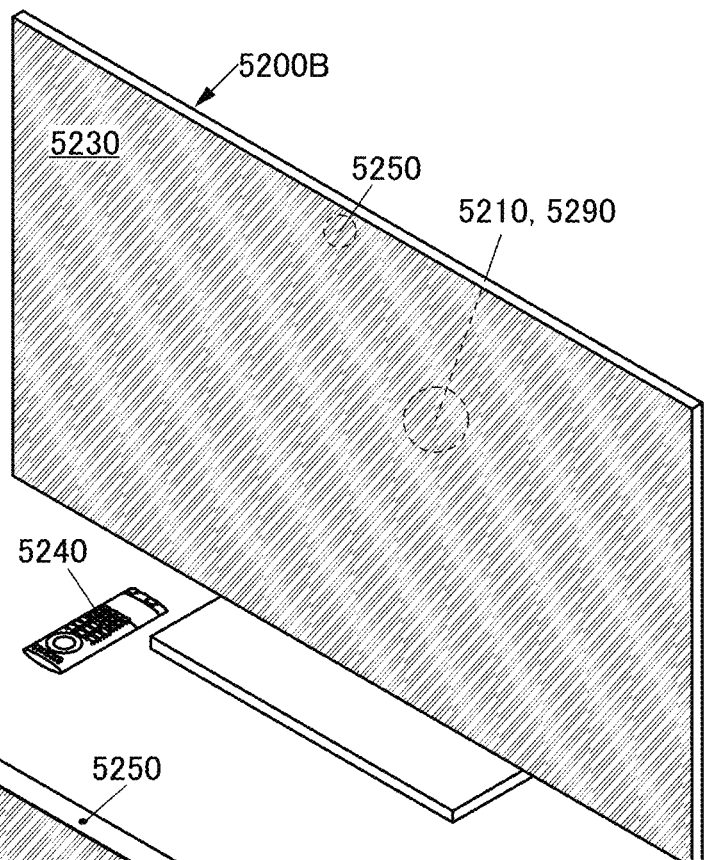

A remote controller can be used as the input portion 5240 (see FIG. 26B). For example, the data processing device can receive information from a broadcast station or via the Internet and display the information on the display portion 5230. An image of a user can be captured using the sensor portion 5250. The image of the user can be transmitted. The data processing device can acquire a viewing history of the user and provide it to a cloud service. The data processing device can acquire recommendation information from a cloud service and display the information on the display portion 5230. A program or a moving image can be displayed on the basis of the recommendation information. For example, the data processing device has a function of changing its display method in accordance with the illuminance of a usage environment. Accordingly, for example, a television system can display an image to be suitably used even when irradiated with strong external light that enters a room in fine weather.

«Structure Example 7 of Data Processing Device»

Figure 26C:
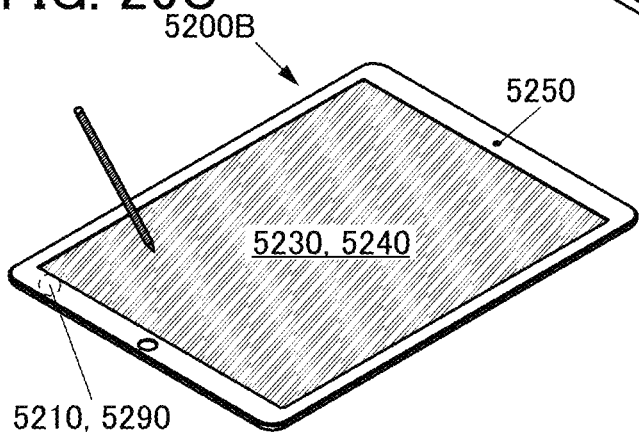

For example, the data processing device can receive educational materials via the Internet and display them on the display portion 5230 (see FIG. 26C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can display information using an image signal received from another information processing device. When the data processing device is placed on a stand or the like, the display portion 5230 can be used as a sub-display. Thus, for example, a tablet computer can display an image to be suitably used even in an environment under strong external light, e.g., outdoors in fine weather.

«Structure Example 8 of Data Processing Device»

Figure 26D:
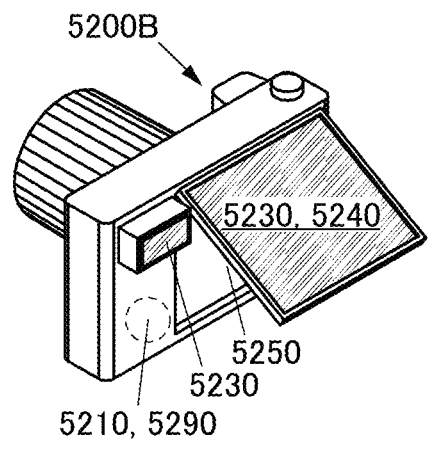

The data processing device includes, for example, a plurality of display portions 5230 (see FIG. 26D). For example, the display portion 5230 can display an image that the sensor portion 5250 is capturing. A captured image can be displayed on the sensor portion. A captured image can be decorated using the input portion 5240. A message can be attached to a captured image. A captured image can be transmitted via the Internet. The data processing device has a function of changing its imaging conditions in accordance with the illuminance of a usage environment. Accordingly, for example, a digital camera can display a subject in such a manner that an image is favorably viewed even in an environment under strong external light, e.g., outdoors in fine weather.

«Structure Example 9 of Data Processing Device»

Figure 26E:
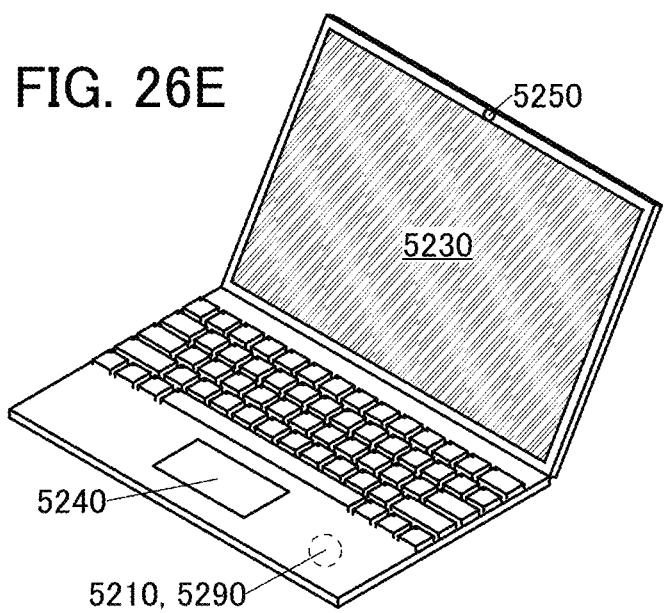

For example, the data processing device of this embodiment is used as a master and another data processing device is used as a slave, whereby the other data processing device can be controlled (see FIG. 26E). As another example, part of image information can be displayed on the display portion 5230 and another part of the image information can be displayed on a display portion of another data processing device. Image signals can be supplied. With the communication portion 5290, information to be written can be obtained from an input portion of another data processing device. Thus, a large display region can be utilized by using a portable personal computer, for example.

«Structure Example 10 of Data Processing Device»

The data processing device includes, for example, the display portion 5230, the sensor portion 5250, and a housing (see FIG. 28). The housing supports the display portion 5230 and the sensor portion 5250.

The display portion 5230 includes a display region, and the display region includes a plane 231C(21) and a plane 231C(22). The plane 231C(21) can display an image in a first direction (e.g., in a direction denoted by an arrow Z in the drawing), and the plane 231C(22) can display an image in a second direction (e.g., in a direction opposite to a direction denoted by an arrow Y in the drawing).

In addition, the sensor portion 5250 includes a camera, and the camera can capture a third direction (e.g., in a direction opposite to a direction denoted by ab arrow X in the drawing) where the display region does not exhibit an image. Thus, a video can be displayed on the display portion while the display portion faces the direction different from the direction of imaging. Alternatively, a video can be displayed on the display portion which is folded with a variety of angles, e.g., 0°, 135°, 180°, or 200°.

Note that this embodiment can be combined with any of the other embodiments in this specification as appropriate.

Embodiment 9

In this embodiment, a structure of a data processing device of one embodiment of the present invention will be described with reference to FIG. 1.

FIG. 1 illustrates the structure of a data processing device of one embodiment of the present invention. FIG. 1A is a perspective view of the data processing device of one embodiment of the present invention, and FIG. 1B and FIG. 1C are perspective views illustrating a state where the data processing device in FIG. 1A is bent.

<Structure Example of Data Processing Device>

The data processing device described in this embodiment includes a display portion and a camera 250C (FIG. 1A). The data processing device includes a housing. The housing supports the display portion and the camera 250C.

«Structure Example of Display Portion»

The display portion includes the display panel 700. The display panel 700 includes a plane 231C(1), a plane 231C(2), and a plane 231C(3).

The plane 231C(1) performs display toward a first direction. For example, display can be performed in a direction denoted by an arrow Z in the diagram (see FIG. 1A). Alternatively, display can be performed in a direction totally opposite to the direction denoted by the arrow Z in the diagram (see FIG. 1B and FIG. 1C).

The plane 231C(2) performs display toward a second direction. For example, display can be performed in a direction denoted by the arrow Z in the diagram (see FIG. 1A and FIG. 1B). Alternatively, display can be performed in a direction denoted by an arrow Y in the diagram (see FIG. 1C).

The plane 231C(3) is sandwiched between the plane 231C(1) and the plane 231C(2). The plane 231C(3) can be bent (see FIG. 1B and FIG. 1C).

The camera 250C captures the second direction. For example, the direction denoted by the arrow Z can be captured while display is performed using the plane 231C(1) in the direction totally opposite to the direction denoted by the arrow Z in the diagram (see FIG. 1B). Alternatively, the direction denoted by the arrow Y can be captured while display is performed using the plane 231C(1) in the direction totally opposite to the direction denoted by the arrow Z in the diagram (see FIG. 1C).

Accordingly, while display is performed in one direction, another direction can be freely captured without restriction on the display direction. Alternatively, while display is performed in one direction, a variety of directions can be captured with one camera. Alternatively, a photographer or an object can capture an image while seeing display. As a result, a novel display panel that is highly convenient, useful, or reliable can be provided.

Note that this embodiment can be combined with any of the other embodiments in this specification as appropriate.

Embodiment 10

In this embodiment, a structure of a display panel of one embodiment of the present invention will be described with reference to FIG. 27.

Figure 27A:
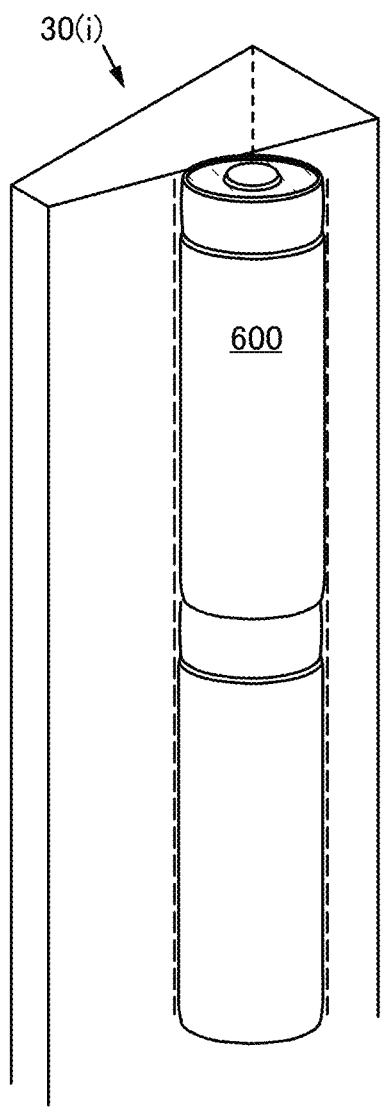
FIG. 27A and FIG. 27B are diagrams illustrating a structure of a support of one embodiment.
Figure 27B:
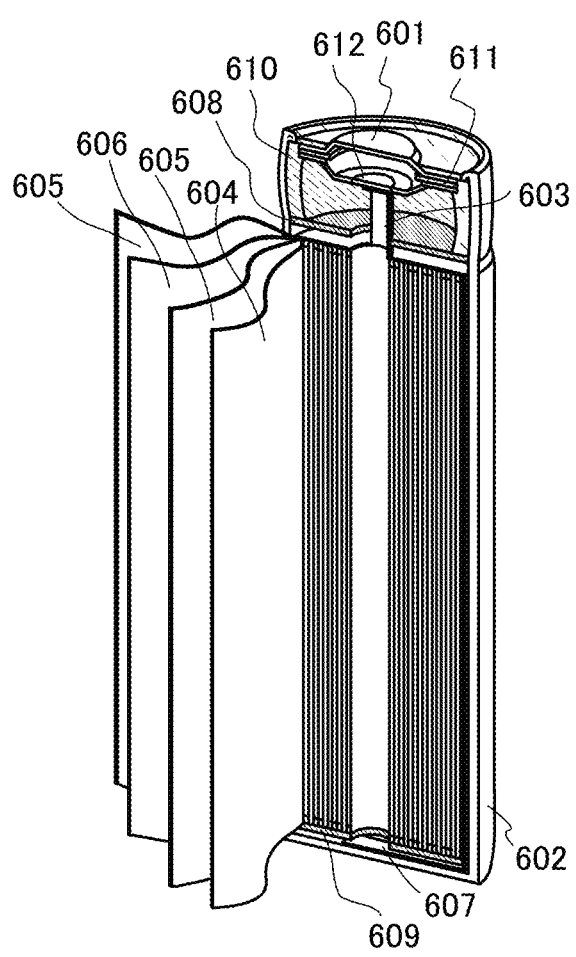

FIG. 27 illustrates a structure of a support that can be used for the display panel of one embodiment of the present invention. FIG. 27A is a perspective view illustrating a structure of the support. FIG. 27B illustrates a structure of a secondary battery stored in the support.

The display panel of one embodiment of the present invention includes the support 30(*i*). The support 30(*i*) stores a secondary battery 600 and has a function of supplying power (see FIG. 27A). For example, the secondary battery 600 supplies power for driving the display region 231. Note that a secondary battery can be stored in a plurality of supports, for example, the supports 30(*i*). Thus, it is possible to store the secondary battery without increasing the volume of the display panel. Alternatively, the capacity of the secondary battery can be increased.

As illustrated in FIG. 27B, the cylindrical secondary battery 600 includes a positive electrode cap (battery lid) 601 on a top surface and a battery can (outer can) 602 on a side surface and a bottom surface. The positive electrode cap and the battery can (outer can) 602 are insulated from each other by a gasket (insulating packing) 610.

FIG. 27B is a schematic cross-sectional view of the cylindrical secondary battery. Inside the battery can 602 having a hollow cylindrical shape, a battery element in which a belt-like positive electrode 604 and a belt-like negative electrode 606 are wound with a separator 605 located therebetween is provided. Although not shown, the battery element is wound centering around a center pin. One end of the battery can 602 is closed and the other end thereof is open. For the battery can 602, a metal having corrosion resistance to an electrolyte solution, such as nickel, aluminum, or titanium, an alloy of such a metal, or an alloy of such a metal and another metal (e.g., stainless steel or the like) can be used. The battery can 602 is preferably covered with nickel, aluminum, or the like in order to prevent corrosion due to the electrolyte solution. Inside the battery can 602, the battery element in which the positive electrode, the negative electrode, and the separator are wound is sandwiched between a pair of insulating plates 608 and 609 that face each other. Furthermore, a nonaqueous electrolyte (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a PTC (Positive Temperature Coefficient) element 611. The safety valve mechanism 612 cuts off electrical connection between the positive electrode cap 601 and the positive electrode 604 when the internal pressure of the battery exceeds a predetermined threshold value. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification and the like, the positive electrode is referred to as a "positive electrode" or a "+ electrode (plus electrode)" and the negative electrode is referred to as a "negative electrode" or a "− electrode (minus electrode)" in either of the case where charging is performed or the case where discharging is performed. The use of terms an "anode" and a "cathode" related to oxidation reaction and reduction reaction might cause confusion because the anode and the cathode interchange in charging and in discharging. Thus, the terms "anode" and "cathode" are not used in this specification. If the term the "anode" or the "cathode" is used, it should be clearly mentioned that the anode or the cathode is which of the one in charging or in discharging and corresponds to which of the positive electrode (plus electrode) or the negative electrode (minus electrode).

In this embodiment, an example of a lithium-ion secondary battery is shown; however, it is not limited to a lithium-ion secondary battery and a material including an element A, an element X, and oxygen can be used as a positive electrode material for the secondary battery, for example. The element A is preferably one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. Furthermore, the element X is preferably one or more selected from cobalt, nickel, manganese, iron, and vanadium. Typical examples include lithium-cobalt composite oxide ($LiCOO_2$) and lithium iron phosphate ($LiFePO_4$).

The negative electrode includes a negative electrode active material layer and a negative electrode current collector. The negative electrode active material layer may contain a conductive additive and a binder.

For the negative electrode active material, an element that enables charge-discharge reaction by alloying reaction and dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon. In particular, silicon has a high theoretical capacity of 4200 mAh/g.

In addition, the secondary battery preferably includes a separator. As the separator, for example, fiber containing cellulose such as paper; nonwoven fabric; glass fiber; ceramics; synthetic fiber using nylon (polyamide), vinylon (polyvinyl alcohol-based fiber), polyester, acrylic resin, polyolefin, or polyurethane; or the like can be used.

This embodiment can be implemented in combination with any of the structures described in the other embodiments and the like, as appropriate.

Embodiment 11

In this embodiment, a metal oxide (hereinafter, also referred to as oxide semiconductor) that can be used in an OS transistor described in the above embodiment will be described.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor will be explained with FIG. 42A. FIG. 42A is a diagram showing the classification of crystal structures of an oxide semiconductor, typically IGZO (a metal oxide containing In, Ga, and Zn).

As shown in FIG. 42A, an oxide semiconductor is roughly classified into "Amorphous", "Crystalline", and "Crystal". The term "Amorphous" includes completely amorphous structure. The term "Crystalline" includes CAAC (c-axis-aligned crystalline), nc (nanocrystalline), and CAC (cloud-aligned composite). Note that the term "Crystalline" excludes single crystal and poly crystal. The term "Crystal" includes single crystal and poly crystal.

Note that the structures in the thick frame in FIG. 42A are in an intermediate state between "Amorphous" and "Crystal", and belong to a new crystalline phase. In other words, these structures are completely different from "Amorphous", which is energetically unstable, and "Crystal".

A crystal structure of a film or a substrate can be analyzed with X-ray diffraction (XRD) spectra. Here, XRD spectra of a quartz glass substrate and an IGZO film having a crystal structure classified into "Crystalline" (also referred to as Crystalline IGZO), which are obtained by a GIXD (Grazing-Incidence) XRD method, are shown in FIG. 42B and FIG. 42C, respectively. Note that a GIXD method is also referred to as a thin film method or a Seemann-Bohlin method. The XRD spectra shown in FIG. 42B and FIG. 42C and obtained by a GIXD method is hereinafter simply referred to as XRD spectra. FIG. 42B shows an XRD spectrum of a quartz glass substrate, and FIG. 42C shows an XRD spectrum of a crystalline IGZO film. Note that the crystalline IGZO film shown in FIG. 42C has a composition in vicinity of In:Ga:Zn=4:2:3 [atomic ratio]. Furthermore, the crystalline IGZO film shown in FIG. 42C has a thickness of 500 nm.

As indicated by arrows in FIG. 42B, the XRD spectrum of the quartz glass substrate shows a peak with a substantially bilaterally symmetrical shape. In contrast, as indicated by arrows in FIG. 42C, the XRD spectrum of the crystalline IGZO film shows a peak with an asymmetrical shape. The asymmetrical peak of the XRD spectrum clearly shows the existence of crystal. In other words, the crystal structure of the film or the substrate cannot be regarded as "amorphous" unless it has a bilaterally symmetrical peak in the XRD spectrum. Note that in FIG. 42C, a crystal phase (IGZO crystal phase) is explicitly denoted at $2\theta$ of 31° or in the vicinity thereof. The bilaterally asymmetrical peak of the XRD spectrum is probably attributed to a diffraction peak derived from such a crystal phase (a fine crystal).

Specifically, interference of an X-ray scattered by atoms contained in IGZO probably contributes to a peak at $2\theta=34°$ or in the vicinity thereof. In addition, the fine crystal probably contributes to the peak at $2\theta=31°$ or in the vicinity thereof. In the XRD spectrum of the crystalline IGZO film shown in FIG. 42C, the peak at $2\theta$ of 34° or in the vicinity thereof is wide on the lower angle side. This indicates that the crystalline IGZO film includes a fine crystal attributed to the peak at $2\theta$ of 31° or in the vicinity thereof.

A crystal structure of a film or a substrate can also be evaluated with a diffraction pattern obtained by a nanobeam electron diffraction (NBED) method (such a pattern is also referred to as a nanobeam electron diffraction pattern). Diffraction patterns of the quartz glass substrate and the IGZO film formed with a substrate temperature set at room temperature are shown in FIG. 42D and FIG. 42E, respectively. FIG. 42D shows the diffraction pattern of the quartz glass substrate and FIG. 42E shows the diffraction pattern of the IGZO film. Note that the IGZO film of FIG. 42E is formed by a sputtering method using an In—Ga—Zn oxide target with In:Ga:Zn=1:1:1 [atomic ratio]. In the nanobeam electron diffraction method, electron diffraction is performed with a probe diameter of 1 nm.

Note that as shown in FIG. 42D, a halo pattern is observed in the diffraction pattern of the quartz glass substrate, which indicates that the quartz glass substrate is in an amorphous state. As shown in FIG. 42E, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

«Structure of Oxide Semiconductor»

Oxide semiconductors might be classified in a manner different from one shown in FIG. 42A when classified in terms of the crystal structure. Oxide semiconductors can be classified into a single crystal oxide semiconductor and a non-single-crystal oxide semiconductor, for example. Examples of the non-single-crystal oxide semiconductor include the above-described CAAC and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a regular lattice arrangement and another region with a regular lattice arrangement in a region where the plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable against high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ'2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the size of a crystal part. Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. That is, the a-like OS film has lower hydrogen concentration than nc-OS and the CAAC-OS films.

«Structure of Oxide Semiconductor»

Next, the CAC-OS will be described in detail. Note that the CAC-OS relates to the material composition.

[CAC-OS]

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (the composition hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. In addition, the second region of the CAC-OS in the In—Ga—Zn oxide has [Ga], which is greater than that in the composition of the CAC-OS film. Alternatively, for example, [In] of the first region is greater than that in the second region, and [Ga] of the first region is less than that in the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS of the In—Ga—Zn oxide has a composition in which the region containing In as its main component (first region) and the region containing Ga as its main component (second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (p), and excellent switching operation can be achieved.

A transistor using a CAC-OS has high reliability. Thus, the CAC-OS is suitably used in a variety of semiconductor devices typified by a display.

An oxide semiconductor has various structures with different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used in a transistor will be described.

When the above oxide semiconductor is used in a transistor, a transistor having high field-effect mobility can be achieved. In addition, a transistor having high reliability can be achieved.

Furthermore, an oxide semiconductor having a low carrier concentration is preferably used in a transistor. For example, an oxide semiconductor which has a carrier concentration lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$ can be used for the semiconductor layer. To reduce the carrier concentration of an oxide semiconductor film, the impurity concentration in the oxide semiconductor film is lowered so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the concentration in an oxide semiconductor is effective. In addition, in order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When containing nitrogen, the oxide semiconductor easily becomes n-type by generation of electrons serving as carriers and an increase in carrier concentration. Thus, a transistor using an oxide semiconductor that contains nitrogen as a semiconductor is likely to have normally-on characteristics. When nitrogen is contained in the oxide semiconductor, a trap state is sometimes formed. This might make the electrical characteristics of the transistor unstable in some cases. Thus, the concentration of nitrogen in the oxide semiconductor, obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. For this reason, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be combined with any of the other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether to flow a current. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2". Alternatively, the expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can also be used. Alternatively, it can be expressed as "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, a layer, and the like).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor, C22: capacitor, CI: control information, D1: distance, D2: distance, DS: sensing information, E1: ridge, E3: ridge, E4: ridge, E5: portion, G1: scan line, G2: scan line, GCLK signal, II: input information, N1: node, P1: position information, PWC1: signal, PWC2: signal, S1: signal line, S2: signal line, SP: control signal, SW21: switch, SW22: switch, V11: information, VCOM2: conductive film, VI: image information, FPC1: flexible printed circuit, 11: link, 11A: edge portion, 11B: edge portion, 11C: edge portion, 12: hook, 12A: edge portion, 12B: edge portion, 13A: joint, 13B: joint, 19: connection portion, 20: hinge, 30: support, 30A: support, 30B: support, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 231(i): region, 231A: display region, 231A(i): region, 231AS: region, 231B: display region, 231C: plane, 231D: plane, 231B(i): region, 231BS: region, 231S: region, 233: control circuit, 234: decompression circuit, 235: image processing circuit, 238: control portion, 240: input portion, 241: sensing region, 241D: sensing region, 248: control portion, 250: sensor portion, 250C: camera, 290: communication portion, 400: molecular weight, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530: pixel circuit, 550: display element, 551: electrode, 552: electrode, 553: layer, 573: insulating film, 573A: insulating film, 573B: insulating film, 591A: opening portion, 600: secondary battery, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 612: safety valve mechanism, 700: display panel, 700TP: input/output panel, 702: pixel, 703: pixel, 705: sealant, 720: functional layer, 753: layer, 770: base material, 770P: functional film, 771: insulating film, 802: sensor, 5200B: data processing device, 5210: arithmetic device, 5220: input/output device, 5230: display portion, 5240: input portion, 5250: sensor portion, 5290: communication portion

The invention claimed is:

1. A display panel comprising:
a display region;
a first support; and
a second support,
wherein the display region comprises a first region, a second region and a third region comprising a hinge,
wherein the hinge comprises:
a first link comprising a first flat-plate portion and a first joint protruding from the first flat-plate portion at a perpendicular direction;
a second link connected to the first link, the second link comprising a second flat-plate portion and a second joint protruding from the second flat-plate portion at the perpendicular direction; and
a first hook comprising a third flat-plate portion having a first curved-line portion and a first drop portion at an outer edge of the third flat-plate portion,
wherein the first hook is configured to be connected to the first joint of the first link at a point in the third flat-plate portion,
wherein the first hook is configured to pivot so that the second joint of the second link moves on the first curved-line portion and is dropped into the first drop portion,
wherein the first curved-line portion has an inflection point with an obtuse angle,
wherein the first drop portion is configured to fix the first link and the second link until the second joint of the second link escapes the first drop portion, and
wherein the inflection point of the first curved-line portion is configured to put the first link and the second link on a semi-stable state,
wherein each of the first region and the second region has a belt-like shape extending in one direction,
wherein the third region is between the first region and the second region,
wherein the first support and the first region overlap each other,
wherein the first support is less likely to be warped than the third region,
wherein the second support and the second region overlap each other,
wherein the second support is less likely to be warped than the third region, and
wherein the second support is configured to pivot on an axis extending in the one direction with respect to the first support.

2. The display panel according to claim 1,
wherein the hinge further comprises a third link connected to the second link, the third link comprising a fourth flat-plate portion and a third joint protruding from the fourth flat-plate portion at the perpendicular direction,
wherein the first link comprises a first edge portion, a second edge portion and a third edge portion,
wherein the second link comprises a fourth edge portion, a fifth edge portion and a sixth edge portion,
wherein the first hook comprises a seventh edge portion and a eighth edge portion,
wherein the first joint is configured to connect the first edge portion and the sixth edge portion so that the first link and the second link form a turning pair,
wherein the second joint is configured to connect the second edge portion and the fifth edge portion so that the first link and the first hook form a turning pair,
wherein the third joint comprises a first distance from the second joint, and
wherein the third joint is engaged with the first hook so that the first distance is less than or equal to a predetermined value.

3. The display panel according to claim 2, wherein the first distance becomes the shortest at a position where the first link and the second link interfere with each other.

4. The display panel according to claim 2,
wherein the first hook is engaged with the third joint in conjunction with pivoting on the second joint in one of directions, and
wherein the first hook is taken off from the third joint in conjunction with pivoting on the second joint in the other direction.

5. The display panel according to claim 2,
wherein the second joint is apart from a center of gravity of the first hook, and
wherein the first hook is configured to pivot under own weight on the second joint.

6. The display panel according to claim 2, further comprising:
a second hook;
a fourth joint; and
a fifth joint,
wherein the third link comprises a ninth edge portion, a tenth edge portion and an eleventh edge portion,
wherein the second hook comprises a twelfth edge portion and a thirteenth edge portion,
wherein the fourth joint is configured to connect the sixth edge portion and the eleventh edge portion so that the second link and the third link form a turning pair,
wherein the third joint is configured to connect the fifth edge portion and the twelfth edge portion so that the second link and the second hook form a turning pair,
wherein the fifth joint has a second distance from the second joint, and
wherein the fifth joint is engaged with the second hook so that the second distance is less than or equal to a predetermined value.

7. The display panel according to claim 6, wherein the second distance becomes the shortest at a position where the second link and the third link interfere with each other.

8. The display panel according to claim 6,
wherein the second distance is less than or equal to a longest value of the first distance, and
wherein the second distance is greater than or equal to a shortest value of the first distance.

9. The display panel according to claim 6,
wherein the third joint is apart from a center of gravity of the second hook, and
wherein the second hook is configured to pivot under own weight in synchronization with the first hook pivoting.

10. The display panel according to claim 1, further comprising a secondary battery,
wherein the support is configured to store the secondary battery, and
wherein the secondary battery is configured to drive the display region.

11. A data processing device comprising:
a display portion,
wherein the display portion comprises the display panel according to claim 1,
wherein the display panel comprises a first plane, a second plane and a third plane,
wherein the third plane is between the first plane and the second plane,
wherein the third plane is bent around an axis extending in one direction, wherein the third plane draws a curved line in a plane across the axis in accordance with the bending, and wherein the curved line comprises an inflection point.

12. The data processing device according to claim 11, wherein the third plane comprises a curvature radius in accordance with the bending, wherein the second plane comprises a region along the first plane, and wherein the region has a distance from the first plane, the distance being shorter than a value of twice the curvature radius.

13. A display panel comprising:

a first display region;

a second display region;

a connection portion;

a first support;

a second support;

a third support; and a fourth support, wherein the first display region comprises a first region, a second region and a third region comprising a hinge, wherein the hinge comprises:

a first link comprising a first flat-plate portion and a first joint protruding from the first flat-plate portion at a perpendicular direction;

a second link connected to the first link, the second link comprising a second flat-plate portion and a second joint protruding from the second flat-plate portion at the perpendicular direction; and a first hook comprising a third flat-plate portion having a first curved-line portion and a first drop portion at an outer edge of the third flat-plate portion, wherein the first hook is configured to be connected to the first joint of the first link at a point in the third flat-plate portion, wherein the first hook is configured to pivot so that the second joint of the second link moves on the first curved-line portion and is dropped into the first drop portion, wherein the first curved-line portion has an inflection point with an obtuse angle, wherein the first drop portion is configured to fix the first link and the second link until the second joint of the second link escapes the first drop portion, and wherein the inflection point of the first curved-line portion is configured to put the first link and the second link on a semi-stable state, wherein each of the first region and the second region has a belt-like shape extending in a first direction, wherein the third region is between the first region and the second region, wherein the second display region comprises a fourth region, a fifth region and a sixth region, wherein each of the fourth region and the fifth region has a belt-like shape extending in a second direction, wherein the fourth region faces the first region, wherein the sixth region is between the fourth region and the fifth region, wherein the connection portion is configured to connect the first display region and the second display region, wherein the first support and the first region overlap each other, wherein the first support is less likely to be warped than the third region, wherein the second support and the second region overlap each other, wherein the second support is less likely to be warped than the third region, wherein the second support is configured to pivot on an axis extending in the first direction with respect to the first support, wherein the third support and the fourth region overlap each other, wherein the third support is less likely to be warped than the sixth region, wherein the fourth support and the fifth region overlap each other, wherein the fourth support is less likely to be warped than the sixth region, and wherein the fourth support is configured to pivot on an axis extending in the second direction with respect to the third support.

14. A hinge comprising:

a first link comprising a first flat-plate portion and a first joint protruding the first flat-plate portion at a perpendicular direction;

a second link connected to the first link, the second link comprising a second flat-plate portion and a second joint protruding the second flat-plate portion at the perpendicular direction; and a first hook comprising a third flat-plate portion having a first curved-line portion and a first drop portion at an outer edge of the third flat-plate portion, wherein the first hook is configured to connected to the first joint of the first link at a point in the third flat-plate portion, wherein the first hook is configured to pivot so that the second joint of the second link moves on the first curved-line portion and is dropped into the first drop portion, wherein the first curved-line portion has an inflection point with an obtuse angle, wherein the first drop portion is configured to fix the first link and the second link until the second joint of the second link escapes the first drop portion, and wherein the inflection point of the first curved-line portion is configured to put the first link and the second link on a semi-stable state.

15. The hinge according to claim 14, wherein the first drop portion is configured to enabling the second joint to escape from the first drop portion by pivoting only the first hook in a state that the first link and the second link are fixed.

16. A display panel comprising:

a first display region;

a second display region; and the hinge according to claim 14, which connecting the first display region and the second display region.

\* \* \* \* \*